(12) United States Patent
Morikawa et al.

(10) Patent No.: US 6,566,685 B2
(45) Date of Patent: May 20, 2003

(54) DOUBLE GATE PHOTO SENSOR ARRAY

(75) Inventors: Shigeru Morikawa, Tokyo (JP); Makoto Sasaki, Hachioji (JP)

(73) Assignee: Casio Computer Co., Ltd., Tokyo (JP)

( * ) Notice: Subject to any disclaimer, the term of this patent is extended or adjusted under 35 U.S.C. 154(b) by 121 days.

(21) Appl. No.: 09/827,623

(22) Filed: Apr. 5, 2001

(65) Prior Publication Data

US 2001/0030324 A1 Oct. 18, 2001

(30) Foreign Application Priority Data

Apr. 12, 2000 (JP) .......................................... 2000-110718
May 24, 2000 (JP) .......................................... 2000-152828

(51) Int. Cl.[7] .............................................. H01L 29/04
(52) U.S. Cl. .............................. 257/59; 257/53; 257/57; 257/432
(58) Field of Search ............................... 257/59, 53, 57, 257/52, 432, 436

(56) References Cited

U.S. PATENT DOCUMENTS 6,310,683 B1 * 10/2001 Fujiwara et al. .............. 356/71

* cited by examiner

Primary Examiner—Michael S. Lebentritt
Assistant Examiner—Brad Smith
(74) Attorney, Agent, or Firm—Frishauf, Holtz, Goodman & Chick, P.C.

(57) ABSTRACT

A photo sensor array comprises a plurality of photoelectric conversion elements separated from each other in a predetermined direction to be arranged, each photo conversion element including a semiconductor layer having an incidence effective region on which excited light is incident, source-drain electrodes provided respectively on both ends of the semiconductor layer, a first gate electrode provided below the semiconductor layer via the first gate insulating film. A second gate electrode provided above the semiconductor layer via the second gate insulating film. A source terminal commonly connects to the source electrodes of the photoelectric conversion elements, and a drain terminal commonly connects the drain electrodes of the photoelectric conversion elements, a first gate terminal commonly connects the first gate electrodes of the photoelectric conversion elements, and a second gate terminal commonly connects the second gate terminal of the photoelectric conversion elements.

10 Claims, 38 Drawing Sheets

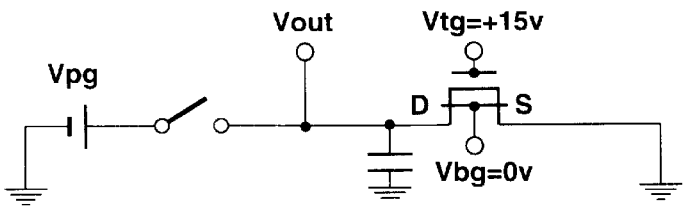
FIG.4 RESET
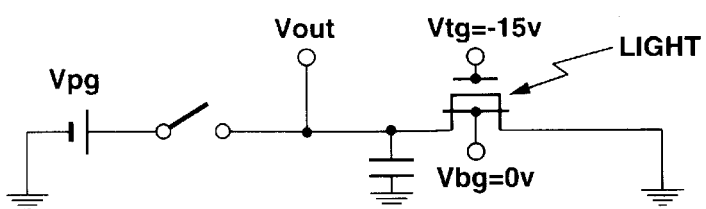
FIG.5 ACCUMULATION
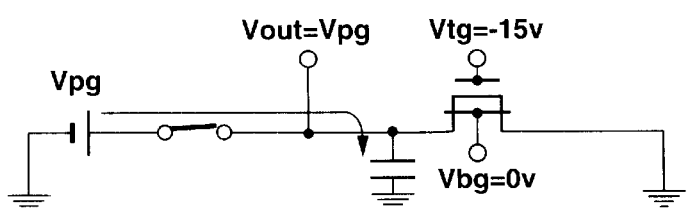
FIG.6 PRECHARGE
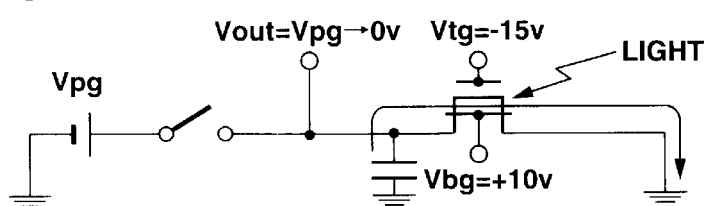
FIG.7 SELECTION IN THE BRIGHT
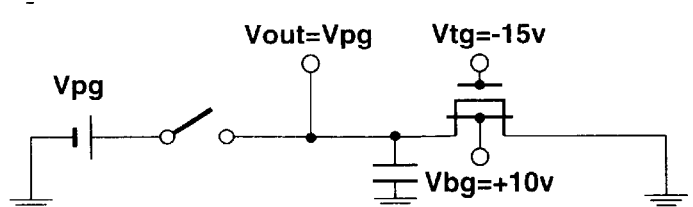
FIG.8 SELECTION IN THE DARK
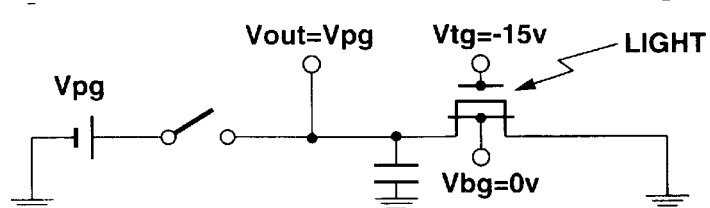
FIG.9 NON-SELECTION IN THE BRIGHT
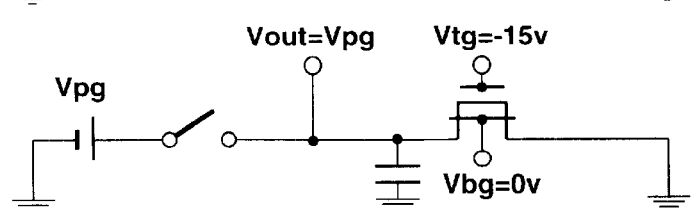
FIG.10 NON-SELECTION IN THE DARK

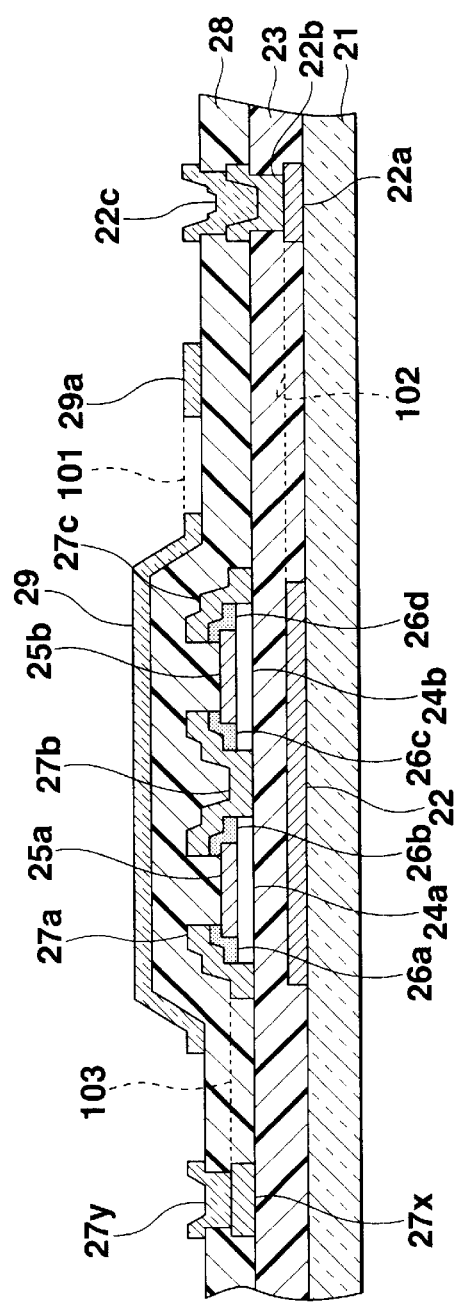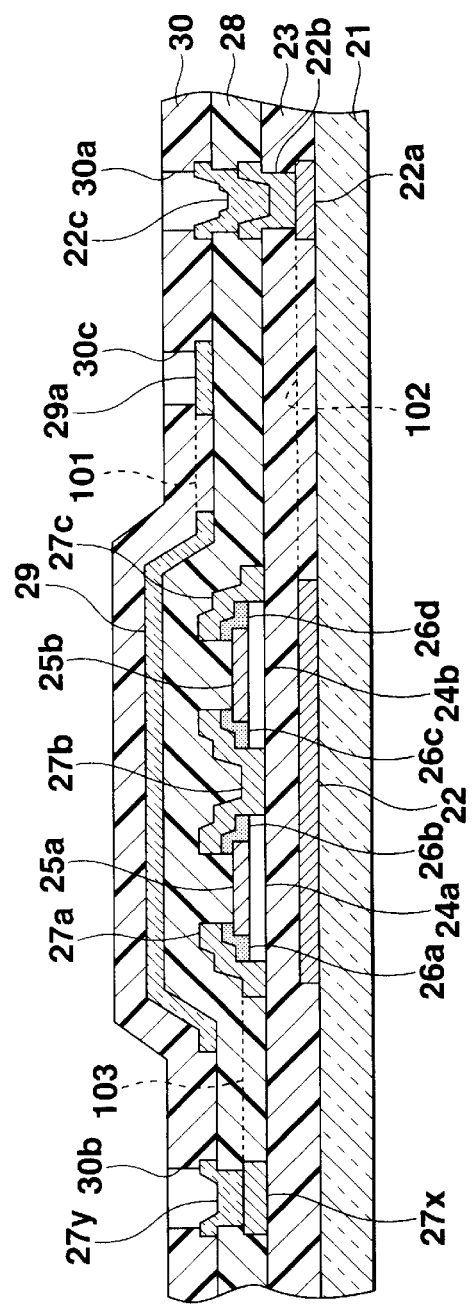
FIG.18A
FIG.18B

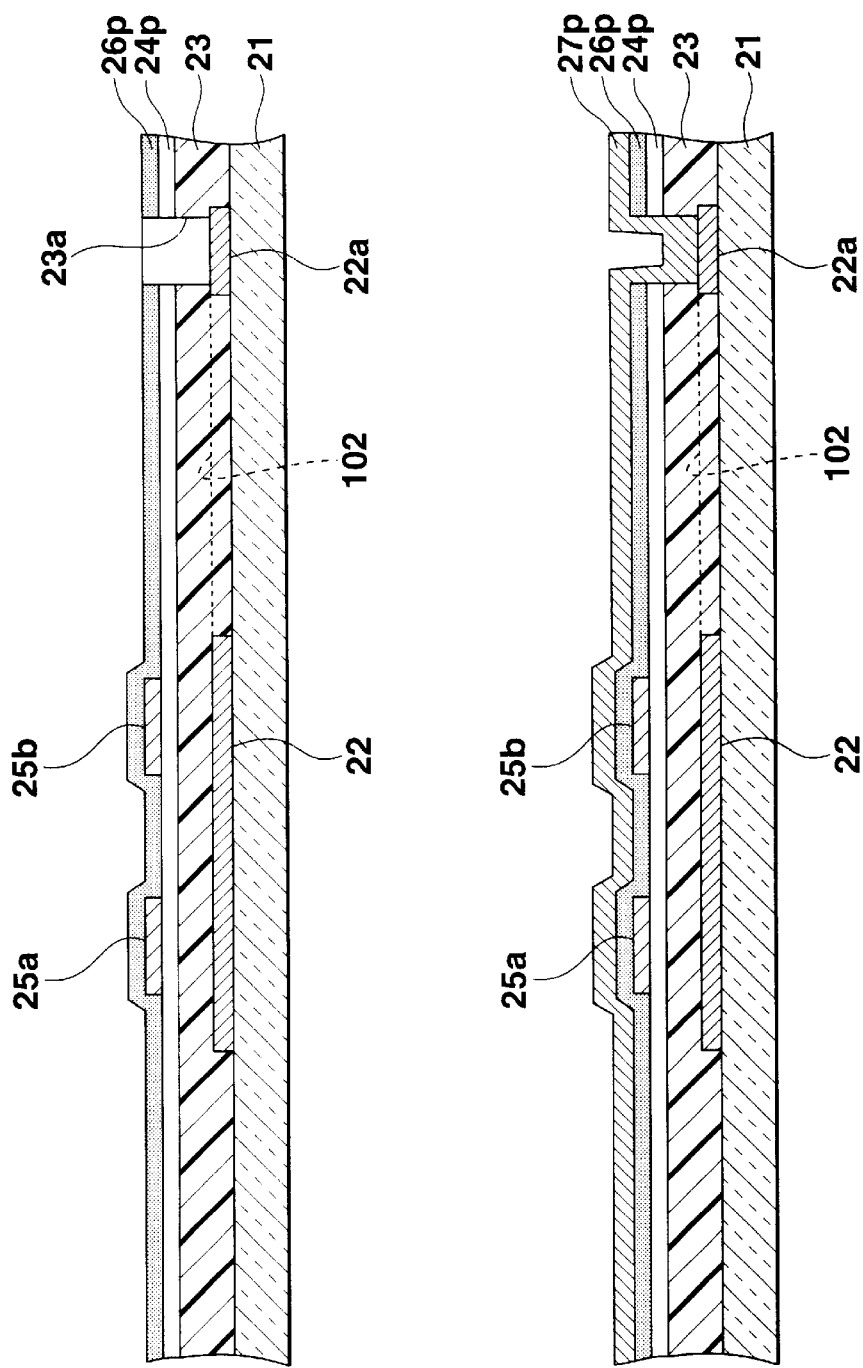

DOUBLE GATE PHOTO SENSOR ARRAY

CROSS-REFERENCE TO RELATED APPLICATIONS

This application is based upon and claims the benefit of priority from the prior Japanese Patent Applications No. 2000-110718, filed Apr. 12, 2000; and No. 2000-152828, filed May 24, 2000, the entire contents of both of which are incorporated herein by reference.

BACKGROUND OF THE INVENTION

The present invention relates to a photo sensor array and a method for manufacturing the same, the photo sensor array being constituted by arranging in two dimensions photoelectric conversion elements (photo sensors) formed of thin film transistors each having a double gate structure provided with a top gate electrode and a bottom gate electrode above and below a common semiconductor layer.

Conventionally, as a two-dimensional image reading device for reading printed matters, photographs, fine uneven configurations along finger prints, there is provided a device of a structure having a photo sensor array which is constituted by the arrangement of the photoelectric conversion elements (photo sensors) in a matrix-like configuration. As such photo sensor arrays, generally a solid imaging device such as a CCD (Charge Coupled Device) or the like is used.

As is known, the CCD has a structure in which photo sensors such as a photo diode, a transistor or the like are arranged in a matrix-like configuration, and an amount (a charge amount) of a pair of an electron and a hole generated in correspondence to a light amount applied to a light receiving portion of each of the photo sensors is detected with a horizontal scanning circuit and a vertical scanning circuit to sense the luminance of the applied light.

In a photo sensor system using such a CCD, since it is required to individually provide a selection transistor for setting each of the scanned photo sensors to a selection state, there is a problem in that the size of the system itself becomes large with an increase in the number of pixels.

Among the photo sensor systems to be applied to the above two-dimension image reading device, pad portions are arranged on the periphery of an array region in which the photo sensors are arranged in a matrix-like configuration. Some of the photo sensors are connected via the pad portions to a peripheral circuit such as a driver or the like for driving the photo sensor array. Here, for example, each of the photo sensors having a TFT structure constituting the photo sensor array has a structure in which a source and a drain electrode, and a gate electrode are provided with respect to a semiconductor layer provided on a glass substrate. Consequently, there is a problem in that since the section structure indispensably has a lamination structure, and the section structures at the array region and the pad portion are made different and individual manufacturing process is applied thereto, the film formation of the conductive layer and the insulating layer and the patterning step remarkably increases so that the manufacturing cost rises and the manufacturing time increases.

Furthermore, in the lamination structure of the photo sensor array, there is a problem in that a difference is generated in the step at the pad portion for connection with the peripheral circuit between the conductive layer formed at a relatively lower layer and the conductive layer formed at a relatively upper layer with the result that a junction with the peripheral circuit is likely to be deteriorated. Furthermore, there is also a problem in that the conductive layer formed on the relatively upper layer becomes more likely to be affected by the step by the conductive layer of the lower layer, and a danger of disconnection becomes high.

BRIEF SUMMARY OF THE INVENTION

An object of the present invention is to provide a photo sensor array and a method for manufacturing the same, the structure being intended to improve a junction between the photo sensor array and a peripheral circuit and suppressing the disconnection of the conductive layer while decreasing the manufacturing process.

A photo sensor array according to a first aspect of the present invention comprises:

a plurality of photo conversion elements separated from each other in a predetermined direction to be arranged, each photo conversion element including a semiconductor layer having an incidence effective region on which excited light is incident, a source and a drain electrode respectively provided on both end sides of the semiconductor layer, a first gate electrode provided below the semiconductor layer via a first gate insulating film, and a second gate electrode provided above the semiconductor layer via a second gate insulating film;

a source terminal commonly connected to the source electrodes of the photo conversion elements;

a drain terminal commonly connected to the drain electrodes of the photo conversion elements;

a first gate terminal commonly connected to the first gate electrodes of the photo conversion elements; and a second gate terminal commonly connected to the second gate electrodes of the photo conversion elements, at least one of the first gate electrode and the second gate electrode provided on the photo conversion elements being constituted of a first transparent electrode layer, and at least one of the source terminal, the drain terminal, and the gate terminal being constituted with the first transparent electrode layer.

According to the first aspect of the present invention, any of the source terminal, the drain terminal, the first gate terminal and the second gate terminal has a lamination structure including the transparent electrode layer which constitutes the first gate electrode or the second gate electrode. Thus, a favorable electric connection state with the peripheral circuit can be realized while lowering a sheet resistance which allows a thick formation of the structure of each terminal, and suppressing the failure in the configuration of the terminal. In particular, when the transparent electrode layer is made of ITO, a junction with the peripheral circuit can be improved as compared with the metal terminal other than the ITO.

The uppermost layer of at least any one of the source terminal, the drain terminal, and the first gate terminal may be constituted of the first transparent electrode layer. As a consequence, each of the terminals may be formed in a lamination layer by using the same material and the same process as the electrode layer formed on the incident side of the excited light with respect to the semiconductor layer.

Here, the photo sensor array comprises an electrostatic electricity discharging and contact sensing electrode provided via an insulating film above the photoelectric conversion terminals. When at least any one of the source terminal, the drain terminal, the first gate terminal and the second gate terminal is constituted with the second transparent electrode layer which constitutes the electrostatic electricity discharging and contact sensing electrode, it is possible to prevent the electrostatic breakdown and operation failure of the circuit such as a driver or the like with the contact of fingers on which static electricity is electrified. Thus, the driving of the photo sensor array can be automatically started.

Furthermore, at least as a lower layer of the source and the drain electrodes, the source and the drain terminals and the source-drain wiring, a semiconductor layer may be extended and provided. As a consequence, the lamination structure of each terminal portion can be made thick, and the configuration failure of the terminal is further suppressed, and a junction with the peripheral circuit can be further improved. Additionally, a step generated on the conductive layer such as an insulating layer provided on the layer upper than the semiconductor layer, the second gate electrode or the like can be alleviated, so that the deterioration of the insulating properties and the signal transmission properties can be suppressed.

Furthermore, the plurality of photoelectric conversion elements having the above structure are connected via terminals to a predetermined peripheral circuit such as a drain driver, a first gate driver, a second gate driver or the like, so that the photo sensor system having a favorable insulating properties, signal transmission properties, and junction can be manufactured in a simple manufacturing process.

Furthermore, the effective region on which excited light between the source-drain electrodes of the semiconductor layer is incident can be constituted so as to easily satisfy the predetermined configuration ratio, thus, the incidence effective region can be arbitrarily arranged to improve the deviation of the light sensing region. Consequently, since the incidence effective region of the semiconductor layer can be set so that the optimal configuration ratio can be provided, a sufficient source-drain current is allowed to flow even when the incident light of the excited light is very small. Thus, a favorable light receiving sensitivity can be realized.

With such a photo sensor array, the source electrodes of the semiconductor layers are connected to each other, the drain electrodes of the semiconductor layers are connected to each other, the source electrodes or the drain electrodes may be formed over two adjacent semiconductor layers out of the semiconductor layers.

Besides, the semiconductor layers of the photo conversion elements may be arranged along the directions of the channel length of the semiconductor layers.

Furthermore, when the photoelectric conversion elements are arranged in a delta configuration, the distance between the photoelectric conversion elements adjacent to each other in two dimensions can be made more even. Consequently, it is possible to suppress the deviation in the light information resulting from the unevenness in the light receiving sensitivity which differs in accordance with the direction at the time when the same subject to be photographed is placed at a planarly different angle with respect to the photo sensor array. Limitation on the angle at which the subject is placed can be small so that a photo sensor array excellent in the image reading properties can be realized.

A method for manufacturing a photo sensor array according to a second aspect of the present invention comprises:

forming a first gate electrode on an insulating film and a first gate base pad connected to the first gate electrode on a first gate terminal portion;

forming a first gate insulating film on at least the first gate electrode and the first gate terminal portion, then forming a semiconductor layer having a predetermined configuration above the first gate electrode for generating a carrier with excited light;

forming a first open portion for exposing the first gate base pad to the first gate terminal portion;

forming source and drain electrodes respectively provided on both ends of the semiconductor layer, a drain base pad connected to the drain electrode on the drain terminal portion, and a first gate terminal lower layer on the first gate terminal portion via the first open portion;

forming a second insulating film on at least the first gate terminal lower layer, the source-drain electrode, and the drain terminal portion, then forming a second open portion for exposing at least one of the first gate terminal lower layer and the first drain base pad; and forming a second gate base pad connected with the second gate electrode on the second gate electrode having a predetermined configuration and the second gate terminal portion above the semiconductor layer while forming via the second open portion at least one of the first gate terminal upper layer connected to the first gate terminal lower layer and a drain terminal upper layer connected to the drain base pad.

According to this manufacturing method, since the electrode layers which constitute any one of the first gate terminal and the drain terminal are laminated and formed with the same material and the same steps as the conductive layers of the photo conversion elements constituting a photo sensor array, each structure of the whole photo sensor array can be constituted and processed in a common series of manufacturing process. Thus an attempt can be made to decrease the manufacturing processes and reduce the manufacturing cost and manufacturing time. At the same time, the electrode layers which constitute any of the first gate terminal and the drain terminal can be favorably made thick and the sheet resistance of the terminal can be lowered.

In addition, on the protection insulating film, the electrostatic electricity discharging and contact sensing electrode, the first gate terminal uppermost layer or the drain terminal uppermost layer or the second gate terminal upper layer may be formed in the same process. This enables to prevent the electrostatic breakdown and operation failure of the photoelectric conversion elements by the charge electrified on the subject without increasing the manufacturing process. In addition, the junction with the peripheral circuit can be further improved by making the lamination structure of each terminal thick.

Furthermore, out of the lamination structure constituting the drain terminal, the first gate terminal and the second gate terminal, at least the conductive layer constituting the uppermost layer may be constituted of a transparent electrode layer. This enables to form the lamination of each terminal without increasing the manufacturing process by using the same material and the same process with the electrode layer formed on the incident side of excited light with respect to the semiconductor layer.

Furthermore, the semiconductor layer may be extended and provided on a lower layer of the source-drain electrode, the source-drain terminal and the source-drain wiring. Thus, the lamination structure of each terminal portion is made thicker, the sheet resistance is lowered, and configuration failure of the terminal is suppressed, and junction with the peripheral circuit can be further improved. In addition a step generated on the insulating layer provided on the upper layer than the semiconductor layer or on the conductive layer such as the second gate electrode or the like is alleviated so that the photo sensor system which can suppress the deterioration in the insulation properties and signal transmission properties can be provided in a simple manufacturing process.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a conceptual view showing a reset operation of the double-gate type photo sensor.

FIG. 5 is a conceptual view showing a light accumulation operation of the double-gate type photo sensor.

FIG. 6 is a conceptual view showing a pre-charge operation of the double-gate type photo sensor.

FIG. 7 is a conceptual view showing a selection state at the bright time of the double-gate type photo sensor.

FIG. 8 is a conceptual view showing a selection state at the dark time of the double-gate type photo sensor.

FIG. 9 is a conceptual view showing a non-selection state at the bright time of the double-gate type photo sensor.

FIG. 10 is a conceptual view showing a non-selection state at the dark time of the double-gate type photo sensor.

FIGS. 18A and 18B are sectional views for explaining the sixth step and the seventh step in a method for manufacturing the photo sensor array having a structure shown in FIG. 15.

FIGS. 35A and 35B are sectional views for explaining the first step and the second step of the method for manufacturing the photo sensor array having a structure shown in FIG. 34.

DETAILED DESCRIPTION OF THE INVENTION

Hereinafter, a photo sensor array and a method for manufacturing the same will be explained in detail.

In the beginning, each of double-gate type photo sensors applied to the photo sensor array will be explained.

Figure 1A:
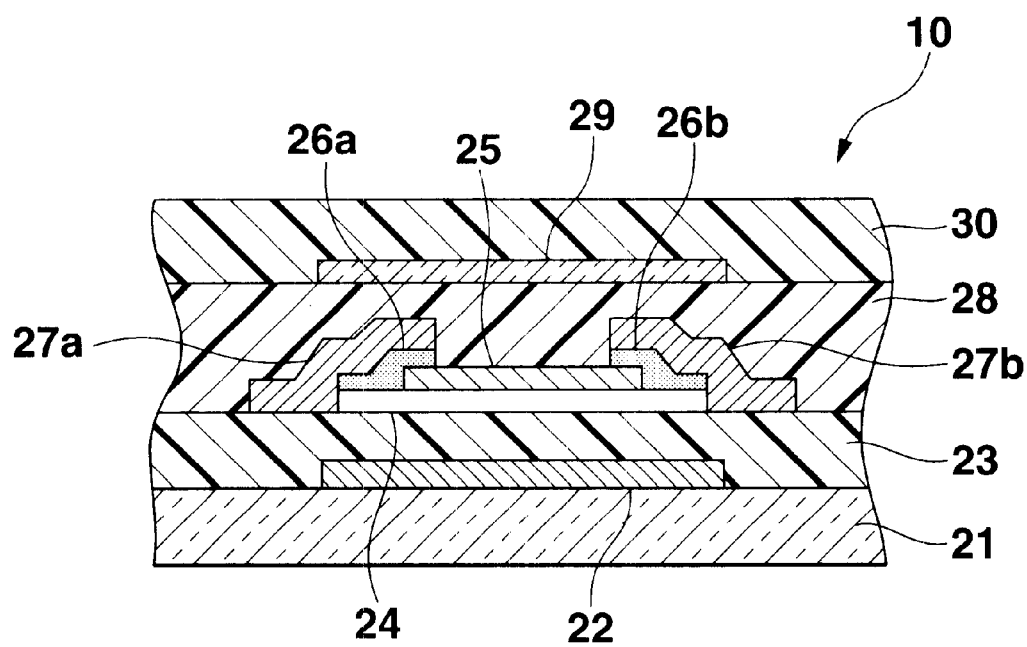
FIGS. 1A and 1B are a sectional view and a circuit diagram schematically showing a basic structure of a double-gate type photo sensor array applied to the present invention.

FIG. 1A is a sectional view schematically showing a basic structure of the double-gate type photo sensor. As shown in FIG. 1A, the double-gate type photo sensor 10 comprises a semiconductor layer (channel layer) 24 in which a pair of an electron and a hole is generated when excited light (here, visible light) is incident thereon; impurity doped layers 26a and 26b of n$^+$ silicon, the layers being provided respectively on both ends of the semiconductor layer 24; a drain electrode 27a and a source electrode 27b being made of chromium, aluminum, an aluminum alloy or the like formed on the impurity doped layers 26a and 26b, and being opaque against visible light; a top gate electrode 29 formed of a transparent conductive film such as ITO (Indium-Tin-Oxide) formed above the semiconductor layer 24 (upper portion in the drawing) via a block insulating film 25 and an upper portion (top) gate insulating film 28, the electrode being transparent against visible light; and a bottom gate electrode 22 formed of such material as chromium, a chromium alloy, aluminum, and an aluminum alloy via a lower portion (bottom) gate insulating film 23 below the semiconductor 24 (in a lower portion of the drawing), the electrode being opaque against visible light.

In FIG. 1A, the top gate electrode 29, the top gate insulating film 28, the bottom gate insulating film 23, and a protection insulating film 30 provided on the top gate electrode 29 are all formed of a material having a high transparency against visible light which excites the semiconductor layer 24. On the other hand, the bottom gate electrode 22 is formed of a material which does not transmit visible light with the result that the bottom gate electrode 22 is provided with a structure of detecting only light incident from an upper direction of the drawing.

Thus, the double-gate type photo sensor 10 is such that as a structure in which two MOS transistors are combined is formed on a transparent substrate 21, the two MOS transistors comprising an upper MOS transistor formed of the semiconductor layer 24, the drain electrode 27a, the source electrode 27b and the top gate electrode 29 and a lower MOS transistor formed of the semiconductor layer 24, the drain electrode 27a and the bottom gate electrode 22, two MOS transistors having as a common semiconductor layer 24 the semiconductor layer 24.

Figure 1B:
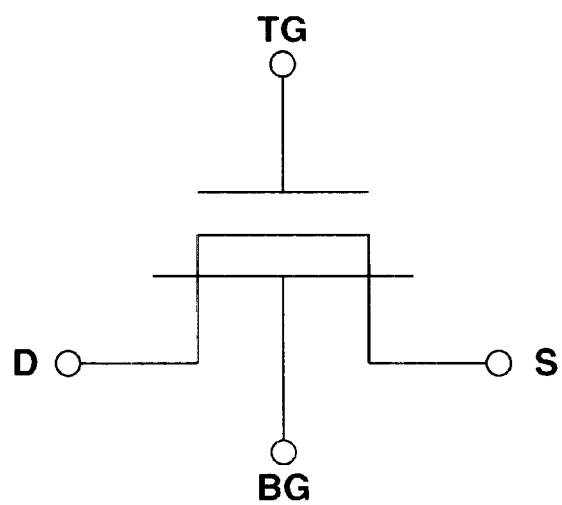

Such double-gate type photo sensor 10 is generally represented with an equivalent circuit as shown in FIG. 1B. Here, TG denotes a top gate terminal, BG denotes a bottom gate terminal, S denotes a source terminal, and D denotes a drain terminal.

Next, there will be briefly explained by referring to the drawing the photo sensor system provided with a photo sensor array constituted by arranging the above double-gate photo sensors in two dimensions.

Figure 2:
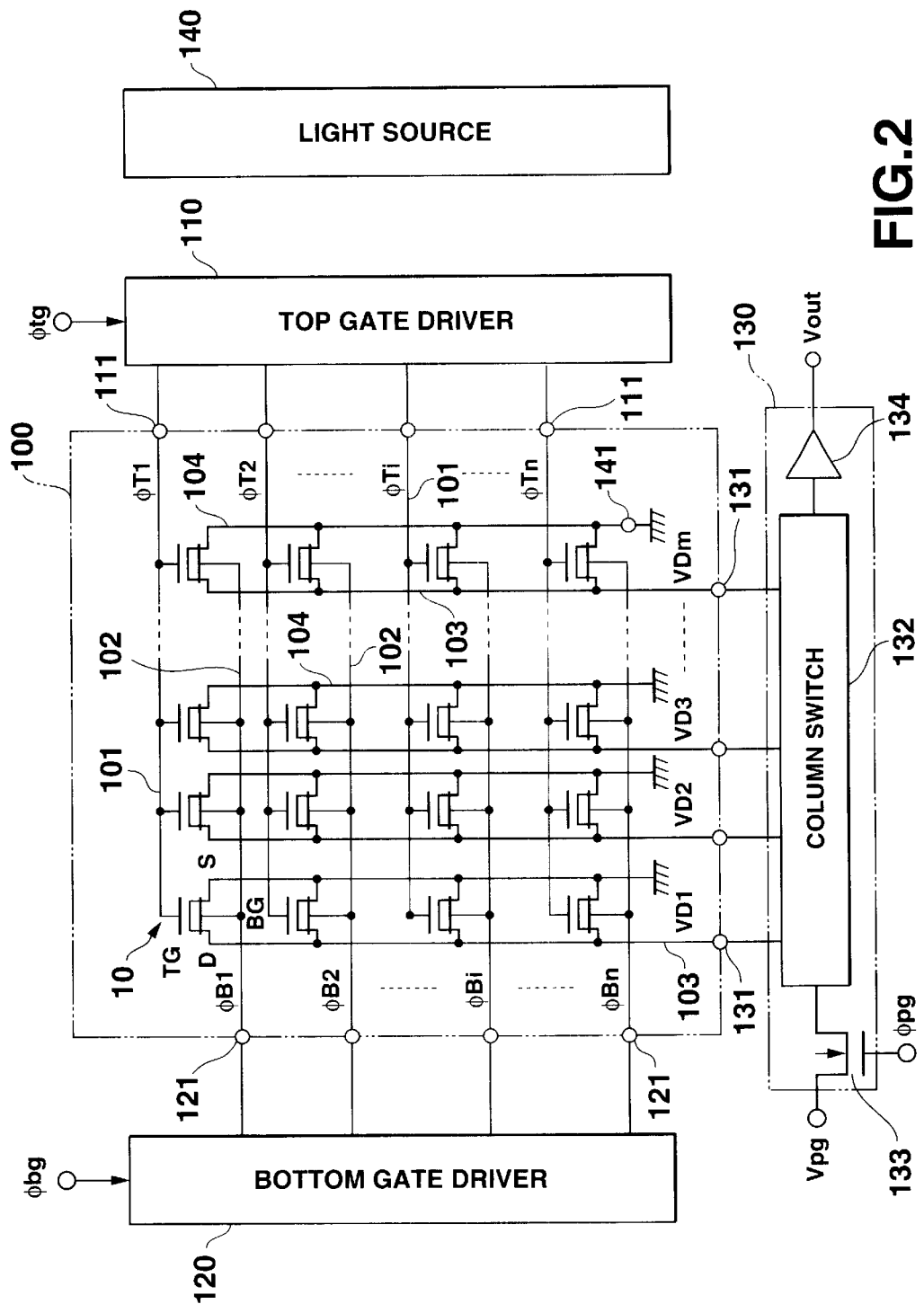
FIG. 2 is a schematic structure view showing a photo sensor system provided with a photo sensor array which is constituted by arranging in two dimensions double-gate type photo sensors applied to the present invention.

FIG. 2 is a schematic structure view showing the photo sensor system constituted by arranging the double-gate type photo sensors in two dimensions.

As shown in FIG. 2, the photo sensor system roughly comprises: a photo sensor array 100 in which a number of double-gate type photo sensors 10 are arranged in a matrix-like configuration of n rows and m columns; a top gate line 101 and a bottom gate line 102 which are extended by connecting in a row direction top gate terminals TG (top gate electrodes 29) and bottom gate terminals BG (bottom gate electrodes 22); a drain line 103 connecting in a column direction drain terminals D (drain electrodes 27a) of the double-gate type photo sensors 10; a source line 104 connecting in a column direction a source terminals S (source electrodes 27b); a group of top gate pads 111 arranged on a peripheral portion of the photo sensor array 100 to be connected to the top gate lines 101, a group of bottom gate pads 121 connected to the bottom gate group; a group of drain pads 131 connected to the drain lines 103, a group of source pads 141 (the number of pads is 1 or more); a top gate driver 110 connected to the top gate lines 101 via the top gate pad group 111;

a bottom gate driver 120 connected to the bottom gate lines 102 via the bottom gate pad group 121;

a drain driver (output circuit portion) 130 including a column switch 132 connected to the drain lines 103 via the drain pad group 131, a pre-charge switch 133, and an amplifier 134; and a light source 140 which serves as a back light.

Here, the top gate lines 101 are integrally formed with a transparent conductive film such as an ITO or the like together with the top gate electrodes 29. The bottom gate lines 102, the drain lines 103, and the source lines 104 are integrally formed of the same material as the bottom electrodes 22, the drain electrodes 27a, and the source electrodes 27b, the material being opaque to the excited light. The source lines 104 are connected to the grounding potential via the source pad group 141.

In FIG. 2, symbols φtg and φbg denote control signals for creating reset pulses φT1, φT2, . . . , φTi, . . . , φTn, and reading pulses φB1, φB2, . . . , φBi, φBn, respectively. Symbol φpg denotes a pre-charge signal for controlling the timing at which the pre-charge voltage Vpg is applied.

In such a structure, a photo sense function is realized by applying a voltage from the top gate driver 110 to the top gate terminal TG via the top gate line 101. A voltage is applied from the bottom gate driver 112 to the bottom gate terminal BG via the bottom gate line 102. A detection signal is incorporated into the drain driver 130 via the drain line 103 by applying a voltage to the bottom gate terminal BG with the result that a selective reading function is realized by outputting (Vout) the signal as serial data or parallel data.

Next, there will be explained by referring to the drawings a method for driving the above photo sensor system.

Figure 3:
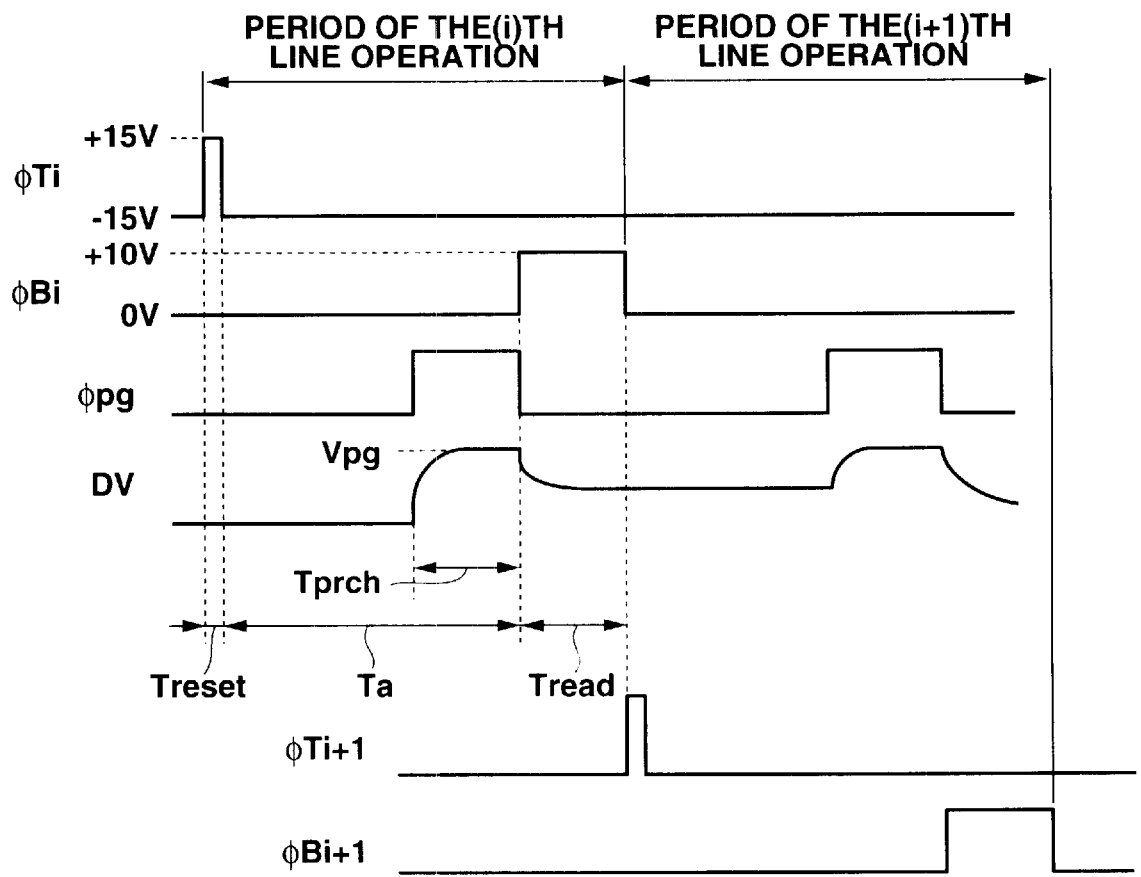
FIG. 3 is a timing chart showing one example of a driving control method of the photo sensor system.
Figure 11:
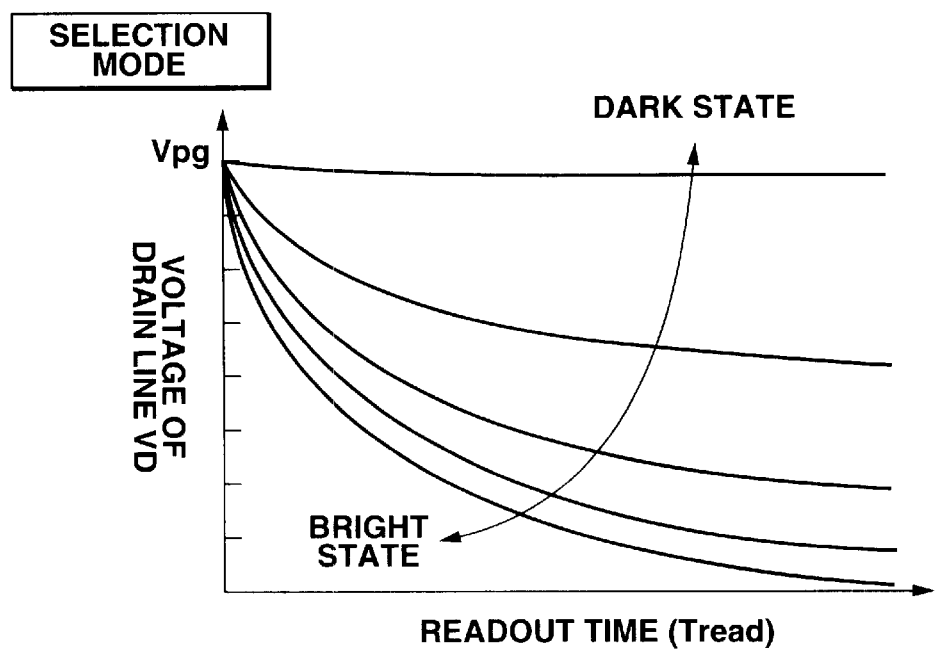
FIG. 11 is a view showing light response characteristics of an output voltage of the photo sensor system in a selection mode.
Figure 12:
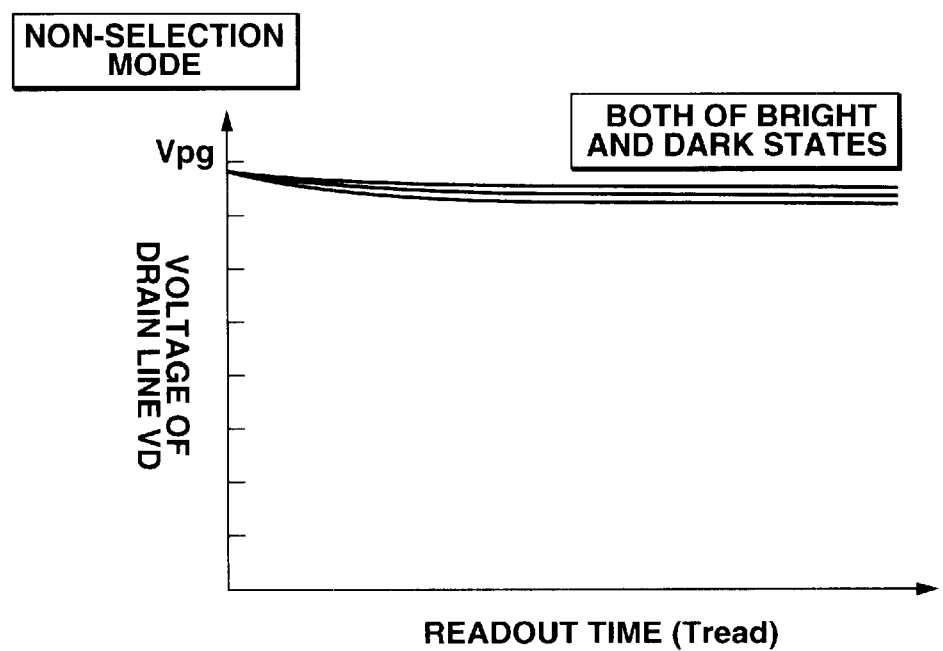
FIG. 12 is a view showing light response characteristics an output voltage of the photo sensor system in a non-selection mode.

FIG. 3 is a timing chart showing one example of the method for driving the above photo sensor system. FIGS. 4 through 10 are operation conceptual views showing a double-gate type photo sensor. FIGS. 11 and 12 are views showing light response properties of an output voltage of the photo sensor system. Here, the explanation is made by appropriately referring to the structure of the double-gate type photo sensor and the photo sensor system (FIG. 1 and FIG. 2).

In the beginning, in the reset operation, as shown in FIGS. 3 and 4, a pulse voltage (a reset pulse; for example, a high level of Vtg=+15V) φTi is applied to the i-th row top gate line 101, so that carriers (here, holes) is accumulated in the vicinity of the interface with the semiconductor layer 24 of each double-gate type photo sensor 10 and the semiconductor layer 24 in the block insulating film 25 (reset period Treset) are released.

Next, in the light accumulation period, as shown in FIGS. 3 and 5, a low level (for example, Vtg=−15V) bias voltage φTi is applied to the top gate line 101 to terminate the reset operation and start the light accumulation period by the carrier accumulation operation. In the light accumulation period Ta, the light incidence effective region of the semiconductor layer 24, namely, the carrier generation region electron-hole pairs are created so that the positive holes are accumulated in the vicinity of the interface with the semiconductor layer 24 in the block insulating film 25, namely, on the periphery of the channel region.

In the pre-charge operation, as shown in FIGS. 3 and 6, a predetermined voltage (pre-charge voltage) Vpg is applied to the drain line 103 on the basis of the pre-charge signal φpg along with the light accumulation period Ta to allow the drain electrode to hold charges (a pre-charge period Tprch).

Next, in the reading operation, as shown in FIGS. 3 and 7, after the lapse of the pre-charge period Tprch, a high level (for example, Vbg=+10V) bias voltage (reading selection signal, hereinafter referred to as a reading pulse) φBi is supplied to the bottom gate line 102 to set the double-gate type photo sensor 10 in an ON state (reading period Tread).

Here, in the reading period Tread, the carriers (hole) work in a direction of alleviating the Vtg (−15V) applied to the tog gate terminal TF having a reverse polarity, so that an n-channel is formed with the bottom gate terminal BG. Thus, the drain line voltage VD of the drain line 103 shows a tendency of gradually lowering with the lapse of time from the pre-charge voltage Vpg as shown in FIG. 11. That is, in the case where the carriers (positive holes) are not accumulated in the channel region in the state in which the light-accumulation state is dark in the light accumulation period Ta, as shown in FIGS. 8 and 11, the positive bias on the bottom terminal BG is eliminated by applying a negative bias to the top gate terminal TG, so that the double-gate sensor 10 is turned off. Then, the drain voltage, namely, the voltage VD of the drain line 103 is held as it is.

On the other hand, in the case where the light accumulation is in the bright state, as shown in FIGS. 7 and 11, the carriers (positive holes) are trapped in accordance with the incident light amount with the result that the carriers work to eliminate the negative bias on the top gate terminal TG. Consequently, the double-gate type photo sensor 10 is turned on with the positive bias of the bottom gate terminal BG by the eliminated amount. Then, in accordance with the ON resistance corresponding to the incident light amount, the voltage VD of the drain line 103 is lowered.

Consequently, as shown in FIG. 11, the change tendency of the voltage VD of the drain line 103 is deeply associated with the light amount received during a time (light accumulation time Ta) from the termination point of the reset operation by the application of the reset pulse φTi to the top gate terminal TG up to the time of application of the reading pulse φBi to the bottom gate terminal BG. In the case where the accumulated carrier is small, there is shown a tendency that the voltage VD is gradually lowered. On the other hand, in the case where many carriers are accumulated, there is shown a tendency that the voltage VD is abruptly lowered. As a consequence, the reading period Tread is started, the light amount of the applied light is calculated by detecting the voltage VD of the drain line 103 after the lapse of a predetermined time, and by detecting time until a predetermined reference voltage is attained by referencing to the predetermined reference voltage.

The double-gate type photo sensor 10 can be operated as a two-dimension sensor system by allowing the i+1-th row double-gate photo sensor to repeat the same processing procedure by setting a series of image reading operations as one cycle.

In the timing chart shown in FIG. 3, after the lapse of the pre-charge period Tprch, as shown in FIGS. 9 and 10, when the applied state of the low level (for example, Vbg=0V) to the bottom gate line 102 is continued, the double-gate photo sensor 10 sustains the OFF state. As shown in FIG. 12, with respect to the voltage VD of the drain line 103, a pre-charge voltage vpg is sustained. In this manner, a selection function of selecting the read state of the double-gate photo sensor 10 is realized depending upon the application state of the voltage to the bottom gate line 102.

Figure 13:
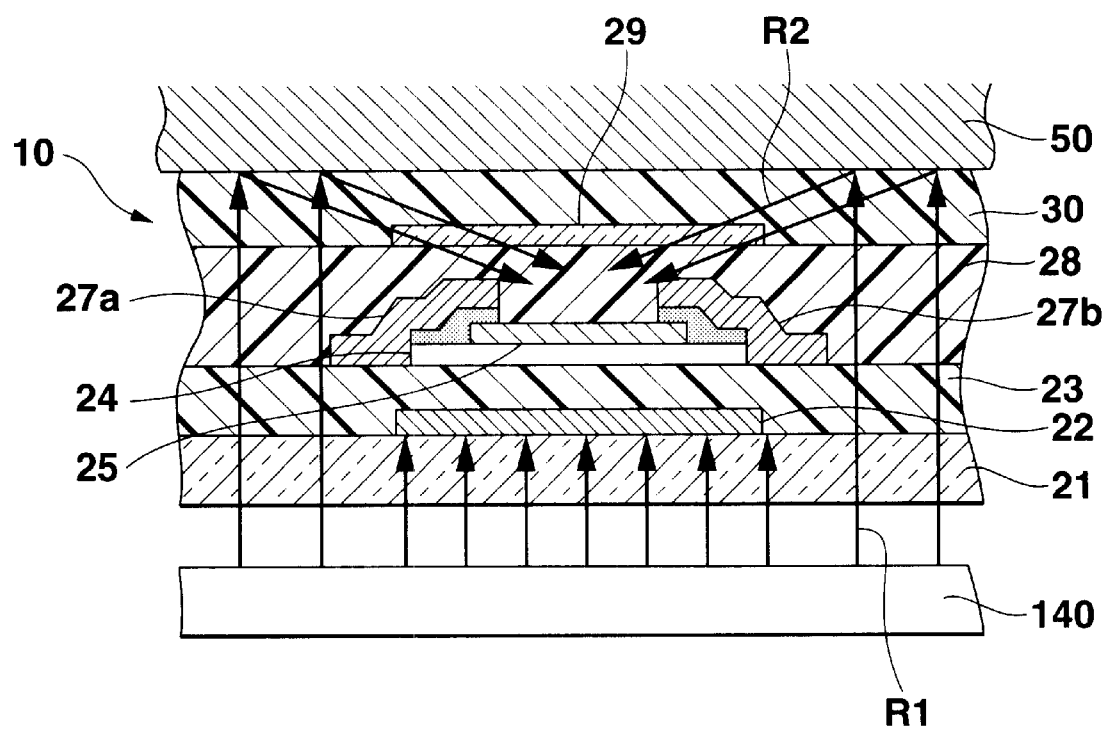
FIG. 13 is a sectional view showing an essential portion of a reading device for reading a two-dimension image in which the photo sensor system provided with the double-gate photo sensor is provided.

FIG. 13 is a sectional view showing a portion of an image forming apparatus for reading a two-dimension image wherein the photo sensor system is applied.

As shown in FIG. 13, in the image reading apparatus for reading a two-dimension image such as a finger print or the like, applied light R1 is incident on the apparatus from a back light (surface light source) 40 provided on a lower side of the glass substrate (insulating substrate) 21 on which the double-gate type photo sensor 10 is formed. In the apparatus, the applied light R1 is allowed to pass through the transparent insulating substrate 21 and insulating films 23, 28 and 30 except for the formation region of the double-gate type photo sensor 10 to be applied on the subject on the protection insulating film 50.

The reflection light R2 depending upon the reflection rate (bright and dark information) determined by the image pattern (or projection and recession pattern) of the subject 50 passes through the transparent insulating films 30, 28 and 25 and the top gate electrode 29 to be incident on the semiconductor layer 24 with the result that the carriers corresponding to the image pattern of the subject 50 are accumulated and the image pattern of the subject 50 can be read as bright and dark information by the series of driving control method.

Next, the photo sensor array according to the present invention will be explained by showing concrete embodiments thereof. Incidentally, the embodiments shown below will be explained on the following presupposition; as a photoelectric conversion element (a photo sensor), the above double-gate type photo sensor is applied and a voltage is applied by using the top gate electrode as a first gate electrode. Thus, the photo sensing function is realized. A voltage is applied by using the bottom gate electrode as a second gate electrode. Thus, a function of reading an amount of charges accumulated in the channel region is realized.

<First Embodiment>

Figure 14:
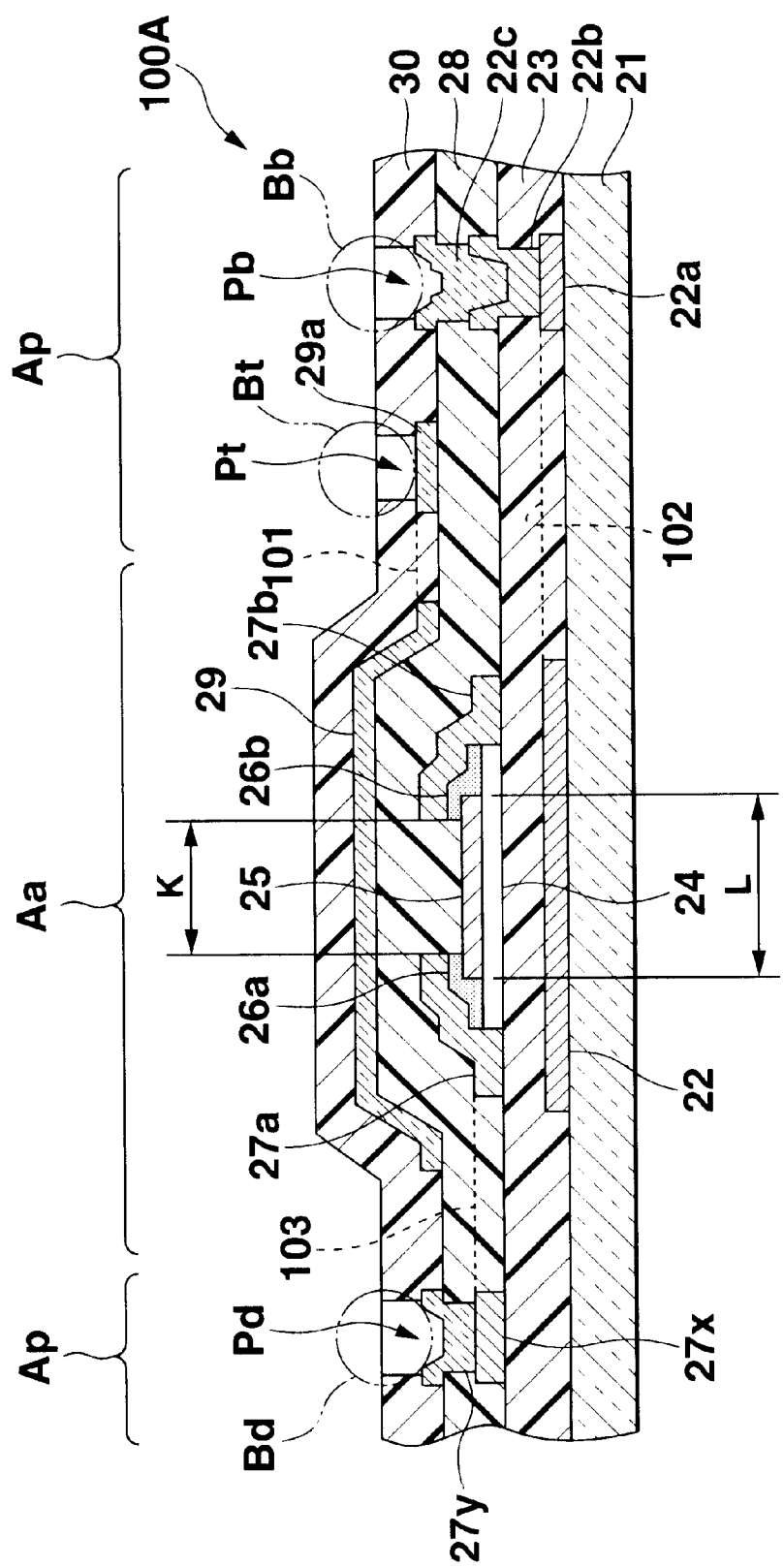
FIG. 14 is a sectional view showing a portion of one construction example in the photo sensor array according to the present invention.

FIG. 14 is a sectional view showing a portion of one structure example in the photo sensor array according to the present invention. Here, there will be explained a case in which the photo sensor array is constructed by applying the double-gate type photo sensor having the same structure as the structure shown in FIG. 1A. Incidentally, for the sake of the illustration in the figure, only a single double-gate type photo sensor is shown which is formed on the array region. Besides, with respect to the structure same as the above structure (FIG. 1A), the explanation is simplified by attaching the same reference numeral.

As shown in FIG. 14, the photo sensor array 100A in the structure example roughly comprises an array region Aa constituted by arranging in a matrix-like configuration photo sensors, and pad regions Ap electrically connected to the peripheral circuits such as a driver or the like.

Like the structure of FIG. 1A described above, the array region Aa is such that a plurality of photo sensors (only one sensor is shown for the sake of convenience in FIG. 14) are arranged in a matrix-like configuration on the insulating film 21. The photo sensor, comprises a semiconductor layer 24 formed of amorphous silicon or the like, impurity doped layers 26a and 26b provided respectively on both ends of the semiconductor layer 24, a drain electrode 27a and a source electrode 27b provided respectively on the impurity doped layers 26a and 26b, a block insulating film 25 provided on the semiconductor layer 24, a top gate electrode 29 formed above the semiconductor layer 24 via the top gate insulating film 28, and a bottom gate electrode 22 formed below the semiconductor layer 24 via the bottom gate insulating film 23.

Here, the block insulating film 25, the top gate insulating film 28, the bottom gate insulating film 23, and the protection insulating film 30 are constituted of a transparent insulating film such as, for example, silicon nitride (SiN) or the like which has light transmitting properties. Furthermore, the top gate electrode 29 and the top gate line 101 are formed of a conductive film such as ITO or the like showing a high transparency rate with respect to excited light. On the other hand, at least the bottom gate electrode 22 and the bottom gate line 102 are formed of a material such as chromium or the like which blocks the passage of excited light.

On the pad region Ap, there are arranged in a predetermined pitch a bottom gate pad portion Pb (bottom gate pad group 121 shown in FIG. 2) formed on an end portion of the bottom gate line 102 extending from the bottom gate electrode 22, a drain pad portion Pd (the drain pad group 131 shown in FIG. 2) formed on the end portion of the drain line 103 extending from the drain electrode 27a, and a top gate pad portion Pt (the top gate pad group 111 shown in FIG. 2) formed on the end portion of the top gate line 101 extending from the top gate electrode 29.

Here, the bottom pad portion Pb has a structure in which a first bottom pad electrode layer 22b constituted of the same conductive material (for example, chromium) as the drain electrode 27a and the source electrode 27b and a second bottom pad electrode layer 22c constituted of the same material (for example, ITO) as the top gate electrode 29 are laminated on the base pad 22a which is integrally formed with the bottom gate electrode 22 and the bottom gate line 102. The second bottom pad electrode layer 22c is exposed from the open portion formed on the protection insulating film 30 to be electrically connected via, for example, a bump (external terminal) Bb provided on the side of the bottom gate driver 120.

The drain pad portion Pd has a structure in which the first drain pad electrode layer 27y constituted of the same conductive material (for example, ITO) as the top gate electrode 29 are laminated on the base pad 27x integrally formed with the drain line 102, and the drain pad electrode layer 27y which constitutes the uppermost layer is exposed from the protection insulating film 30 to be electrically connected via the bump Bd provided on the side of the drain driver 130 (column switch 132).

The top gate portion Pt is such that the base pad 29a formed integrally with the top gate line 101 is directly exposed from the protection insulating film 30 to be electrically connected via the bump Bt provided on the side of the top gate driver 110.

That is, since the section structure of the photo sensor is a lamination structure as described above in the photo sensor array to which the double-gate type photo sensor is applied, there is a possibility that the step in the open portion formed on the pad portion becomes conspicuous and the configuration failure of the lead electrode (electrode layer on the pad portion) and a junction failure with the bump on the side of the driver are generated.

In contrast, in the photo sensor array according to the structure example, the pad portions (particularly, the bottom gate pad portion Pb and the drain pad portion Pd) formed on the pad region are formed in a lamination structure comprising a plurality of electrode layers. Thus, the laminated electrode layer is formed in a thick configuration to enable suppressing the configuration failure while making it possible to improve the junction with the bump on the driver side.

Furthermore, the photo sensor array 100A is provided with both the second bottom pad electrode layer 22c and the first drain pad electrode layer 27y. Only any one of the two electrode layers may be provided in the photo sensor array 100A. Then, the source pad group 141 may have the same structure as the base pad 27x, the first drain pad electrode layer 27y, and the pad region Ap. Besides the source pad group 141 may be formed in one layer structure formed of the same layer as the base pad 27x.

Figure 15:
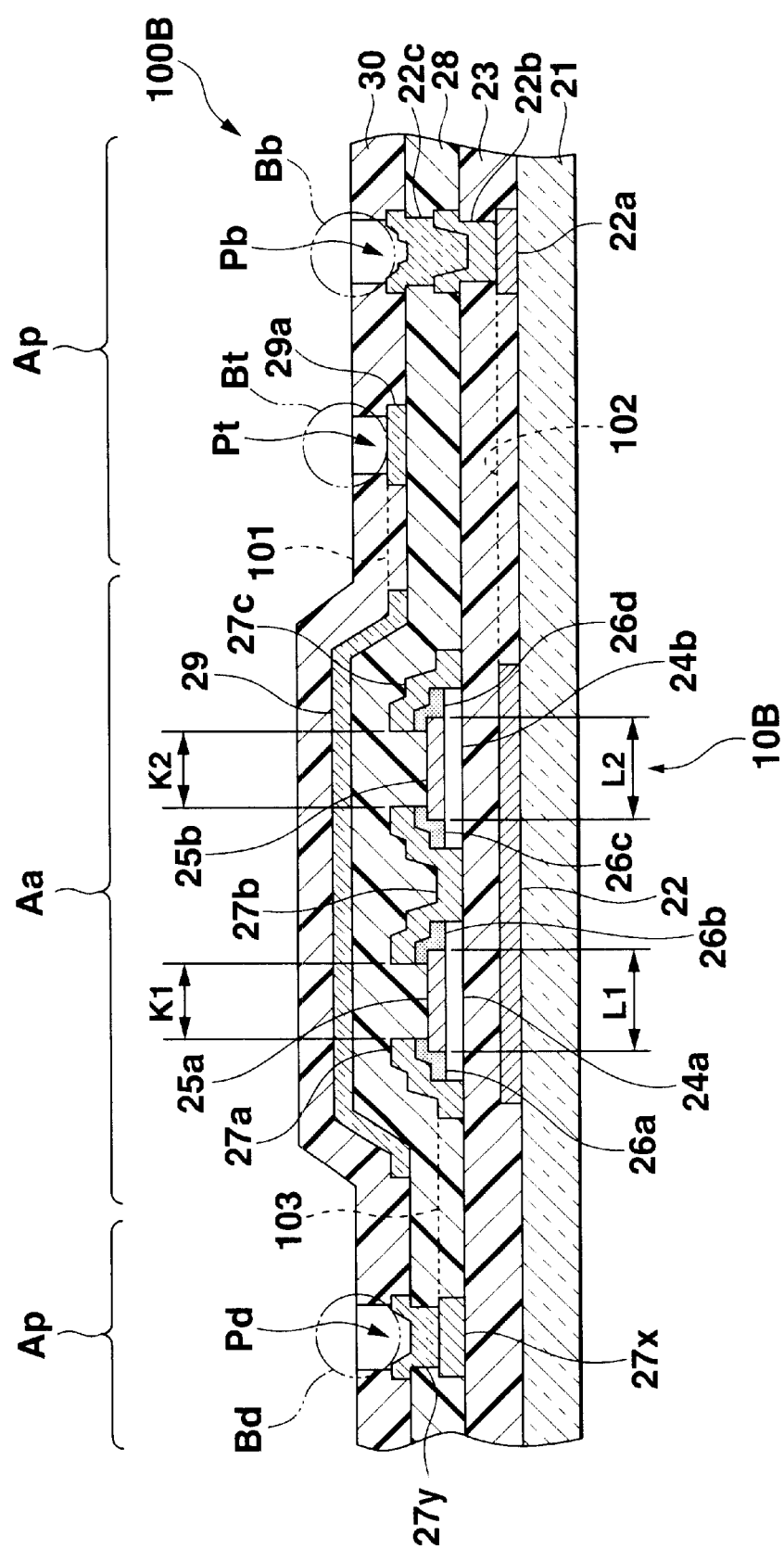
FIG. 15 is a sectional view showing a part of another structure example in the photo sensor array according to the present invention.

FIG. 15 is a sectional view showing a part of another structure example in the photo sensor array according to a first embodiment of the present invention. Here, there will be explained a case in which the photo sensor array is constituted of the double-gate type photo sensors each provided with two semiconductor layers which constitute the photo sensor array portions per one element. Incidentally, for the sake of illustration in the figure, there is shown only a single double-gate type photo sensor formed on the array region. Furthermore, the elements same as the above elements (see FIGS. 1A and 14) are denoted by the same reference numerals and an explanation thereof is omitted.

As shown in FIG. 15, the photo sensor array 100B in the structure example is constituted with the array region Aa and the pad regions Ap in the same manner as the structure shown in FIG. 14. On the array region Aa, a plurality of photo sensors (only one sensor is shown in FIG. 15 for the sake of convenience) are arranged in a matrix-like configuration on the insulating substrate 21, the photo sensor comprises two semiconductor layers 24a and 24b formed of amorphous silicon or the like, the layers being arranged in parallel to generate electron-hole pairs when visible light is incident thereon, impurity doped layers 26a, 26b and 26c, 26d formed of n$^+$ silicon, the layers being provided respectively on both ends of each of the semiconductor layers 24a and 24b, a single source electrode 27b extending over the impurity doped layers 26b and 26c of the semiconductor layers 24a and 24b, the electrode being formed between the semiconductor layers 24a and 24b drain electrodes 27a and 27c located opposite to the source electrode 27b sandwiching each of the semiconductor layers 24a and 24b and formed on the impurity doped layers 26a and 26d, the electrodes 27a and 27c being electrically connected at a portion not shown, a block insulating film 25a provided on the semiconductor layer 24a, and the block insulating layer 25b provided on the semiconductor layer 24b, a single top gate electrode 29 formed above the semiconductor layers 24a and 24b via the top gate insulating film 28, and a single bottom gate electrode 22 formed below the semiconductor layers 24a and 24b via the bottom gate insulating film 23. Incidentally, the pad region Ap has a pad portion having a lamination structure in the same manner as the structure shown in FIG. 14.

That is, the double-gate type photo sensor applied to the photo sensor array 100B in the construction example has a structure in which there are connected and arranged in parallel a first and second double-gate type photo sensors. The first double-gate type photo sensor comprises a first upper MOS transistor formed on an insulating substrate 21 with the semiconductor layer 24a, the drain electrode 27a, the source electrode 27b, the top gate insulating film 28 and the top gate electrode 29, and a first lower MOS transistor formed of the semiconductor layer 24a, the drain electrode 27a, the source electrode 27b, the bottom gate insulating film 23, and the bottom gate electrode 22, the semiconductor layer 24a serving as a common channel region. The second double-gate type photo sensor comprises a second upper MOS transistor formed of the semiconductor layer 24b, the source electrode 27b, the drain electrode 27c, the top gate insulating film 28 and the top gate electrode 29, and a second lower MOS transistor formed of the semiconductor layer 24b, the source electrode 27b, the drain electrode 27c, the bottom gate insulating film 23 and the bottom gate electrode 22, the semiconductor layer 24b serving as a common channel region.

In the photo sensor array 100B which has such a structure, since the pad portion can be formed in a lamination structure in a similar manner as the above construction example, the configuration failure of the electrode layer can be suppressed and a junction with the driver can be improved.

The top gate electrode 29 and the bottom gate electrode 22 constituting the first and the second double-gate type photo sensors are constituted of common electrodes respectively while there is provided a structure in which the drain electrodes 27a and 27c are divided (branched) opposite to the common source electrode 27b. Thus, the double-gate type photo sensor provided with two semiconductor layers which constitute a photo sensor portion per one device can be operated in a similar manner as the double-gate type photo sensor provided with one semiconductor layer by applying the above driving control method.

With respect to the method for manufacturing the photo sensor array having the above structure, a detailed explanation will be given by referring to the drawings.

Figure 16A:
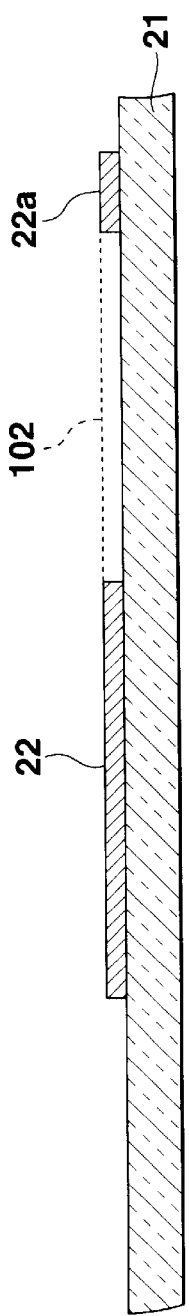
FIGS. 16A through 16C are sectional views for explaining the first step through the third step in a method for manufacturing the photo sensor array having a structure shown in FIG. 15.
Figure 16B:
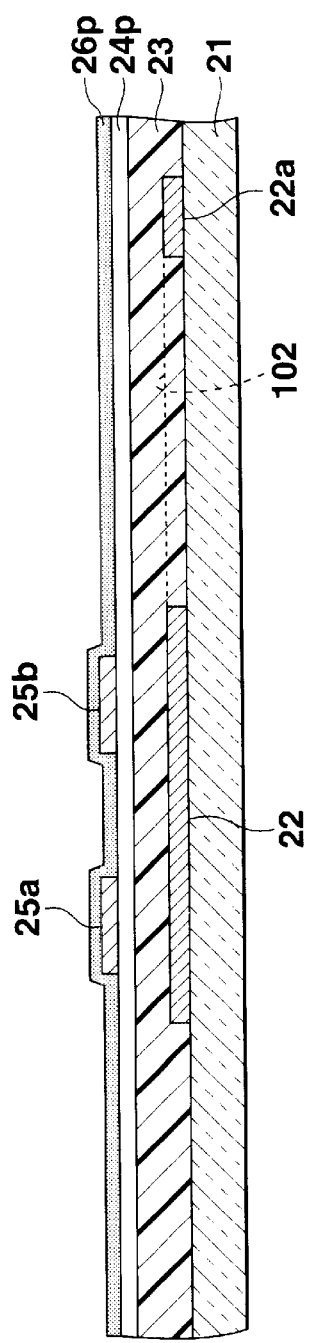

FIGS. 16A and 16B are sectional views for explaining the each of the steps in a method for manufacturing the photo sensor array having a structure shown in FIG. 15. It can be understood that the method for manufacturing the photo sensor array shown in FIG. 14 can be realized with approximately the same manufacturing process. Furthermore, in the following explanation, the designation of the first step through the seventh step is conveniently used for the sake of explanation, and is not associated with the actual manufacturing process.

In the beginning, at the first step after a metal layer made of chromium or the like is formed to a thickness of, for example, 100 nm (1000 Å) on an insulating substrate 21 such as a glass substrate or the like by the sputtering method, the vapor deposition method or the like, this metal layer is selectively etched by using the photolithography technique or the reaction ion etching (RIE) method to form a bottom gate electrode 22 having a predetermined configuration, a base pad 22a, and a bottom gate line 102.

Next, at the second step, as shown in FIG. 16B, an insulating film 23 (hereinafter referred to as a bottom gate insulating film) formed of silicon nitride or the like to, for example, a thickness of 250 nm, an amorphous silicon film (hereinafter referred to as an a-Si film) 24p having a thickness of, for example, 50 nm and an insulating film (hereinafter, denoted as an SiN film) formed of silicon nitride to a thickness of, for example, 100 nm are formed on an insulating film 21 including the bottom gate electrode 21, the base pad 22a, and the bottom gate line 102.

Next, block insulating films 25a and 25b are formed which have a predetermined configuration by selectively etching the SiN film above the bottom gate electrode by using the photolithography method, the dry etching method or the like.

Next, on the entire region of the a-Si film 24p including a portion above the block insulating films 25a and 25b, an N-type silicon film 26p formed of, for example, amorphous silicon including the N-type impurity ion such as phosphorus ion (P$^+$) or the like and having a thickness of 25 nm is deposited on the entire region on the a-Si film 24p including the block insulating films 25a and 25b by the plasma CVD method or the like. Instead, the silicon film 26 may be so formed that, after an intrinsic amorphous silicon film is formed, the N-type impurity ion may be doped into the amorphous silicon film by the ion implantation method and the heat dispersion method.

Figure 16C:
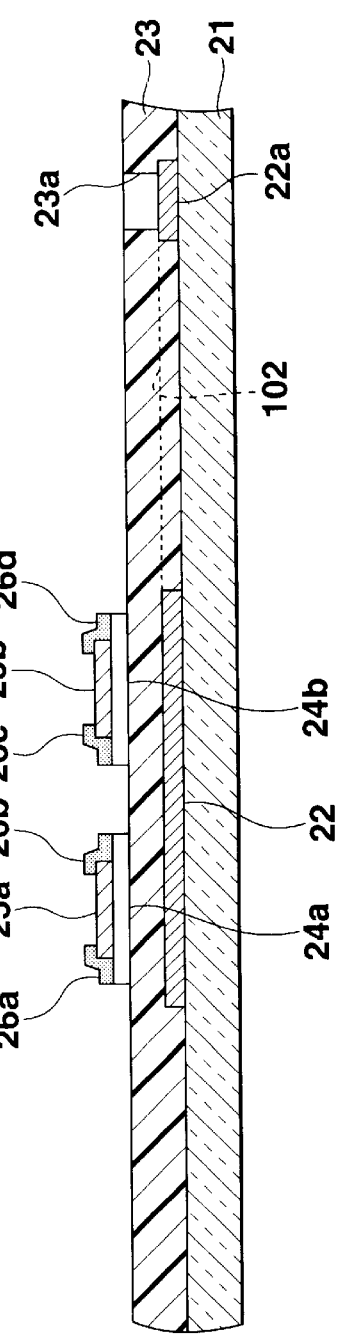

Next, at the third step, as shown in FIG. 16C, the a-Si film 24p and the N-type silicon film 26p are selectively etched by using the photolithography technology and the dry etching method so that the semiconductor layers (channel layers) 24a and 24b which have a predetermined configuration are formed under the block insulating films 25a and 25b, impurity doped layers 26a and 26b having a predetermined configuration extending on both end portions of the block insulating film 25a are formed on both ends of the semiconductor layer 24a and impurity doped layers 26c and 26d having a predetermined configuration extending on both end portions of the block insulating film 25b are formed on both ends of the semiconductor layer 24b.

Thereafter, by using the photolithography technology, the dry etching method or the like, an open portion 23a which exposes an upper surface of the base pad 22a is formed by etching a portion of the bottom gate insulating film 23 on the base pad 22a.

Figure 17A:
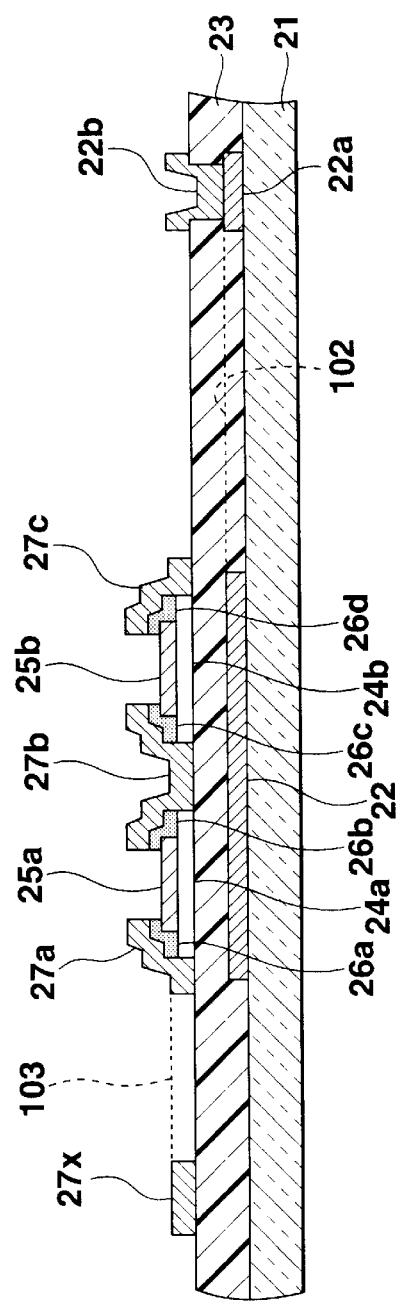
FIGS. 17A and 17B are sectional views for explaining the fourth step and the fifth step in a method for manufacturing the photo sensor array having a structure shown in FIG. 15.

At the fourth step, as shown in FIG. 17A, a metal layer made of chromium or the like and having a thickness of, for example, 50 nm is formed, by the sputtering method or the like, over the entire region of the bottom gate insulating film 23 including a portion above the semiconductor layers 24a, 24b, the block insulating films 25a and 25b, and impurity doped layers 26a, 26b, 26c and 26d formed at the third step. This metal layer is selectively etched by using the photolithography technology and the RIE method so that the drain electrodes 27a and 27c which are formed extending over the impurity doped layers 26a and 26d opposite to the source electrode 27b sandwiching each of the semiconductor layer 24a and 24b and which are mutually connected with the wiring layer not shown, a base pad 27x arranged at a predetermined position, and a drain line 103 connecting the drain electrode 27a to the base pad 27x are formed. At this time, a first bottom pad electrode layer 22b connected to the base pad 22a is simultaneously formed via the open portion 23a formed on the bottom gate insulating film 23.

Figure 17B:
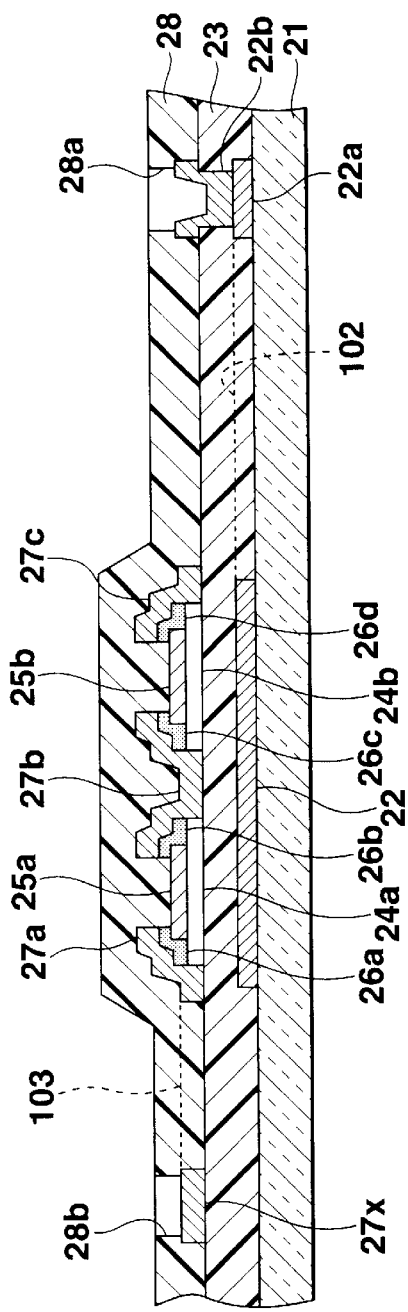

At the fifth step, as shown in FIG. 17B, an insulating film (hereinafter, referred to as the top gate insulating film) 28 having a thickness of, for example, 150 nm is formed on the entire region over the bottom gate insulating film 23 including the drain electrodes 27a and 27c, the source electrode 27b, the base pad 27x and the drain line 103, and the first bottom pad electrode layer 22b, by the plasma CVD method or the like. Then the first bottom electrode layer 22b and the top gate insulating film 28 on the base pad 27x are etched to form open portions 28a and 28b exposing the first bottom pad electrode layer 22b and the base pad 27x.

At the sixth step, as shown in FIG. 18A, a transparent conductive layer such as ITO or the like having a thickness of, for example, 50 nm is formed on the entire region over the top gate insulating film 28 by the sputtering method, the ion implanting method or the like. The transparent conductive layer is selectively etched by using the photolithography technology, the wet etching method or the like to form a common top gate electrode 29 formed above the semiconductor layers 24a and 24b, a base pad 29a arranged at a predetermined position, and a top gate line 101 connecting the top gate electrode 29 and the base pad 29a. At this time, the second bottom pad electrode layer 22c connected to the first bottom pad electrode layer 22b via the open portion 28a and the first drain pad electrode layer 27y connected to the base pad 27x via the open portion 28b are formed.

At the seventh step, as shown in FIG. 18B, an insulating film (hereinafter referred to as a protection insulating film) 30 made of silicon nitride having a thickness of, for example, 200 to 800 nm is formed on the entire region on the top gate insulating film 28 including the top gate electrode 29, the base pad 29a, the top gate line 101, the second bottom electrode layer 22c and the first drain electrode layer 27y which are formed at the sixth step. Then, the positions of the protection insulating film 30 on the second bottom pad electrode layer 22c, the first drain pad electrode layer 27y and the base pad 29a are etched to form open portions 30a, 30b and 30c exposing the upper surfaces of the second bottom pad electrode layer 22c, the first drain pad electrode layer 27y and the base pad 29a, respectively Then, the photo sensor array 100B manufactured at the above series of steps is arranged on the pad region Ap as shown in FIG. 15 and is electrically connected to the bottom gate driver 120, the drain pad driver 130 and the top gate driver 110 shown in FIG. 2 via a bumps (external terminals) Bb, Bd and Bt respectively joined to the second bottom pad electrode layer 22c, the first drain pad electrode layer 27y and the base pad 29a exposed at the open portions 30a, 30b and 30c formed in the protection insulating film 30.

Consequently, according to a method for manufacturing such a photo sensor array, the electrode layer of each pad portions arranged on the pad region are laminated and formed with the same material and at the same step as the conductive layer of the double-gate type photo sensor arranged on the array region. Thus, the manufacturing process (particularly, the patterning step using the photolithography or etching technology and) may be decreased (eight times in this manufacturing method) as compared with the case in which the structure of the array region and the pad region is formed at individual steps, thereby making it possible to making an attempt to decrease the manufacturing cost and shrinking the manufacturing time. At the same time, the electrode layer at the pad portion is formed in a thick thickness thereby making it possible to make an attempt of suppressing configuration failure and improving a junction with the peripheral circuit.

Here, there will be explained a relationship between a configuration of a substantial incidence effective region (a carrier generation region) of excited light to the semiconductor layer in the double-gate type photo sensor constituting the above photo sensor array and the light receiving sensitivity of the double-gate photo sensor for each of the structure shown in FIGS. 14 and 15. Then, a comparison and an inspection thereof are made.

Figure 19A:
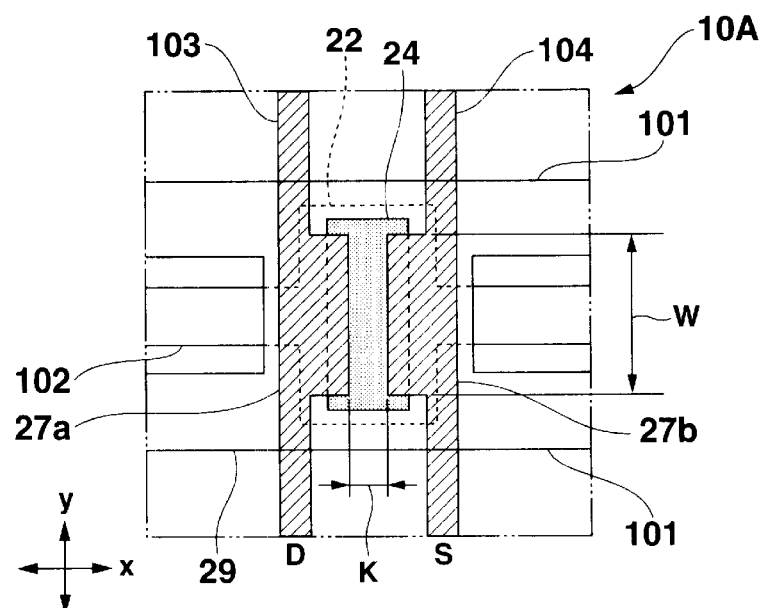
FIG. 19A is a view showing an incidence effective region of the double-gate type photo sensor in which one semiconductor layer which constitutes a photo sensor portion is provided per one device shown in FIG. 14.
Figure 19B:
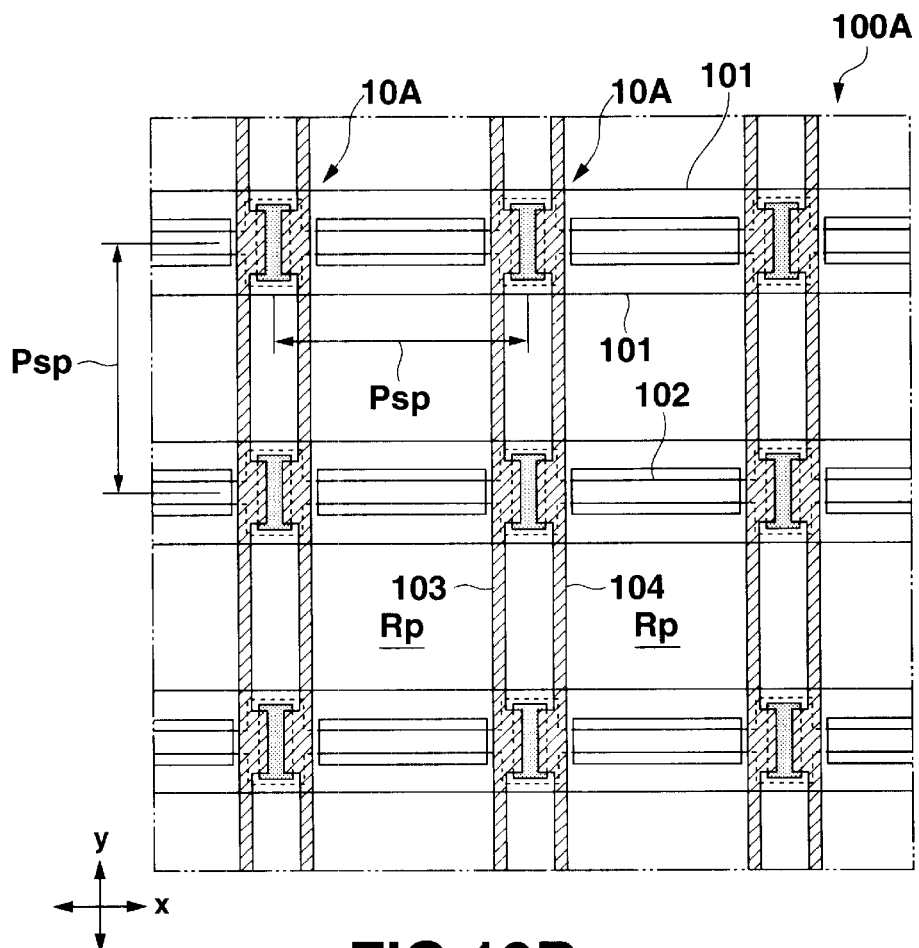
FIG. 19B is a view showing an arrangement structure in the photo sensor array in which photo sensors shown in FIG. 19A are arranged in a matrix-like configuration.
Figure 20:
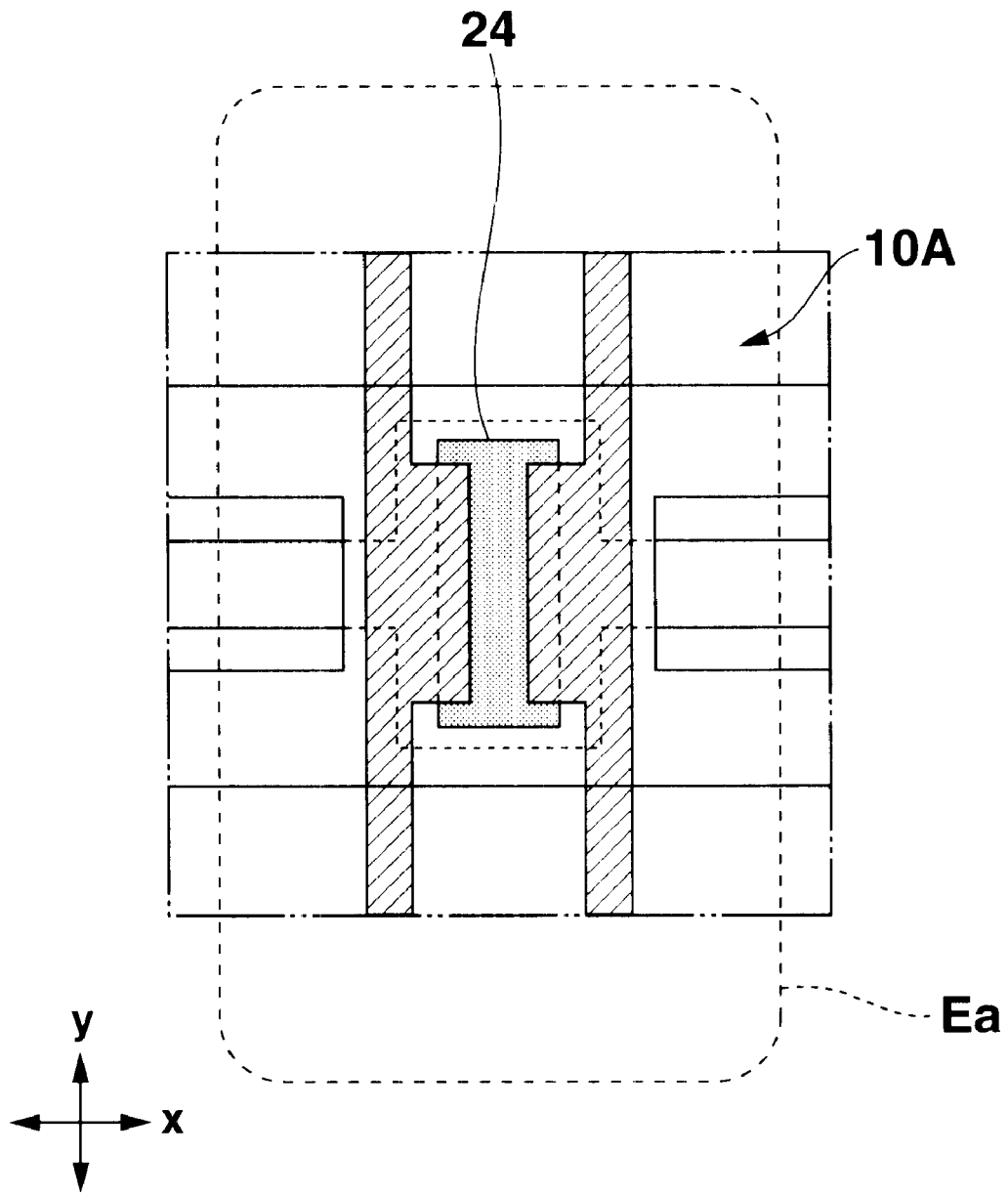
FIG. 20 is a conceptual view showing a spread of the light sensing region in the structure shown in FIG. 19A.
Figure 21A:
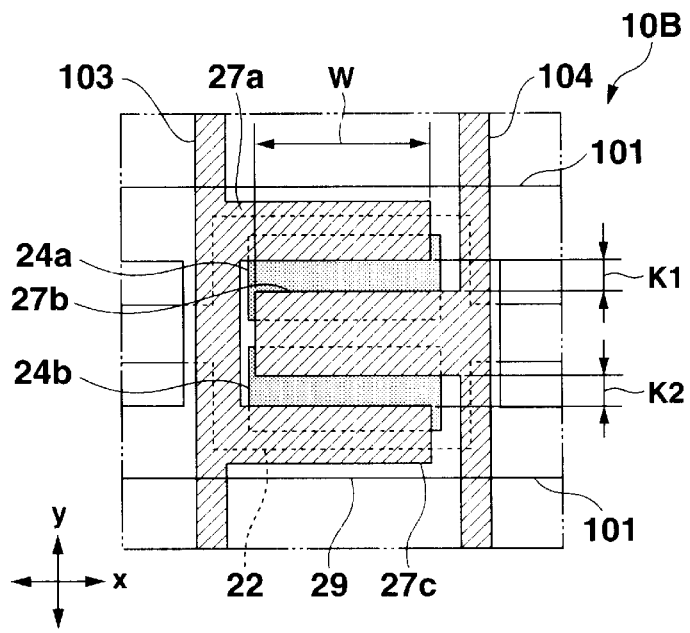
FIG. 21A is a view showing an incidence effective region of a double-gate type photo sensor in which two semiconductor layers which constitute a photo sensor portion are provided per one device shown in FIG. 15.
Figure 21B:
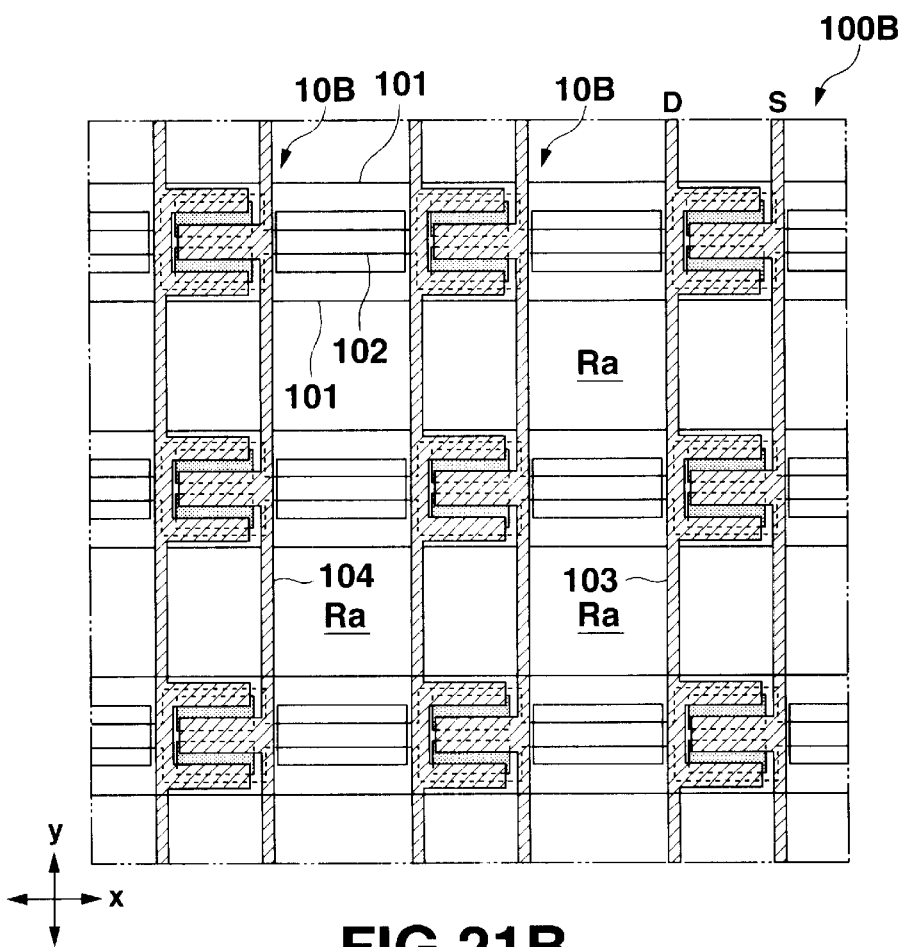
FIG. 21B is a view showing an arrangement structure in the photo sensor array in which photo sensors shown in FIG. 21A are arranged in a matrix-like configuration.
Figure 22:
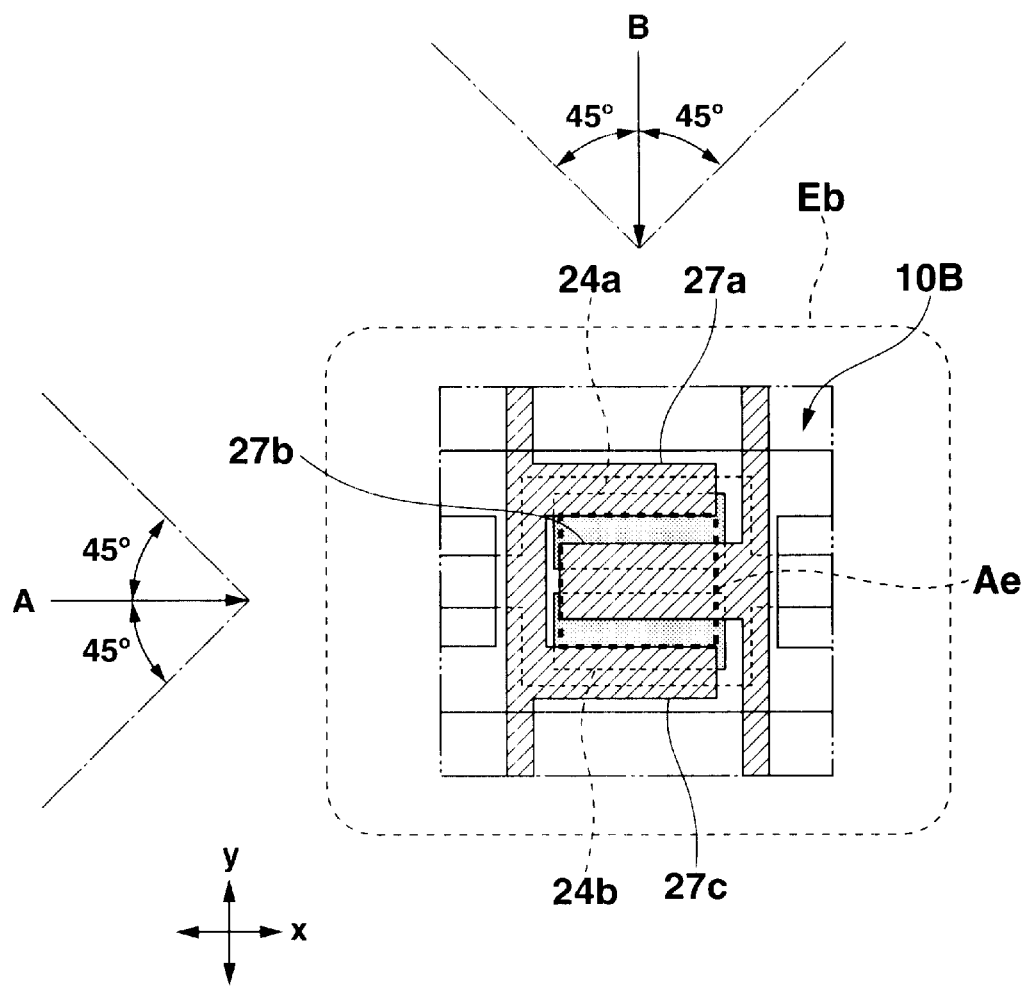
FIG. 22 is a conceptual view showing a spread of the light sensing region in the structure shown in FIG. 21A.

FIG. 19A is a view showing the incidence effective region of one double-gate photo sensor of the double-gate type photo sensor in which one semiconductor layer constituting the photo sensor portion shown in FIG. 14 is provided per one device. FIG. 19B is a view showing an arrangement structure in the photo sensor array. FIG. 20 is a conceptual view showing a variation (distribution characteristics; hereinafter referred to as spread of light detection region) in the light receiving sensitivity in the structure shown in FIG. 19A. Furthermore, FIG. 21A is a view showing the incidence effective region of the double-gate type photo sensor in which two semiconductor layers constituting the photo sensor portion are provided per one device. FIG. 21B is a view showing an arrangement structure in the photo sensor array. FIG. 22 is a schematic view showing a spread of the light sensing region in a structure shown in FIG. 21A. Here, the spread of the light sensing region shown in FIGS. 20 and 22 schematically shows a region where the predetermined light receiving sensitivity can be obtained centering on the semiconductor layer but the spread does not strictly shows a distribution scope of the light sensing sensitivity.

As shown in FIG. 19A, the planar structure of the double-gate type photo sensor 10A applied to the photo sensor array 100A has a structure which comprises:

bottom and top gate lines 101, 102 integrally extending in a direction of x (a horizontal direction in the drawing) with respect to a bottom gate electrode 22 formed below a semiconductor layer 24, and a top gate electrode formed above the semiconductor layer 24.

Furthermore, the photo sensor array has a structure in which a drain line 103 and a source line 104 are integrally extended in a direction of y (a vertical direction in the drawing) with respect to each of the drain electrode 27a and the source electrode 27b formed on both end portions of the semiconductor layer 24 to be mutually opposite to each other.

In the double-gate type photo sensor 10A which has such a planar structure, the drain current Ids which flows in accordance with the light amount has a relationship represented by the following mathematical expression.

$$Ids \propto W/L \qquad (1)$$

Here, as shown in FIGS. 14 and 19A, symbols W and L respectively denote the channel width and the channel length of the semiconductor layer 24. In the relationship represented in the mathematical expression (1), the drain current may be larger to increase a voltage ratio between a bright time and a dark time so that the sensitivity of the double-gate photo sensor 10A may be desirably larger, desirably, W/L is 3.0 or more, and more desirably, the W/L is 7.0 or more to sufficiently judge the brightness and darkness of light from the deviation in the drain voltage which is pre-charged.

On the other hand, in the case where the above double-gate type photo sensor is used to function as a photo sensor for accumulating charges in accordance with the excited light incident from the outside, it has been made clear that the light receiving sensitivity largely depends on the area of the incidence effective region of the excited light incident on the portion of the semiconductor layer 24 exposed between the drain electrode 27a and the source electrode 27b, namely substantially upon the direction of the channel length L of the semiconductor layer and the direction of the channel width W thereof.

Here, since the drain electrode 27a and the source electrode 27b are opaque to the visible light, the incidence effective region of the semiconductor layer 24 where carriers are generated which are effective to the drain current Ids is a region sandwiched between the drain electrode 27a and the source electrode 27b. This region is regulated (defined) with a distance K between the source electrode 27b and the drain electrode 27a in the direction of x and the channel width W in the direction of y.

In this manner, since the sensitivity region of the photo sensor depends upon the channel, and W and the length K in the channel length direction, and the source-drain current value Ids of the transistor depends upon a ratio between the channel width W and the channel length L, it is required to make a design in such a manner that the design value of W/L is set to a value as large as possible. However, when W/L is set to a large value, the planar structure of the double-gate type photo sensor 10A shown in FIGS. 14 and 19A becomes a rectangular configuration in which the length W in the channel width direction (or the size of the semiconductor layer 24 in the longitudinal direction) is inevitably large and the length K in the channel length direction (or the size of the semiconductor layer in the width direction) is small. Thus, the spread in the light sensing area having a high light receiving sensitivity is deviated to the direction of y as compared to the direction of x.

Specifically, since the incidence effective region of the semiconductor layer 24 assumes a rectangular configuration, the spread of the light sensing above the semiconductor layer 24 inevitably becomes a vertically long area Ea (having a configuration approximately similar to the incidence effective region of the semiconductor layer 24) extending in a longitudinal direction of the semiconductor layer 24 (a vertical direction in the drawing; y direction). An area where a desired light sensitivity can be obtained with respect to the horizontal direction (a direction of x) in the drawing has a properties such that the area becomes relatively narrow in the direction of y.

Consequently, bright and dark information (read image) from the subject is read in a distorted state as a result of the deviation in the spread of the light sensing region in the directions of x and y. Thus, there arises a problem in that a high light receiving sensitivity and reading operation of favorable image information having a suppressed distortion cannot be realized at the same time.

Furthermore, the planar structure of the photo sensor array 100A constituted of such double-gate photo sensors 10A is such that, for example, as shown in FIG. 19B, consideration is made so that the double-gate type photo sensors 10A are arranged in a lattice (matrix)-like configuration in an equal interval with a predetermined pitch Psp in two directions (row and column directions) of x and y which run at right angle to each other, and furthermore, light from the surface side of the insulating substrate (glass substrate) 21 can be applied to the subject through a region Rp between devices inside the lattice. In order to apply a sufficient amount of light to the subject, it is required to secure the region Rp between the devices to a level as large as possible.

On the other hand, as shown in FIG. 21A, the planar structure of the double-gate type photo sensor 10B applied to such double-gate type photo sensor array 100A shown in FIG. 15 has a structure in which the bottom gate line 102 and the top gate line 101 extending in the direction of x (horizontal direction in the drawing) are formed integrally with respect to the bottom gate electrode 22 and the top gate electrode 29. Then, a source line 104 is integrally formed which extends in the direction of y (vertical direction in the drawing) with respect to the source electrode 27b formed and extended between the semiconductor layers 24a and 24b arranged in parallel. Furthermore, the photo sensor has a structure such that opposite to the source electrode 27b, a drain line 103 is formed which extends in a direction of y (a vertical direction in the drawing) integrally with respect to the drain electrodes 27a and 27c formed individually on the other ends of the two semiconductor layers 24a and 24b.

In the double-gate type photo sensor 10B having such a planar structure, two semiconductor layers 24a and 24b are continuously arranged in parallel with the channel length direction by allowing the width direction (longitudinal direction) to be located opposite to each other. Thus, the semiconductor layers are regulated with the drain electrodes 27a and 27b and the source electrode 27b. The length in the channel width direction of the incidence effective region in the semiconductor layers 24a and 24b regulated with the drain electrodes 27a and 27b and the source electrode 27b is denoted by W and the lengths of the channel length direction are denoted by K1 and K2 respectively. The longitudinal length (length of the channel width direction) of the incidence effective region of the semiconductor layers 24a and 24b is set to W, and the width size of the incidence effective region is set to the lengths K1 and K2. On the other hand, the light receiving sensitivity of one semiconductor layer 24a assumes an approximately rectangular configuration having a width W and a length K1 while the other semiconductor layer 24b assumes approximately rectangular configuration having a width W and a length K2. As the double-gate type photo sensor 10B, a region denoted with two rectangular configurations becomes the incidence effective region.

In this case, as the configuration (a synthesized configuration of a rectangle region having a vertical length W and a horizontal length K1 and a rectangle region having a vertical length W and a horizontal length K2) of the incidence effective region in each of the semiconductor regions 24a and 24b becomes similar to a square configuration, the variation in the light receiving sensitivity by the incidence angle of the excited light to the semiconductor layers 24a and 24b may be corrected.

That is, the device functions in such a manner that a ratio (W/(K1+K2)) of the length W in the channel width direction and the sum (K1+K2) of the length in the channel length direction comes more and more close to 1, as shown in FIG. 22, the sensitivity of light incident on the semiconductor layers 24a and 24b respectively from angles from the direction of x (an arrow A; in detail, a region having an angle of ±45° respectively centering on the direction of x) becomes equal to the sensitivity of light incident on the semiconductor layers 24a and 24b from the direction of y (an arrow B; in detail, a region having an angle of ±45° respectively centering on the direction of y). Thus, the variation (the directivity) of the light receiving sensitivity may be corrected, and as the spread of the light sensing region having an approximately equal spread (a rectangle which comes close to a square) in the directions of x and y, a region E can be obtained.

Here, in a ratio (W/(K1+K2)) of the length W in the direction of channel width (and the sum of the lengths (K1+K2)), affecting the light receiving sensitivity of the double-gate type photo sensor 10B as the sum of the lengths (K1+K2) can be replaced with the sum total $\Sigma K_i$ of the lengths $K_i$ of the incidence effective regions in the semiconductor layers in accordance with the number of semiconductor layers formed in one device.

The same thing holds true of the structure shown in FIGS. 19A and 19B. In the structure shown in FIG. 21A, it goes without saying that the directivity of incident light can be further leveled. Furthermore, in addition to the conditions, in FIGS. 21A and 22, when a region surrounded by two sides defined at both end portions of incidence effective region of a plurality of semiconductor layers 24a and 24b in the direction of x and two sides defined at both end portions in the direction of y (a boundary between the drain electrode 27a and the incidence effective region of the semiconductor layer 24a, and a boundary between the drain electrode 27c and the incidence effective region of the semiconductor layer 24b) come closer to a square configuration, the configuration becomes more desirable from the viewpoint of the balance of the light receiving sensitivity.

In the double-gate type photo sensor 10B shown in FIGS. 15 and 21A, the drain current Ids in accordance with the light amount generally has the following relationship.

$$Ids \propto W/L1 + W/L2 \quad (2)$$

Here, symbol W denotes a channel width of the semiconductor layers 24a and 24b, symbols L1 and L2 denote the channel length of respective semiconductor layers 24a and 24b. The channel length in the two semiconductor layers 24a and 24b is set so that the relationship of L1=L2=L is established. On the basis of the above mathematical expression (2), since the source-drain current Ids can be theoretically doubled as compared with the photo sensor 10A shown in FIG. 19A, the transistor characteristic can be improved.

Consequently, such double-gate type photo sensors 10B are arranged into a matrix-like configuration as shown in FIG. 21B to constitute a photo sensor array 100B with the result that the spread of the light sensing region can be uniformed thereby making it possible to realizing a photo sensor array provided with a light receiving portion having a high transistor properties and a reading device for reading a two-dimension image while suppressing a distortion at the time of reading the two-dimension image.

Furthermore, in the above double-gate photo sensor 10B, the transistor properties are largely heightened, a reading operation of reading bright and dark information can be favorably conducted even with a small (a little) amount of incident light. Thus, the luminance on the surface light source provided on the reading device can be decreased (suppressed) and the consumed power of the reading device for reading the two-dimension image can be decreased. In the case where the luminance of the surface light source is set to a definite level, a reading device can be provided which enables largely shortening the light accumulation time along with improved transistor properties and which is excellent in the reading performance of reading the two-dimension images.

Furthermore, a surplus light on current is generated with respect to the amount of incident light equal to the case of the double-gate type photo sensor 10A, as a result of a large improvement in the transistor properties. Thus, the operation of the photo sensor can be controlled by minimizing a difference between maximum value and a minimum value of the driving voltage applied to the top gate electrode and the bottom gate electrode for the purpose of suppressing such ON current, so that the deterioration in the double-gate type photo sensor can be suppressed with a decrease in the driving voltage thereby maintaining (prolonging) the reliability and life of the photo sensor array.

In the double-gate type photo sensors 10A and 10B shown in FIGS. 19A and 21A, the top-gate lines 101 each for mutually connecting the top gate electrodes 29 are separated into a plurality of lines (two lines in the embodiment) mutually in a planar manner between the adjacent double-gate photo sensors and are arranged so as to be extended in parallel with a wiring width and a wiring thickness in an equal (symmetric) relationship in the direction of y. That is, the double-gate photo sensor has a structure such that the top-gate line 101 is arranged and formed approximately in a symmetric relationship vertically in a row direction with respect to the bottom gate line 102 extending to approximately connect the central portions of the double-gate type photo sensors.

In this manner, the top gate lines 101 separated formed with the bottom line 102 along the direction of x serving as an axis substantially have a linear structure. Thus, the incidence balance in the direction of y can be uniformed when light attenuated by passing through the top gate line 101 is incident on the semiconductor layers 24: 24a, 24b. Furthermore, since the side of the drain line 103 and the side of the source line 104 substantially have a linear symmetric structure, the incidence balance in the direction of x can be uniformed when light attenuated by passing through the top gate line 101 is incident on the semiconductor layers 24: 24a, 24b.

Consequently, since the top gate lines are separated so that the incidence balance of light becomes equal both in the vertical direction (the direction of y) and in the horizontal direction (the direction of x), the aligning balance of sensed light can be made favorable. Furthermore, virtually no overlapping is present in a vertical direction (the direction of y) between the top gate line 101 and the bottom gate line 102 arranged mutually between the adjacent photo sensors, so that no parasitic capacity is generated between the top gate line 101 and the bottom gate line 102. Accordingly, a signal delay and voltage drop can be suppressed.

<Second Embodiment>

Next, a second embodiment of the photo sensor array according to the present invention will be explained by referring to the drawings.

Figure 23:
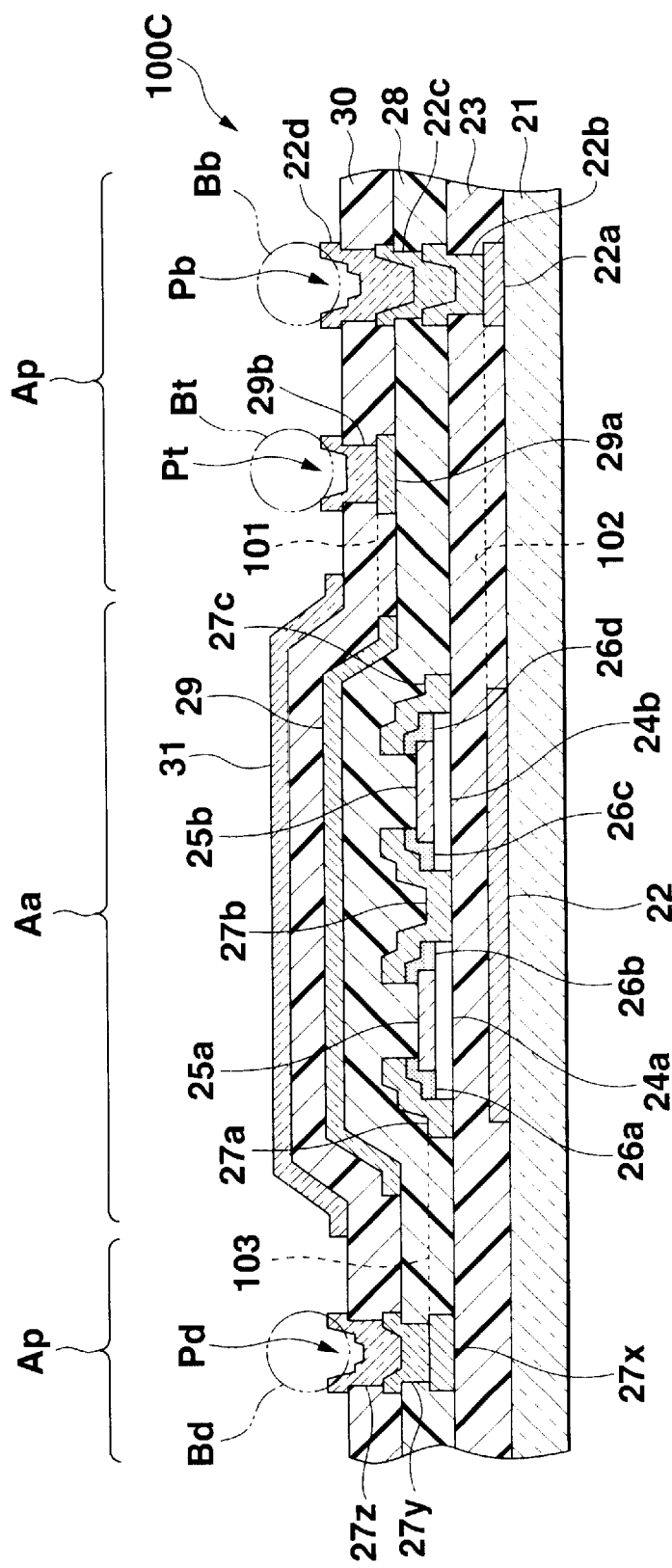
FIG. 23 is a sectional view showing a portion of a photo sensor array according to a second embodiment of the present invention.
Figure 24:
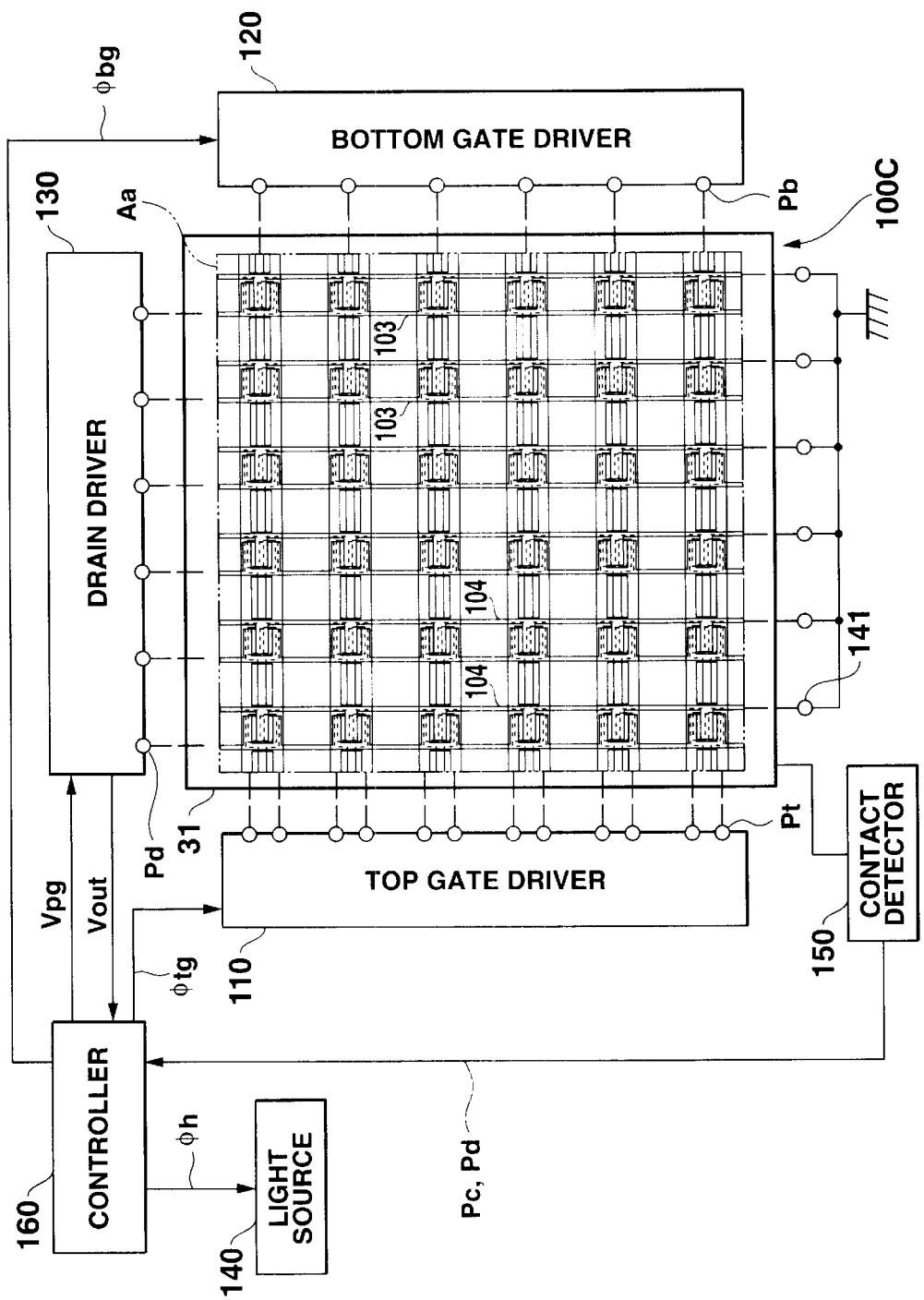
FIG. 24 is a schematic structure view showing one example of a photo sensor system provided with a photo sensor system shown in FIG. 23.

FIG. 23 is a sectional view showing a portion of the photo sensor array according to a second embodiment of the present invention. FIG. 24 is a schematic structure view showing one example of the photo sensor system provided with a photo sensor array shown in FIG. 23. Here, an explanation will be made on the case in which the double-gate type photo sensor same as the structure shown in FIG. 15 is applied. For the sake of illustration, only a single double-gate type photo sensor formed on the array region is shown. The same structure as the above embodiment (FIG. 15) is denoted by the same reference numeral, and the explanation thereof is omitted.

The photo sensor array 100C according to the second embodiment has a structure in which an electrostatic discharging and contact sensing electrode is provided on the protection insulating film 30 formed as the uppermost layer 30 in the structure of the photo sensor array 100B shown in FIG. 15, and the electrode layers constituting the uppermost layer are laminated and formed at the pat section in the same step and with the same material as the electrostatic discharging and contact sensing electrode.

Specifically, as shown in FIG. 23, the photo sensor array 100C according to the second embodiment comprises an electrostatic discharging and contact sensing electrode 31 formed of a light-transmitting conductive film such as an ITO or the like on an array region As of the protection insulating film 30 formed as the uppermost layer in the structure of the photo sensor array 100B shown in FIG. 15, and the photo sensor array has a structure in which electrode layers 22d, 27z and 29b are laminated which are constituted of the same conductive material (for example, ITO) as the electrostatic discharging and contact sensing electrode 31 respectively in the open portions 30a, 30b and 30c formed at the pad region Ap of the protection insulating film 30 (see FIG. 18B).

That is, at the bottom gate pad portion Pb, the third bottom pad electrode layer 22d is laminated and formed so as to be connected to the second bottom pad electrode layer 22c exposed to the inside of the open portion formed in the protection insulating film 30. In the drain pad portion Pd, the second drain pad electrode layer 27z is laminated and formed so as to be connected to the first drain pad electrode layer 27y exposed to the inside of the open portion formed in the protection insulating film 30. In the top gate pad portion Pt, the top pad electrode layer 29b is formed on the base pad 29 exposed to the inside of the open portion formed in the protection insulating film 30, to be electrically connected thereto.

The photo sensor array 100B comprises a second bottom pad electrode layer 22c and the first drain pad electrode layer 27y. However, the photo sensor array 100B may comprise any one of the two layers. Though not shown, the source pad group 141 may be formed in a laminated three layer structure similar to the base pad 27x, the first drain pad electrode 27y and the second drain pad electrode layer 27z at the drain pad portion Pd. Alternately, the source pad group 141 may have a one- or two-layer structure comprising any one or two of the layers similar to the base pad 27x, the first drain pad electrode layer 27y, and the second drain pad electrode layer 27z.

A method for manufacturing the photo sensor array 100C having such a structure is such that after a structure of a photo sensor array 100B shown in FIG. 15 is formed in the manufacturing process shown in FIGS. 16A through 18B in the beginning, the transparent conductive film such as an ITO or the like having a thickness of, for example, 50 nm on the entire region of the protection insulating film 30 as an eighth step by the sputtering method and the wet etching method. Thus, the electrostatic electricity discharging and contact sensing electrode 31 is formed on the array region Aa by selectively etching the transparent conductive layer by the photolithography technology and the ion implanting method. In this step, the third bottom pad electrode layer 22d connected to the second bottom pad electrode layer 22c is also formed via the open portion 30a of the pad region Ap, the second drain pad electrode layer 27x connected to the first drain pad electrode layer 27y is formed via the open portion 30b, and the top pad electrode layer 29b connected to the base pad 29a is connected via the open portion 30c.

The photo sensor array 100C has a three layer structure comprising the third bottom pad layer 22d, the second drain pad electrode 27z, and the top pad electrode layer 29z. However, the photo sensory array 100C may have one or two layers out of them.

Although not shown, the source pad group 141 may be formed in a three-layer structure in the same manner as the base pad 27x, the first drain pad electrode layer 27y, and the second drain pad portions 27z of the drain pad portion Pd, or the source pad group 141 may have a one-layer structure comprising the same layer as the base pad 27x, a two layer structure comprising two-layers same as the base pad 27x and the first drain pad electrode layer 27y or the base pad 27x and the second drain pad electrode layer 27z, or a two-layer structure comprising the same layers as the first drain pad electrode layer 27y and the second drain pad electrode layer 27z.

The photo sensor arrays 100C manufactured at such step are arranged in the pad region Ap as shown in FIG. 23, and are connected to the bottom gate driver 120, the drain driver 130, and the top gate driver 110 by joining the bumps (external terminals) Bb, Bd, and Bt through the third bottom pad electrode layer 22d, the second drain pad electrode 27z and the top pad electrode layer 29b, respectively.

According to a structure of such photo sensor array 100C, and a method for manufacturing the same, the operation and the effect similar to the first embodiment can be obtained. Additionally, since charges electrified on the subject placed on the photo sensor array is discharged with the electrostatic electricity discharging and contact sensing electrode, the electrostatic breakdown and operation failure of the double-gate type photo sensor constituting the photo sensor array can be favorably prevented.

The electrostatic electricity discharging and contact sensing electrode 31 is formed, for example, as shown in FIG. 24, on the entire surface of the array region Aa on which a finger is placed. The electrostatic electricity is forced to be grounded to prevent the breakage of the drivers 110, 120, 130 or the like with the contact of the finger charged with electrostatic electricity while a signal delayed with the parasitic capacity peculiar to the finger is read to be connected to the contact detector 150 for outputting the drive start signal of the photo sensor array.

Figure 25:
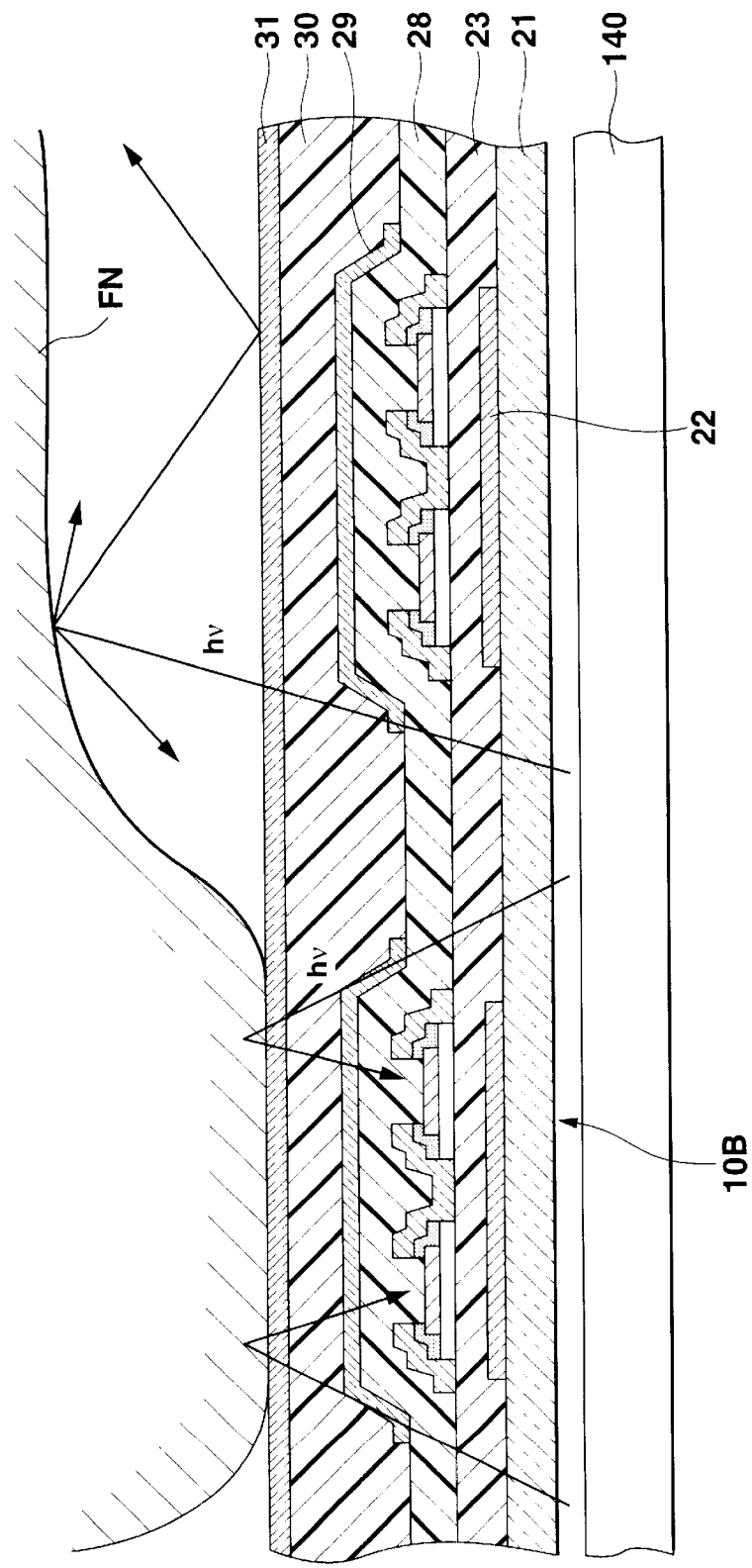
FIG. 25 is a partial sectional view showing whether or not reflection light is incident on the semiconductor layer of the photo sensor.

Here, as shown in FIG. 25, when the finger FN charged with electrostatic electricity comes into contact with the electrostatic electricity discharging and contact sensing electrode 31, for preventing the breakage of the top gate driver 110, the bottom gate driver 120, and the drain driver 130 due to electrostatic electricity, the contact detector 150 passes electrostatic electricity from the subject through the ground and outputs a contact confirmation signal Pd. The controller 160 outputs a signal Oh to a light source 140 for allowing the light source 140 to start the light emission. Then, when the light source 140 emits light to the array region Aa, the controller 160 outputs control signals φtg, φbg and Vpg for controlling the operation of the top gate driver 110, the bottom gate driver 120, and the drain gate driver 130 respectively, receives a voltage Vout deviated in accordance with the amount of light hv incident on the double-gate type photo sensor with a difference between the projection and recession of the finger print of the finger FN, creates finger print image data of the finger and confirms whether or not the created image data agrees with the registered image data.

Figure 26:
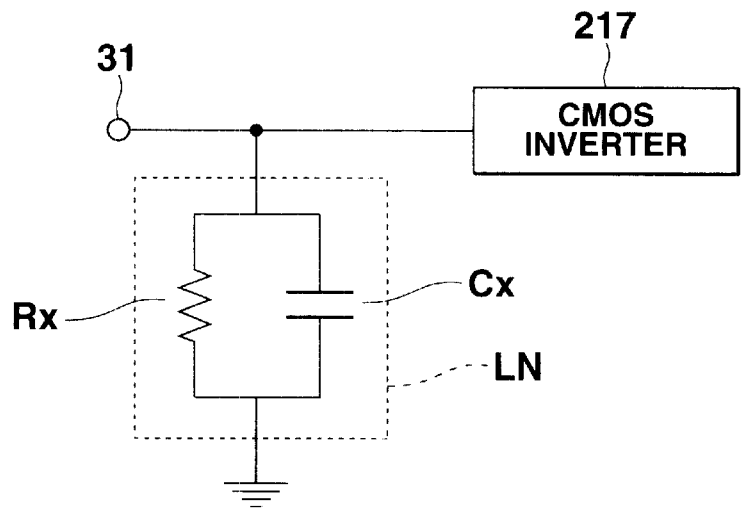
FIG. 26 is a schematic circuit diagram between an electrostatic electricity discharging and contact sensing electrode and a CMOS inverter when the finger is not allowed to come into contact thereon.
Figure 27:
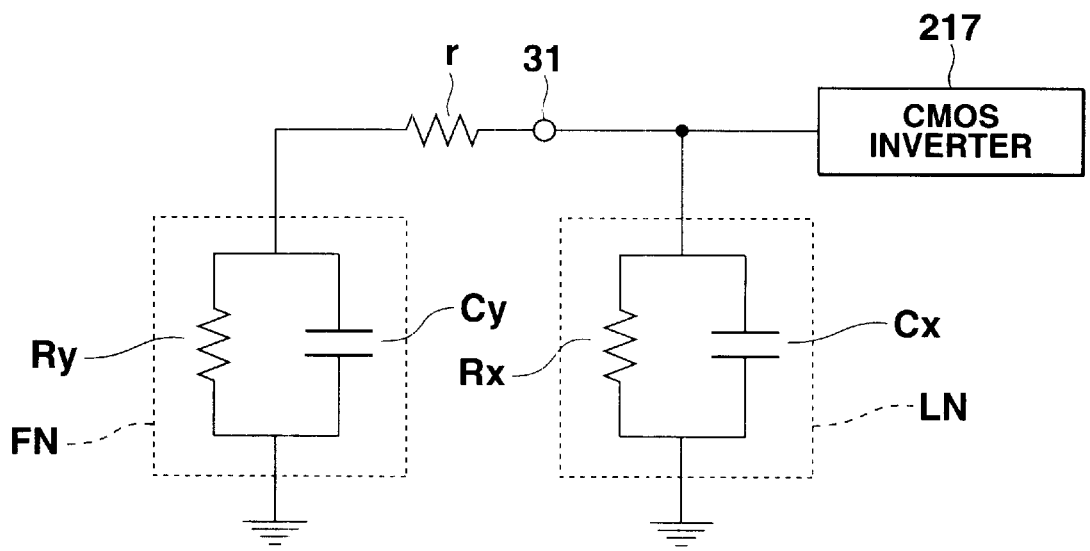
FIG. 27 is a schematic circuit diagram between an electrostatic electricity discharging and contact sensing electrode and a CMOS inverter when the finger is allowed to come into contact thereon.

Hereinafter on operation example of the present invention will be explained. The electrostatic electricity discharging and contact sensing electrode 31 in the state in which the finger FN does not come into contact with the electrostatic electricity and contact sensing electrode 31 is denoted by an equivalent circuit shown in FIG. 26. Here, LN shows a resistor Rx and a floating capacitor Cx in which a wiring capacity between the electrostatic electricity discharging and contact sensing electrode 31 and a P-channel MOS transistor (hereinafter simply abbreviated as P-transistor) 216, a gate capacity of the P-transistor 216, and the capacity of the resistor Rh1 are synthesized. On the other hand, the associated portion in the state in which the finger FN comes into contact with the electrostatic electricity discharging and contact sensing electrode 31 is represented with the equivalent circuit shown in FIG. 27. The finger FN of a person has a capacity Cy and a resistor Ry in a predetermined scope and a resistance r is generated between the finger FN and the electrostatic electricity discharging and contact sensing electrode 31. The resistor Rh1 is constituted in such a manner that the resistor Rh1 is conducted in the case of the voltage of thousands of volts whereas the resistor Rh1 is not conducted in the case of the voltages Vdd which is sufficiently lower than the electrostatic electricity.

Figure 28:
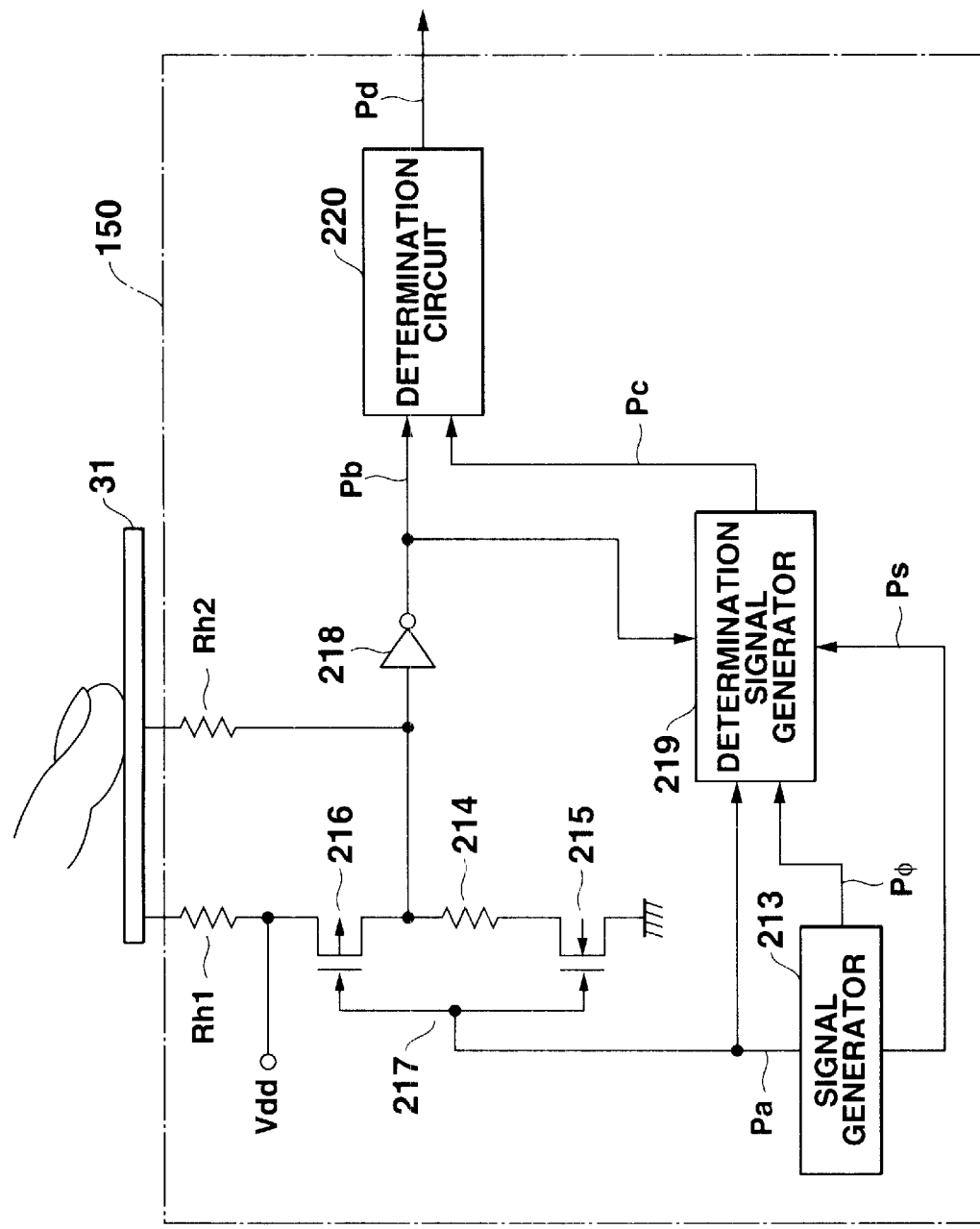
FIG. 28 is a circuit diagram showing a contact detector.

FIG. 28 is a basic structure view showing a photo sensor system to which the present invention is applied. On an upper surface of the array region Aa, the electrostatic electricity discharging and contact sensing electrode 31 is formed, and the electrostatic electricity discharging and contact sensing electrode 31 is connected to the side of the high potential Vdd.

The contact detector 150 comprises a signal generator 213 for generating various of signals, an inverter 217 comprising an N channel MOS transistor (hereinafter, simply abbreviated as an N-transistor) 215, a P-transistor 216, and a lead resistor 214 between the transistors, a CMOS inverter 218, a determination signal generator 219, a judgment circuit 220, a resistor Rh1 and a resistor Rh2.

The signal generator 213 outputs a square wave signal Pa having a predetermined cycle (for example, 32 Hz), and a clock pulse Pφ having a predetermined cycle (for example, 1024 Hz). The square signal Pa is inputted in the gate of each of the N-transistor 215 and the P-transistor 216 to control the switching of each of the transistors 215 and 216. The source of the P-transistor 216, and the electrostatic electricity and contact sensing electrode 31 are connected to the side of the high potential Vdd. Then the output of the CMOS inverter 217 is connected to the electrostatic electricity discharging and contact sensing electrode 31 via the resistor Rh2. The side of the source of the N-transistor 21 is grounded. The resistor Rh2 has a structure such that the resistor Rh2 is conducted in the case of thousands of volts such as the electrostatic electricity in the same manner as Rh1 while the electricity is not conducted in the case of the voltage Vdd which is sufficiently lower than the electrostatic electricity.

Consequently, the electrostatic electricity of the finger FN passes via any of the transistors 215 and 216, through the ground. However, the power source voltage Vdd is not applied to the CMOS inverter 218 via the electrostatic electricity discharging and contact sensing electrode 31.

An output signal of the CMOS inverter 217 is reversed as a result of the input of the signal to the other CMOS inverter 218. The output signal Pb of the inverter 218 is sent to the determination signal generator 219 in which the square signal 8a and clock signal Pd are inputted from the signal generator. A detailed structure of the determination signal generator 219 will be described later. The determination signal generator 219 is constituted in such a manner that a determination signal for judging the presence of a touch whether the finger touches the sensing electrode 31 is output at a predetermined timing. The determination signal Pc is sent to the determination circuit 220 to which an output signal of the inverter 218 is input as a determined signal Pb. When the determination signal Pc is input, the determination circuit 220 detects at which binary logical level the determined signal Pb is present to judge the presence of the contact of fingers thereby outputting a contact confirmation signal Pd when it is judged that the contact of the finger is present. This contact confirmation signal Pd is sent to a controller 160 (FIG. 24). Then, when the contact confirmation signal Pd is on a high potential level, the controller 160 outputs control signals φh, φtg, φbg and Vpg for driving the photo sensor arrays.

Figure 29:
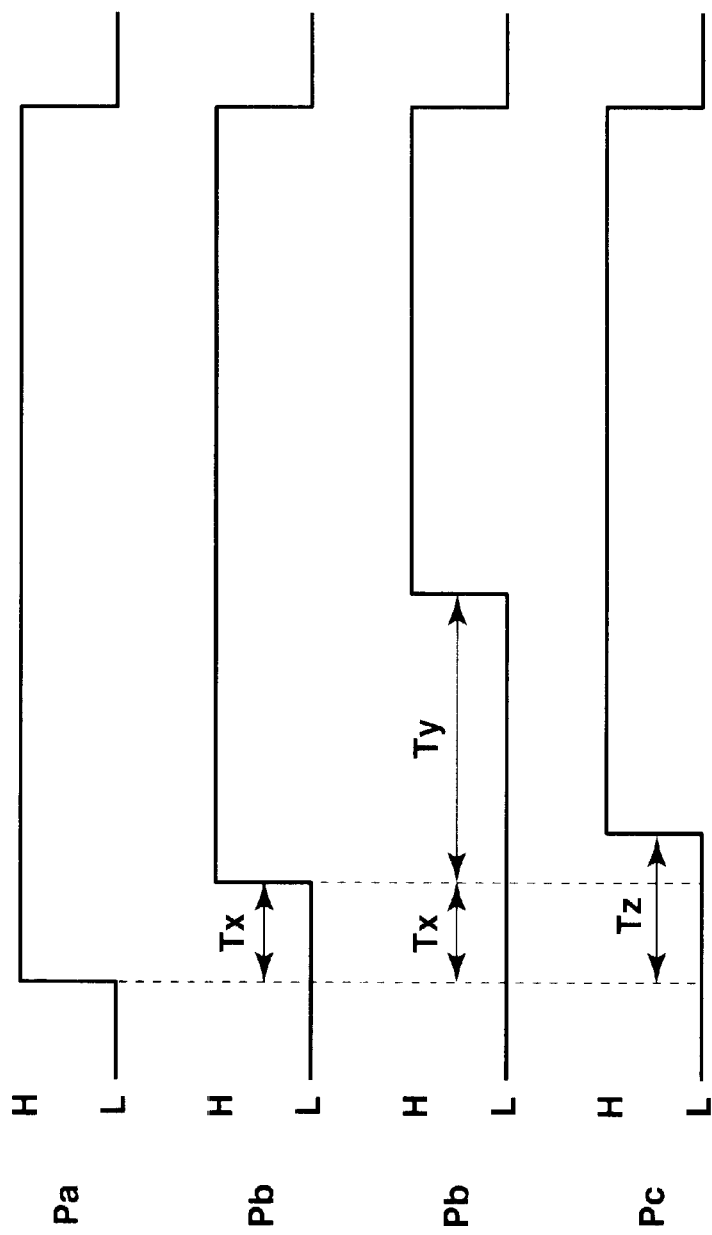
FIG. 29A is an output waveform view of a signal Pa.
FIG. 29B is an output waveform view of a signal Pb when the finger is not allowed to come into contact with the electrostatic electricity discharging and contact sensing electrode.
FIG. 29C is an output waveform view of a signal Pb when the finger is allowed to come into contact with the electrostatic electricity discharging and contact sensing electrode.
FIG. 29D is an output waveform view of a signal Pc.

Here, there will be explained a sensing operation of the photo sensor system by the contact of the signal FN. In the beginning, when a square wave signal Pa is output on a high level from the signal generator 213 as shown in FIG. 29A in the state in which the finger does not come into contact with the electrostatic electricity discharging and sensing electrode 31, an output of the CMOS inverter 217 is given as an output of a reverse signal of the square wave signal Pa. Since the reverse signal is affected by the floating capacity Cx between the electrostatic electricity discharging and contact sensing electrode 31 and the P transistor 216, a reverse signal completely opposite to the square wave signal Pa cannot be obtained. Thus, the timing of the threshold of the inverter 218 is delayed, the output signal Pb of the inverter 218 is output to the square wave signal Pa with a delay by time Tx with respect to the floating capacity component Cx as shown in FIG. 29B under the influence of the floating capacity component Cx.

Instead, the contact capacity component Cy of the human body is formed in the state in which the finger FN comes into contact with the electrostatic electricity discharging and contact sensing electrode 31. Since this contact capacity component Cy is connected in parallel to the floating capacity component Cx, the output signal of the inverter 218 is output to the square wave signal Pa with a delay by time (Tx+Ty) with respect to the synthesized capacity of the floating capacity component Cx and the contact capacity Cy as shown in FIG. 29C.

Consequently, the delay time Tx corresponding to the floating capacity component Cx is stored in advance. Then, as shown in FIG. 29D, when the determination signal generator 219 is constituted in such a manner that the determination signal Pc is output at a time when a little time has passed from the time Tx, it is possible to judge the presence or absence of the contact of the human body according to on whether or not the determined signal Pb is on a high potential level or a low potential level when the determination signal Pc has risen in the determination circuit 220.

Figure 30:
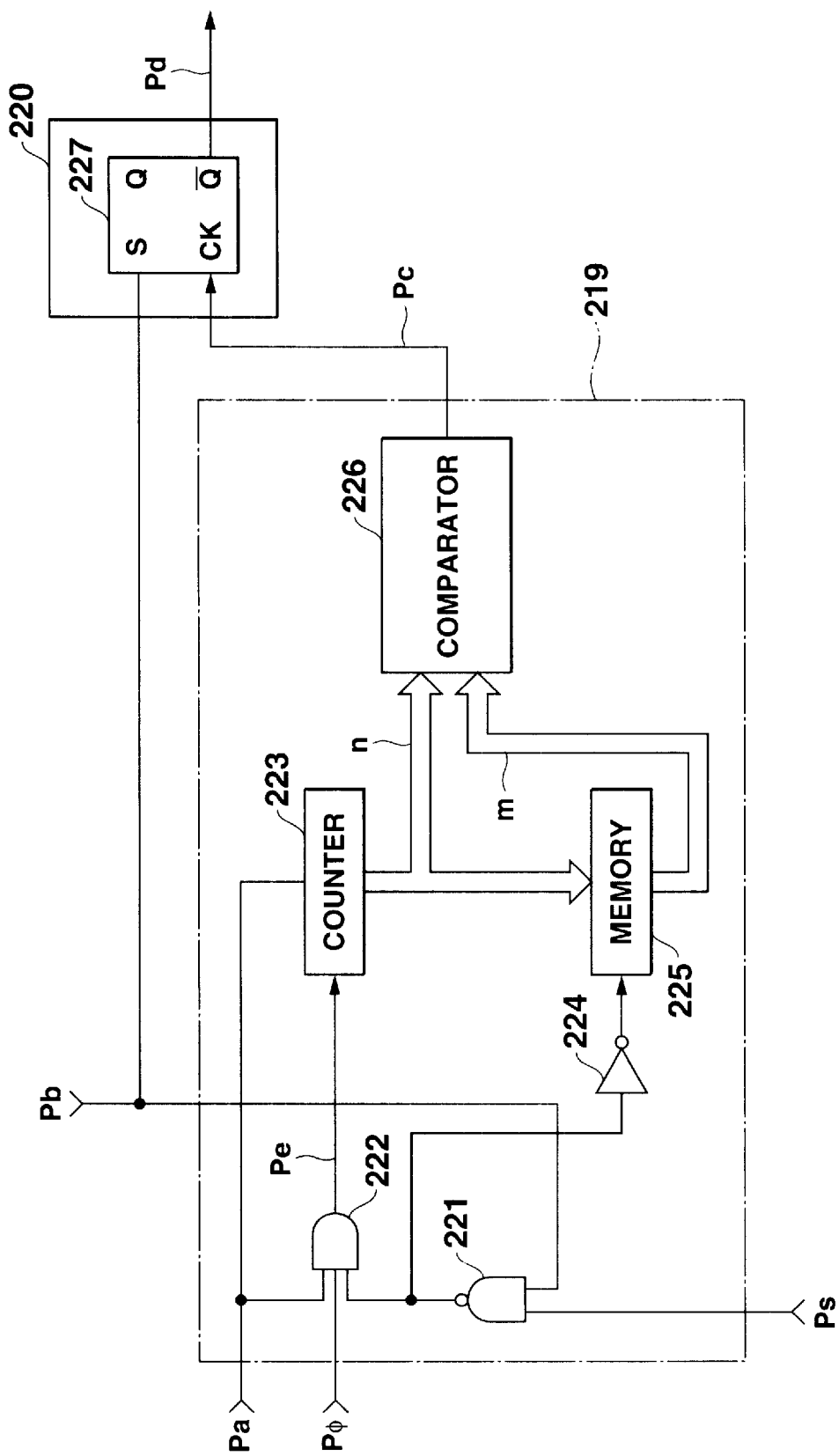
FIG. 30 is a circuit diagram showing a determination signal generator and a judgment circuit.

For such reasons, the determination signal generator 219 and the determination circuit 220 are constituted as shown in FIG. 30. That is, in the determination signal generator 219, the input terminal S is a test terminal for storing the floating capacity Cx. A signal of "1" is input when a clear key constituted of a press button type switch is operated which is provided on, for example, on the photo sensor system. The signal Ps from the input terminal S is sent to the NAND gate 221. The determined signal Pb is also input to the NAND gate 221. When the signal from the input terminals is on a low potential level, an output signal with a high potential level is obtained from the NAND gate 221 to be input to the AND gate 222. The AND gate 222 relieves the regulation when the output signal from the NAND gate 221 and the square signal Pa are on a high potential level, and outputs the clock signal P to be input to the counter 223.

The counter 223 is reset on a high level of the square signal Pa to conduct an operation of counting an output signal Pe (a clock signal Pφ) of the AND gate 222. Furthermore, an output signal of the NAND gate 221 is input as a writing instruction signal to the clock input terminal of the memory 225 via the inverter 224. Consequently, an output signal from the NAND gate 221 is obtained, the contents of the counter 223 are written into the memory 225. Then, at the time of the normal usage, the contents n of the counter 223 which are sequentially counted up with the clock signal Pφ and the contents m which have been already preset in the memory 225 are sent to the comparator 226 so that the size of the contents is compared. The comparator 226 detects whether or not the contents of the counter 223 and the memory 225 become n>m every time the contents n of the counter 223 are counted up. Then, the comparator 226 is constituted in such a manner that when the comparator detects that the relationship of n>m is established, the determination signal Pc is output.

The determination circuit 220 is constituted with a flip-flop 227. The determined signal Pb is input to the set input terminals of the flip-flop 227. Furthermore, the determination signal Pc is input to the clock input terminal. Then, an operation signal Pd of the touch key 31 is fetched from the output terminal on the $\overline{Q}$ side of the flip-flop 227.

Figure 31:
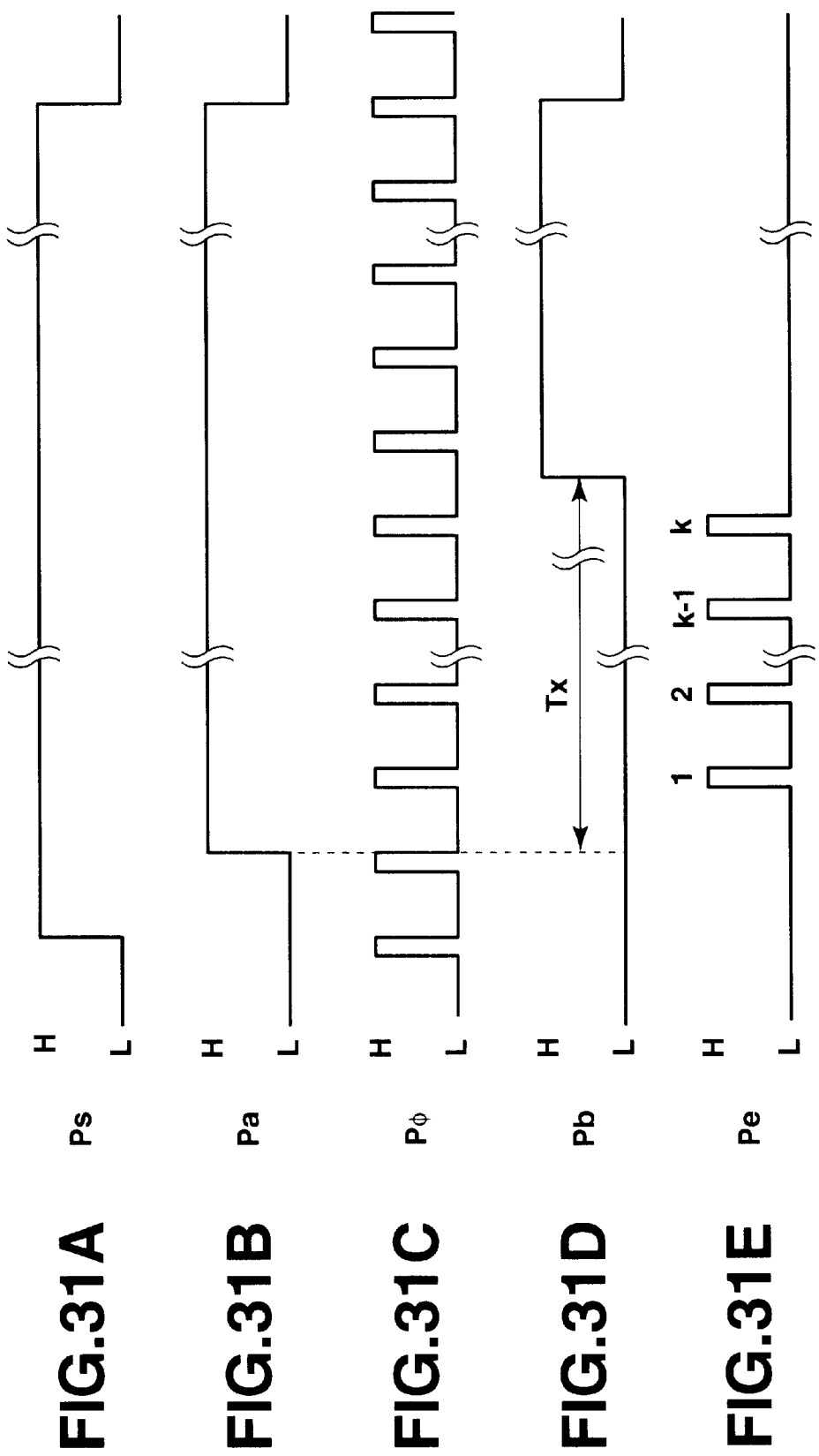
FIG. 31A is an output waveform view of a signal Ps.
FIG. 31B is an output waveform view of a signal Pa.
FIG. 31C is an output waveform view of a clock signal Pb.
FIG. 31D is an output waveform view of a signal Pb when the finger is not allowed to come into contact with the electrostatic electricity discharging and contact sensing electrode.
FIG. 31E is an output waveform view of a signal Pe which is output to a counter.

Next, a specific operation will be explained. In the beginning, at the time of usage, the clear key is operated to determine the delay time Tx due to the floating capacity Cx shown in FIG. 29B. That is, as shown in FIG. 31A, a high potential level signal Ps is given to the NAND gate 221 of the determination signal generator 219 via the input terminal S when the clear key is operated. With this high potential level, the output signal of the NAND gate 221 becomes a high potential level until the determined signal Pb is risen. When the square wave signal Pa becomes a high level as shown in FIG. 31B, at the same time, the counter 223 is reset, then the counter 223 is reset while the number of the high levels of the clock signal shown in FIG. 31C begins to be counted. When the determined signal Ps has risen with a time delay of Tx as shown in FIG. 31D after the square wave signal Pa is turned into a high level, an output signal of the NAND gate 221 becomes a low potential level. Thus, the counting operation of the counter 223 is suspended while the output signal of the inverter 224 becomes a high potential level. As a consequence, the contents of the counter 223 are written into the memory 225 at the time of the rise of the determined signal Pb. That is, as shown in FIG. 31E, the counter 223 counts the number of high levels of the output signal Pe of the AND gate 222. Therefore, the contents of the counter 223 up to the rise of the determined signal becomes "K". Then, this value "K" is written into the memory 225.

Incidentally, the contents "K" written into the memory 225 are a value corresponding to the delay time Tx of the determined signal Pb with respect to the square wave signal Pa affected by the floating capacity component Cx. However, since the delay time Tx is a value specific to the photo sensor system, these measurements are not required when the data is input in advance.

Figure 32:
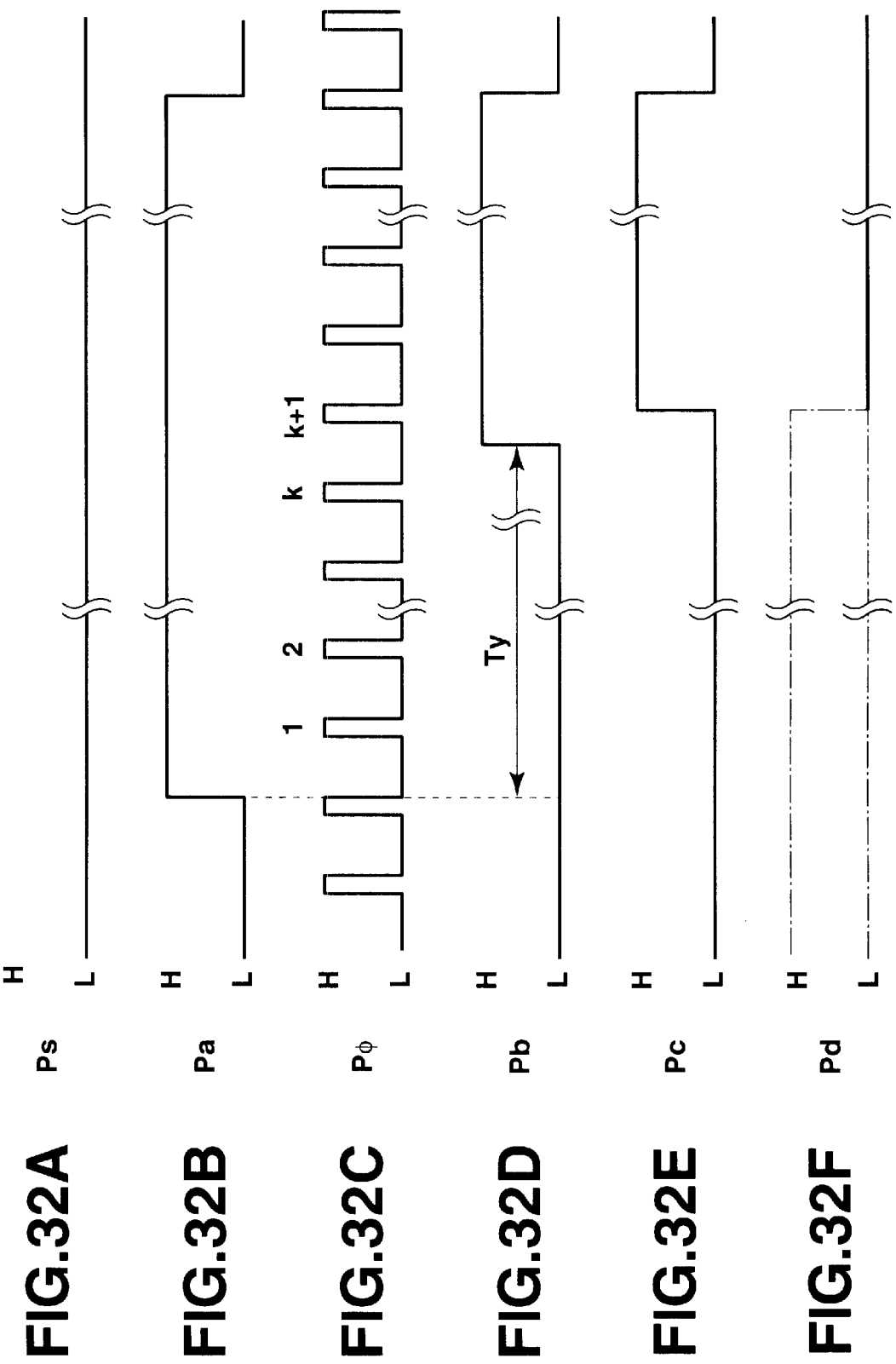
FIG. 32A is an output waveform view of the signal Ps.
FIG. 32B is an output waveform view of a signal Pa.
FIG. 32C is an output waveform view of the clock signal.
FIG. 32D is an output waveform view of the signal Pb when the finger is not allowed to come into contact with the electrostatic discharging and contact sensing electrode.
FIG. 32E is an output waveform view of a signal Pc.
FIG. 32F is an output waveform view of a signal Pd.

Next, a detection operation of the finger contact will be explained. FIGS. 32A to 32F are output waveform views of each kind of signal in the case where the human body does not come into contact with the electrostatic electricity discharging and contact sensing electrode 31. Here, as shown in FIG. 32A, the signal Ps is set to a low potential level, there is shown that the clear key is not operated. Then, in the state in which the human body does not come into contact with the electrostatic electricity discharging and contact sensing electrode 31, the delay time Tx of the determined signal Pb with respect to the square signal Pa corresponds to the floating capacity component Cx. In this state, in the comparator 226, when the contents of the counter 223 exceed the contents of the memory 225, namely, the (K+1)th clock signal Pφ is counted to the counter 223 so that the contents of the counter 223 become "K+1" with respect to the contents "K" of the memory 225, the determination signal Pc is output as shown in FIG. 32E.

At the time of the rise of the determination signal Pc, as shown in FIG. 32D, since the determined signal Pb has already become a high level, a determined signal with a high potential level is input to the set input terminal S of the flip-flop 227 so that the flip-flop 227 is set. As a consequence, the contact confirmation signal Pd from the Q side output terminal of the flip-flop 227 becomes a low level with certitude even when the potential thereof is on a high level or a low level. Then, when the controller 160 receives the contact confirmation signal Pd output with a lapse of a certain period when the high level determination signal Pc is input. Then, the drive signal is not supplied to the drivers 110, 120 and 130 and the light source 140 when the contact confirmation signal Pd is defected to be on a low level.

Figure 33:
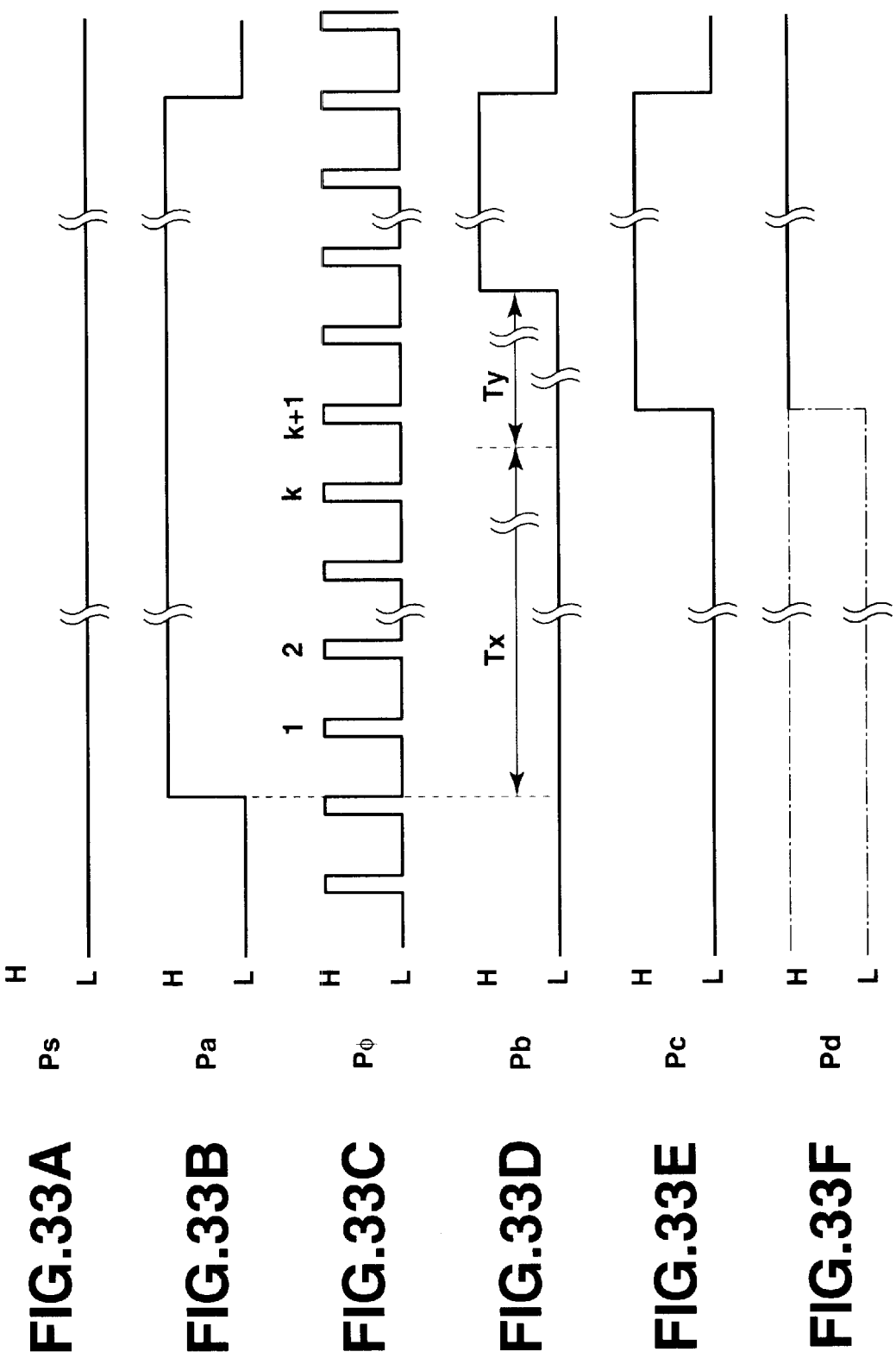
FIG. 33A is an output waveform view of the signal Ps.
FIG. 33B is an output waveform view of the signal Pa.
FIG. 33C is an output waveform view of the clock signal.
FIG. 33D is an output waveform view of the signal Pb when the finger is allowed to come into contact with the electrostatic electricity discharging and contact sensing electrode.
FIG. 33E is an output waveform view of the signal Pc.
FIG. 33F is an output waveform view of the signal Pd.

FIGS. 33A to 33F are output waveform views in the case where the case the human body comes into contact with the electrostatic electricity discharging and contact sensing electrode 31. When the finger or the like comes into contact with the electrostatic electricity discharging and contact sensing electrode 31, the contact capacity component Cy by the human body is added. Thus, the delay time of the determined signal Pb with respect to the square wave signal Pa corresponds to the synthesized capacity of the floating capacity component Cx and the contact capacity component Cy and the like to become time (Tx+Ty). Then, as described before, when the contents of the counter 223 become "K+1" with respect to the contents "K" of the memory 225, the determination signal Pc is output from the comparator 226 as shown in FIG. 33E. At the time of the rise of the determination signal Pc, as shown in FIG. 33D, the determined signal Pb is not on a high level but on a low level. As a consequence, the flip-flop 227 is a reset state so that the contact confirmation signal Pd with a high potential level is fetched from the Q side output terminal with certitude as shown in FIG. 33F. Then, the controller 160 receives the contact confirmation signal Pd output with the lapse of a certain period when the high level determination signal Pc is input. When it is detected that the contact confirmation signal Pd is on a high level, the drive signals are supplied to the drivers 110, 120 and 130 and the light source 140 so that the driving of the photo sensor array is started for the verification of the finger prints.

In this manner, the delay time of the determined signal Pb with respect to the square wave signal generated by the influence caused by the floating capacity component, namely the delay time at the non-contact time is stored in advance by the switch operation of the clear key with respect to the electrostatic electricity discharging and contact sensing electrode. Then it is determined whether or not the determined signal Pb is delayed than the delay amount to detect the contact of a finger. Consequently, even in the case where the floating capacity component is changed, the floating capacity component at that time is stored with only the operation of the clear key immediately before the contact input. Since, in the subsequent contact input the capacity component Cy of the human body is added to the stored floating capacity component, the switch detecting operation can be conducted with certitude without being affected by the floating capacity component Cx.

<Third Embodiment>

Next, a photo sensor array according to the third embodiment of the present invention will be explained by referring to the drawings.

Figure 34:
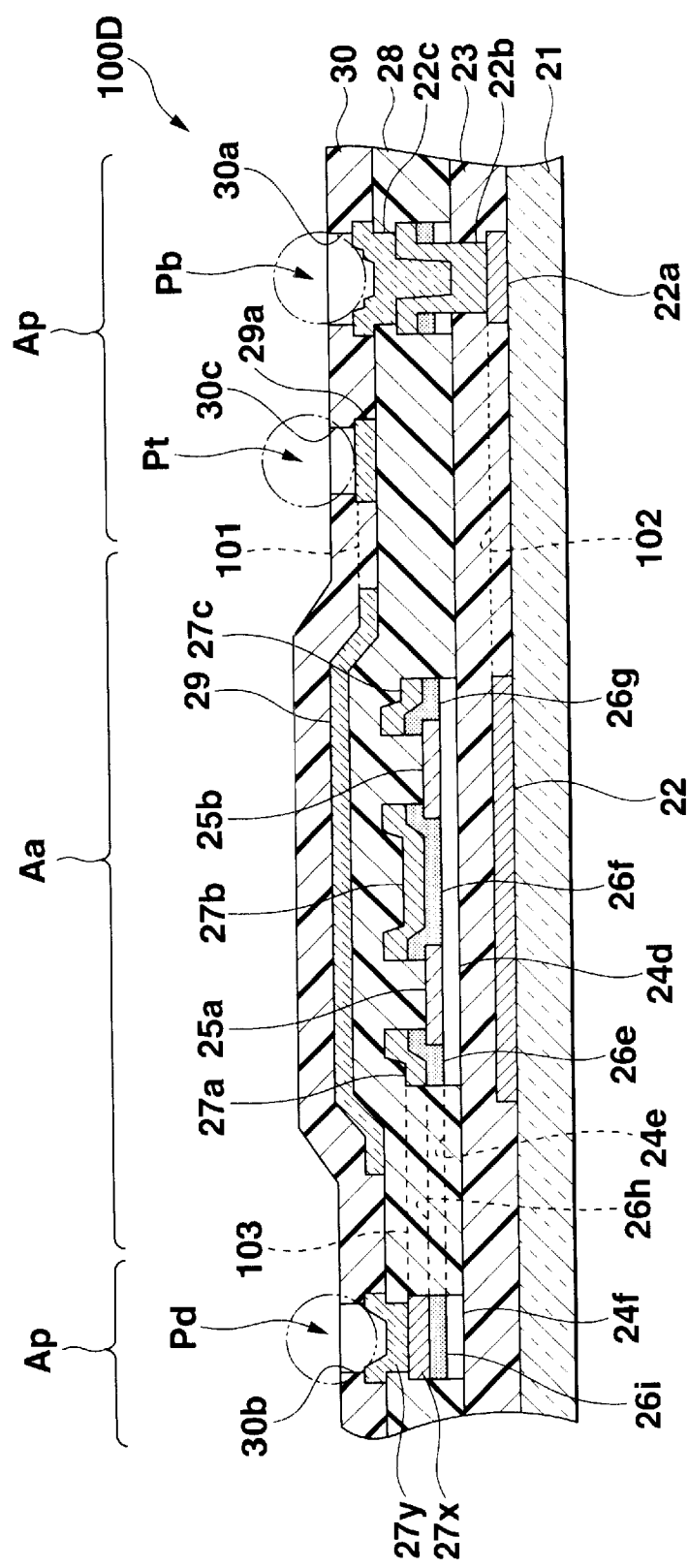
FIG. 34 is a sectional view showing a portion of a photo sensor array according to a third embodiment of the present invention.

FIG. 34 is a sectional view showing a part of the photo sensor array according to the third embodiment of the present invention. Here, there will be explained a case in which the double-gate type photo sensor provided with two semiconductor layers which constitute photo sensor portions per one device is applied in the same manner as the structure shown in FIG. 15. Incidentally, for the sake of illustration, there is shown only a single double-gate type photo sensor formed on the array region. Furthermore, the same structure as the above embodiment (FIG. 15) is denoted by the same reference numerals, and the explanation thereof will be omitted.

As shown in FIG. 34, the photo sensor array 100D in the structure example comprises an array region Aa and a pad region Ap. In the array region Aa, a plurality of photo sensors (only one is designated for the sake of convenience in FIG. 34) are arranged in a matrix-like configuration on the insulating substrate 21, the sensors comprising: a semiconductor layer 24d formed of a single amorphous silicon or the like for generating electron-hole pairs when visible light is incident thereon; block insulating films 25a and 25b provided on two regions which constitute a channel region of the semiconductor layer 24a; a single impurity doped layer 26f provided over the block insulating films 25a and 25b; impurity doped layers 26e and 26g which are opposite to the impurity doped layer 26f by sandwiching each of the block insulating films 25a and 25b (channel region), respectively provided at the end portions of each of the block insulating films 25a and 25b and connected at a portion not shown; a single source electrode 27b which extends on the impurity doped layer 26f provided between the block insulating films 25a and 25b and is formed over the block insulating films 25a and 25b; drain electrodes 27a and 27c which are opposite to the source electrode 27b by sandwiching each of the block insulating films 25a and 25b (channel region) formed on the impurity doped layers 26e and 26g, and electrically connected to a portion not shown;
 a single top gate electrode 29 formed via a common top gate insulating film 28 above the block insulating film 25a and 25b (channel region); and a single bottom gate electrode 22 formed via a common bottom gate insulating film 23 below the block insulating film 25a and 25b (channel region).

In the pad region Ap, a bottom game pad portion Pb formed at the end portion of the bottom gate line 102 extending from the bottom gate electrode 22, a drain pad portion Pd formed on the end portion of the drain line 103 extending from the drain electrode 27a, and a top gate pad portion Pt formed on the end portion of the top gate line 101 extending from the top gate electrode 29a are arranged at predetermined pitches, respectively. Here, on the lower layer of the drain line 103 and the drain pad portion Pd, the semiconductor layer 24e formed so as to extend and the impurity doped layer 26h which have the same configuration are while the semiconductor layer 24f and the impurity doped layer 26i are provided even in the vicinity of the bottom pad portion Pb.

Thus, the double-gate type photo sensor applied to the photo sensor array 100D according to the third embodiment has a structure in which there a connected and arranged in parallel on the insulating substrate 21 first and second double-gate type photo sensors. The first double-gate type photo sensor comprises a first upper MOS transistor formed with the semiconductor layer 24d, the drain electrode 27a, the source electrode 27b, the top gate insulating film 28 and the top gate electrode 29; and a first lower MOS transistor formed of the semiconductor layer 24d, the drain electrode 27a, the source electrode 27b, the bottom gate insulating film 23, and the bottom gate electrode 22, the semiconductor layer 24d between the drain electrode 27a and the source electrode 27b serving as a common channel region. The second double-gate type photo sensor comprises a second upper MOS transistor formed of the semiconductor layer 24d, the source electrode 27b, the drain electrode 27c, the top gate insulating film 28 and the top gate electrode 29; and a second lower MOS transistor formed of the semiconductor layer 24, the source electrode 27b, the drain electrode 27c, the bottom gate insulating film 23 and the bottom gate electrode 22; the semiconductor layer 24d between the source electrode 27b and the drain electrode 27c serving as a common channel region.

In the photo sensor array 100D having such a structure, since the lamination structure of the pad portion (particularly, the drain pad portion) can be formed in a thicker configuration than the above embodiment (shown in FIG. 15), the configuration failure can be further suppressed and a junction with the driver side bump can be further improved. Further, the semiconductor layers 24d and 24f and the impurity doped layers 26e and 26i are extended to form layers under the drain line 103, the drain pad portion Pd, the semiconductor layer 24d and the impurity doped layer 26e. Thus, the step generated in the top gate insulating film 28 and the top gate electrode 29 provided on the upper layer can be alleviated and the deterioration in the insulation properties and the signal transmission properties can be suppressed.

Although the photo sensor array 100D is provided with both the second bottom pad electrode layer 22c and the first drain pad electrode layer 27y, the photo sensor array 100D may be provided with any one of the two layers. Then, though not shown, a group of source pads 141 may have a two-layer structure in the same manner as the base pad 27x of the drain pad portion Pd and the first drain electrode layer 27y. Alternatively, the group of source pads 141 may have one layer structure composing of the same layer as the base pad 27x.

Next, there will be explained in detail a method for manufacturing the photo sensor array having the above structure.

FIGS. 35 to 37 are sectional views showing each of the steps in a method for manufacturing a photo sensor array having the above structure. In the foregoing explanation, the designation of "the first step" to "the sixth step" are each used only for the convenience of the explanation and the designation is not associated with the actual manufacturing process. Furthermore, an explanation on the structure and the manufacturing process which are the same as the above embodiments will be simplified.

At the first step, as shown in FIG. 35A, after a metal layer formed of chromium or the like is formed to a thickness of, for example, 100 nm (1000 Å) on the insulating substrate 21 such as a glass substrate or the like, this metal layer is selectively etched to form a bottom gate electrode 22 having a predetermined configuration, a base pad 22a, and a bottom gate line 102.

Next, on the entire region of the insulating substrate 21, for example, a bottom gate insulating film 23 made of silicon nitride or the like having a thickness of 250 nm, an a-Si film 24p having a thickness of 50 nm, and an SiN film having a thickness of 100 nm are formed.

Next, block insulating films 25a and 25b which have a predetermined configuration are formed by selectively etching the SiN film above a region constituting an a-Si film 24p. Furthermore, on the entire region above the a-Si film 24p including the block insulating films 25a and 25b, for example, n-type silicon films 26p having a thickness of 25 nm is deposited which are formed amorphous silicon containing the n-type impurity ion such as, for example, phosphorus ion (P$^+$) or the like. The n-type silicon film 26p can be also obtained by introducing the n-type impurity ion into the amorphous silicon film by the ion implanting method or the thermal expansion method after a genuine amorphous silicon film is formed.

Next, by etching the bottom gate insulating film 23 on the base pad 22a, the a-Si film 24p and the n-type silicon film 26p, an open portion 23a is formed wherein the base pad 22a is exposed.

Next, at the second step, as shown in FIG. 35B, a metal layer 27p made of, for example, chromium or the like having a thickness of 50 nm is formed on the entire region of the impurity doped layer 26p. Here, the metal layer 27p is formed to be connected to the base pad 22a via the open portion 23a formed on the bottom gate insulating film 23, the a-Si film 24p and the n-type silicon film 26p.

Figure 36A:
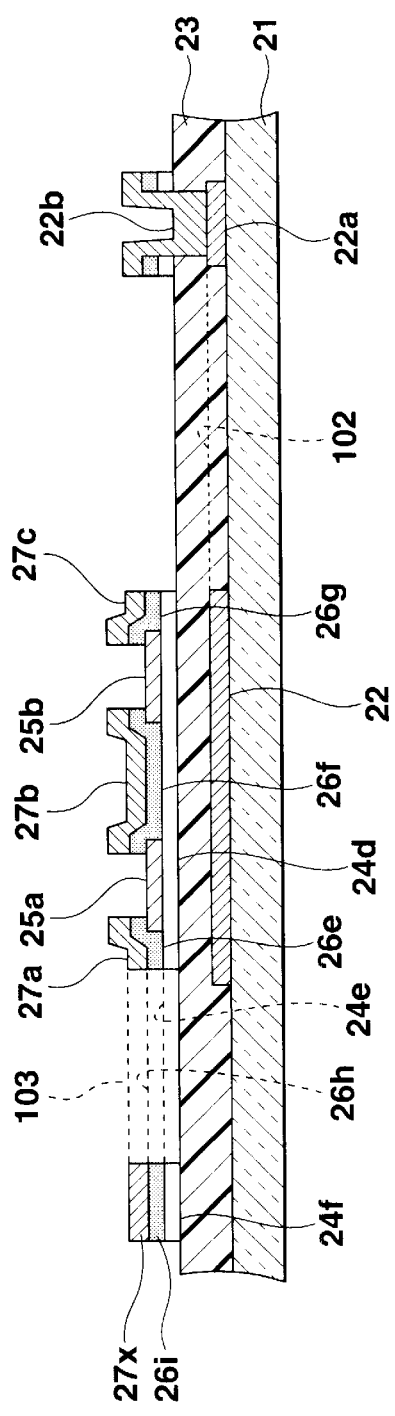
FIGS. 36A and 36B are sectional views for explaining the third step and the fourth step in the method for manufacturing the photo sensor array having the structure shown in FIG. 34.

Next, as the third step, as shown in FIG. 36A, the metal layer 27p, the a-Si film 24p and the n-type silicon film 26p formed at the second step are selectively etched so that a single source electrode 27b extending over the block insulating films 25a and 25b (channel region), drain electrodes 27a and 27b which extend opposite to the source electrode 27b by sandwiching the block insulating films 25a and 25b (channel region) to be connected each other by the wiring layer not shown, the base pad 27x arranged at a predetermined position, and the drain line 103 connecting the drain electrode 27a and the base pad 27x are formed. Further the first bottom pad electrode layer 22b having a predetermined configuration are formed on the open portion 23a and in the vicinity thereof.

At this time, at the same time with the formation of the conductive layers such as drain electrodes 27a and 27c, and the source electrode 27b or the like, the impurity doped layers 26e, 26f and 26g and the semiconductor layer 24d are patterned to have the same configuration in the lower layer of the conductive layer. The semiconductor layer 24d is formed above the bottom gate electrode 22 including a region where the drain electrodes 27a and 27c and the source electrode 27b are formed and a region constituting the channel region. On the lower layer of the drain line 103, the impurity doped layer 26h having the same configuration with the drain line 103 and the semiconductor layer 24e are formed. The impurity doped layer 26i having the same configuration with the base pad 27x and the semiconductor layer 24f are formed below the base pad 27x.

Figure 36B:
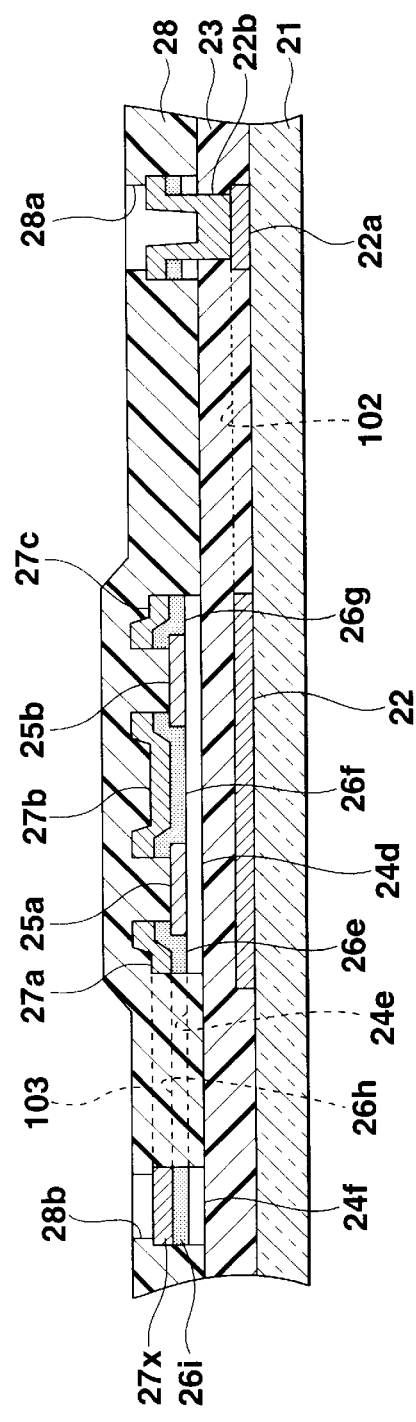

Next, at the fourth step, as shown in FIG. 36B, after a top gate insulating film 28 made of silicon nitride or the like having a thickness of, for example 150 nm on the entire region over the drain electrodes 27a and 27c, the source electrode 27b, the base pad 27x, the drain line 103, and the bottom gate insulating film 23 including the first bottom pad electrode 22b, the open portions 28a and 28b are formed wherein the first bottom pad electrode layer 22b and the base pad 27x are exposed, by etching the top gate insulating film 28 on the first bottom pad electrode layer 22b and the base pad 27x.

Figures 37A, 37B:
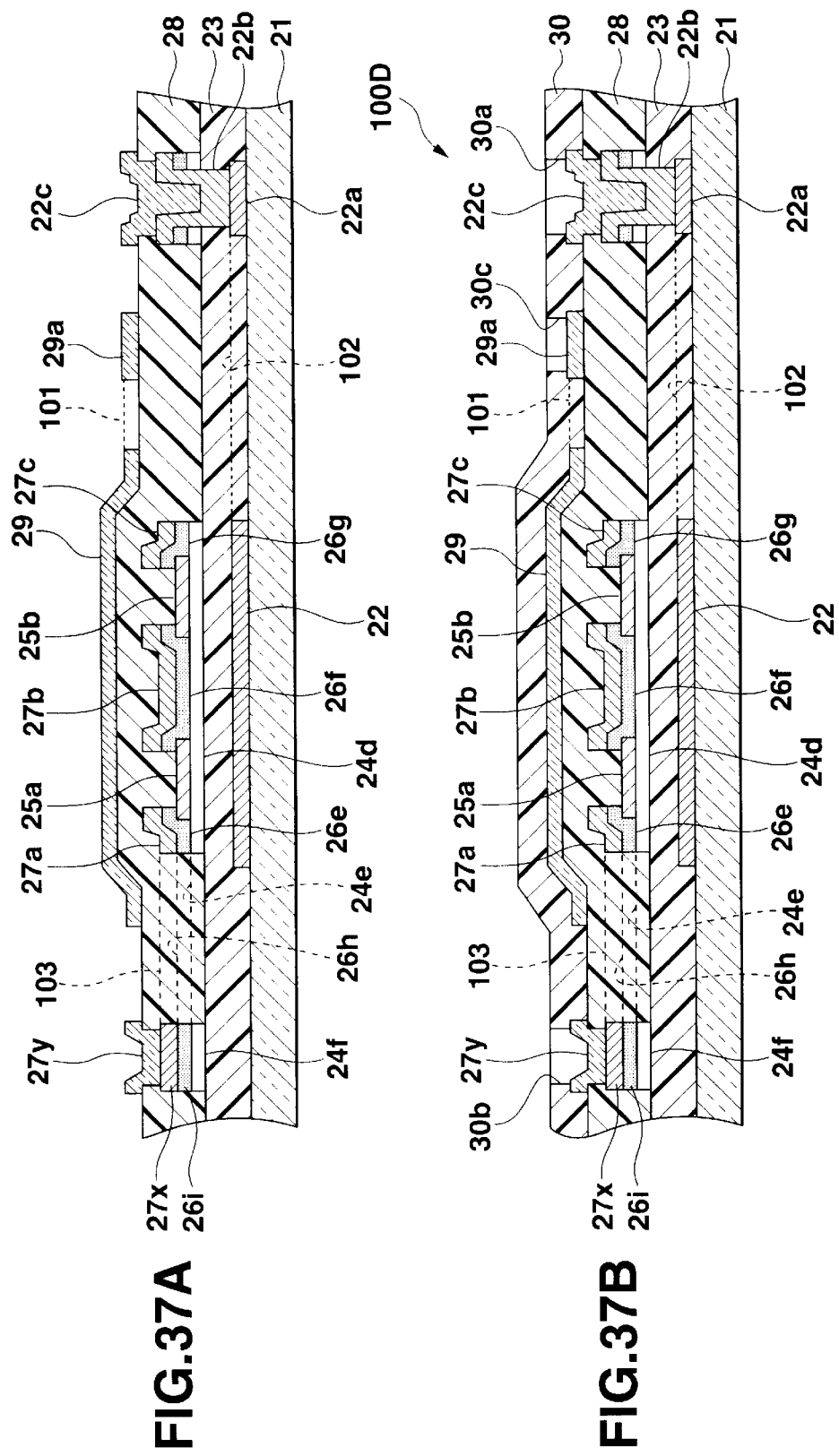
FIGS. 37A and 37B are sectional views for explaining the fifth step and the sixth step in the method for manufacturing the photo sensor array having the structure shown in FIG. 34.

Next, at the fifth step, as show in FIG. 37A, after a transparent electrode layer such as an ITO or the like having a thickness of, for example, 50 nm is formed on the entire region over the top gate insulating film 28, a single top gate electrode 29 extending and formed above the semiconductor layer 24, a base pad 29a arranged at a predetermined position, and a top gate line 101 connecting the top gate electrode 29 and the base pad 29a are formed. At this time, the second bottom pad electrode layer 22c connected to the first bottom pad electrode layer 22b via the open portion 28a and the first drain pad electrode layer 27y connected to the base pad 27x via the open portion 28b are simultaneously formed.

Next, at the sixth step, as shown in FIG. 37B, for example, a protection insulating film 30 made of silicon nitride or the like having a thickness of, for example, 200 to 400 nm is formed on the entire region of the top gate electrode 29, the base pad 29a, the top gate line 101, the second bottom pad electrode layer 22c and the top gate insulating film 28 including the first drain pad electrode layer 27y. Then, by etching the protection insulating film 30 above the second bottom pad electrode layer 22c, the first drain pad electrode layer 27y and the base pad 29a, open portions 30a, 30b and 30c are formed wherein the second bottom pad electrode layer 22c, the first drain pad electrode layer 27y and the base pad 29a are exposed respectively.

Then, the photo sensor array 100D manufactured as the above series of process, as shown in FIG. 34, the second bottom pad electrode layer 22c, the first drain pad electrode layer 27y and the base pad 29a are joined to the bumps (external terminals) Bb, Bd and Bt of the bottom gate driver, the drain driver, and the drain driver via the open portions 30a, 30b and 30c formed on the protection insulating film 30.

Consequently, according to such a method for manufacturing a photo sensor, each constitution of the array region and the pad region can be manufactured by applying the same material and the same step. In addition, the manufacturing processes (particularly, patterning steps using the photolithography technology and the etching technology) are further reduced (seven times in this manufacturing process) so that the manufacturing cost can be decreased and the manufacturing time can be shortened. Furthermore, the electrode layer (particularly, drain pad portion) in the pad portion can be formed in thick thickness, so that an attempt can be made to suppress the configuration failure and improve junction of the peripheral circuit with the bumps. Besides, since the semiconductor layer and the impurity doped layer are extended to the drain line and the lower layer of the drain pad portion, the step generated in the insulating layer provide on the upper layer and the conductive layer can be alleviated so that the deterioration in the insulating properties and transmission properties can be suppressed.

<Fourth Embodiment>

Next, a photo sensor array according to the fourth embodiment of the present invention will be explained by referring to the drawings.

Figure 38:
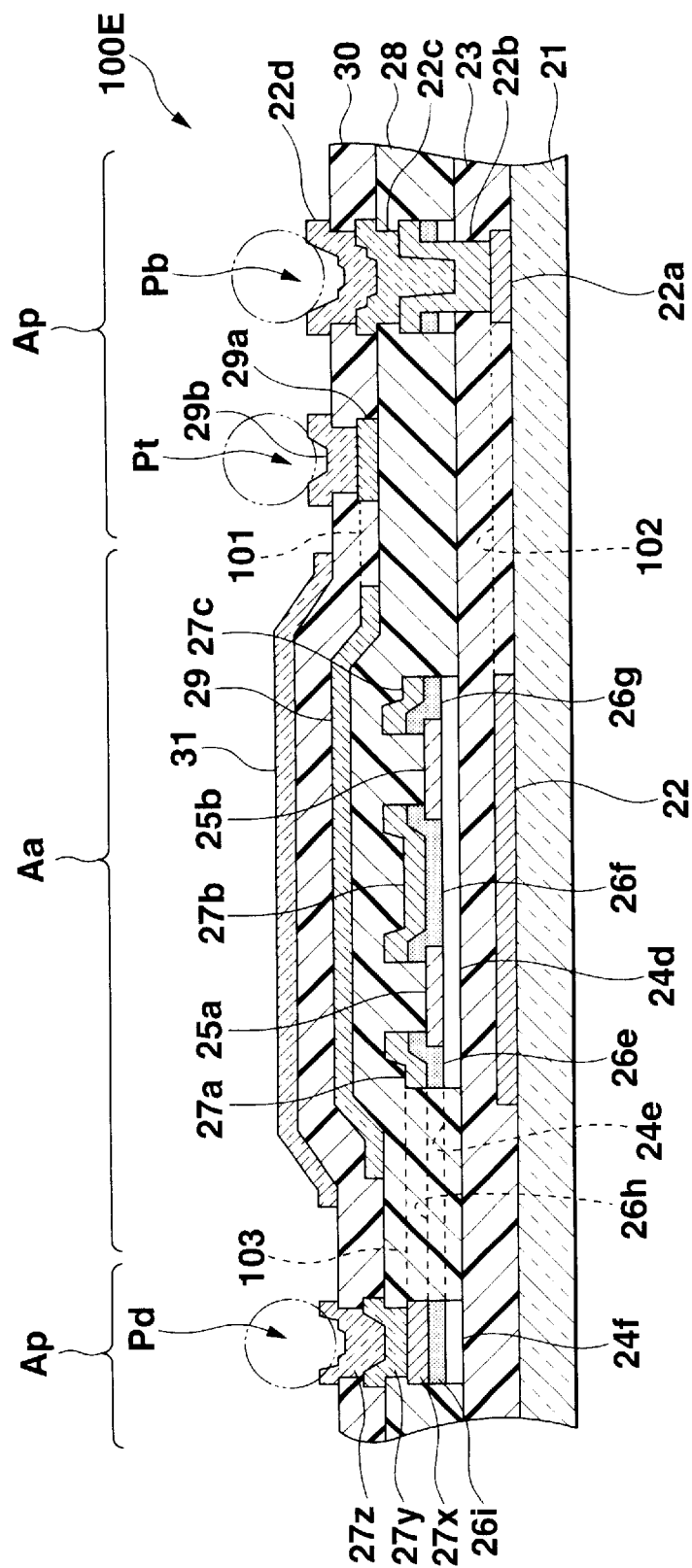
FIG. 38 is a sectional view showing a portion of the photo sensor array according to a fourth embodiment of the present invention.

FIG. 38 is a sectional view showing a part of the photo sensor array according to the fourth embodiment of the present invention. Here, there will be explained the case in which the double-gate type photo sensor having the same structure as the structure shown in FIG. 34 is applied. For the sake of convenience, there is shown only a single double-gate type photo sensor formed on the array region. The structure same as the above embodiments (FIG. 23, FIG. 34) is denoted by the same reference numerals, and an explanation thereof will be simplified.

In the structure of the photo sensor array 100D shown in FIG. 34, the photo sensor array 100E according to the fourth embodiment has a structure such that on the array region Aa of the protection insulating film 30 formed on the uppermost layer, an electrostatic electricity discharging and contact sensing electrode 31 made of a conductive film such as an ITO having a light transmitting properties and having a predetermined potential applied thereto; and electrode layers (the third bottom pad electrode layer 22d, the second drain pad electrode layer 27z, and the top pad electrode layer 29b) made of the same conductive material (for example, ITO) as the electrostatic electricity discharging and contact sensing electrode 31 so as to be connected to the second bottom pad electrode layer 22c, the first drain pad electrode layer 27y and the base pad 29a via the open portions 30a, 30b and 30c (see FIG. 37B) formed on the pad region Ap of the protection insulating film 30 are laminated.

A method for manufacturing the photo sensor array having such a structure is such that after a structure of the photo sensor array shown in FIG. 34 is formed by the manufacturing process shown in FIGS. 35 to 37 in the beginning, a transparent conductive film such as an ITO or the like having a thickness of, for example, 50 nm is formed on the entire region of the protection insulating film 30 as the seventh step; the electrostatic electricity and contact sensing electrode 31 is then formed on the array region Aa by selectively etching the transparent conductive layer; the third bottom pad electrode layer 22d connected to the second bottom pad electrode layer 22c via the open portion 30a of the pad region Ap, the second drain pad electrode layer 27z connected to the first drain pad electrode layer 27y via the open portion 30b and a top pad electrode layer 29b connected to the base pad 29a via the open portion 30c are formed.

This photo sensor array 100E is provided with the third bottom pad electrode layer 22d, the second drain pad electrode layer 27z, and the top pad electrode layer 29b. However, the photo sensor array may have only one or two kinds of the layers. Though not shown, the group of source pads 141 may have a three-layer structure in the same manner as the base pad 27x of the drain pad portion Pd, the first drain pad electrode layer 27y, and the second drain pad electrode layer 27z. Alternatively, the group of source pads 141 may have a one-layer structure formed of the same layer as the base pad 27x, or a two-layer structure formed of the same layers as the base pad 27x and the first drain pad electrode layer 27y, or a two-layer structure formed of the same layers as the base pad 27x and the second drain pad electrode layer 27z, or a two-layer structure formed of the same layers as the first drain pad electrode layer 27y and the second drain pad electrode layer 27z.

The photo sensor array 100E manufactured in such steps is connected to the bottom gate driver 120, the drain driver 130 and the top gate driver 110 by joining the bumps Bb, Bd and Bt to each of the third bottom pad electrode layer 22d, the second drain pad electrode layer 27z and the top pad electrode layer 29b which are arranged in the pad region Ap, as shown in FIG. 38.

According to the structure of such photo sensor array 100E and a method for manufacturing the same, the same effect and operation as the above embodiment (FIG. 34) can be obtained. Additionally, since a charge electrified on the subject placed on the photo sensor array is discharged with the electrostatic electricity discharging and contact sensing electrode, the electrostatic breakdown and operation failure of the double-gate type photo sensor constituting the photo sensor array can be prevented in a favorable manner.

In the fourth embodiment, there has been explained a structure in which a singe electrostatic electricity discharging and contact sensing electrode is formed on the protection insulating film of the array region. As shown in the above embodiment (FIG. 24), the photo sensor array may be constituted in such a manner that the electrostatic electricity discharging and contact sensing electrode divided into plurality is formed to discharge the charge on the subject while the operation of each driver is controlled on the basis of the voltage change due to the short circuit between the electrostatic electricity discharging and contact sensing electrodes.

Next, an explanation is made on other structure example of the photo sensor array applied to the present invention by referring to the drawings.

Figure 39:
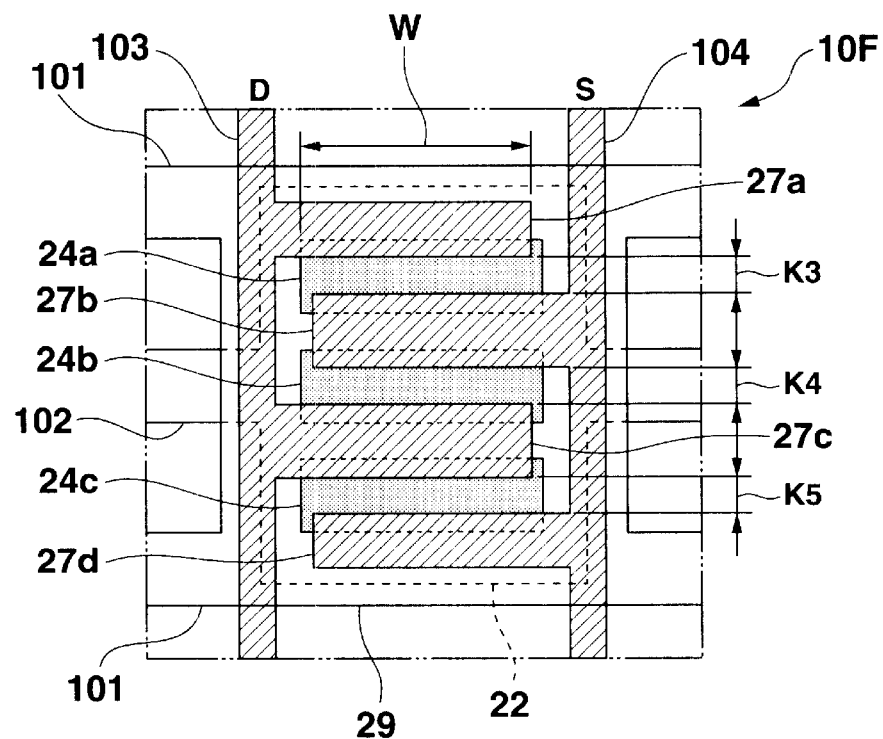
FIG. 39 is a schematic structure view of a double-gate type photo sensor in which three semiconductor layers are provided which constitute a photo sensor portion per one device.
Figure 41:
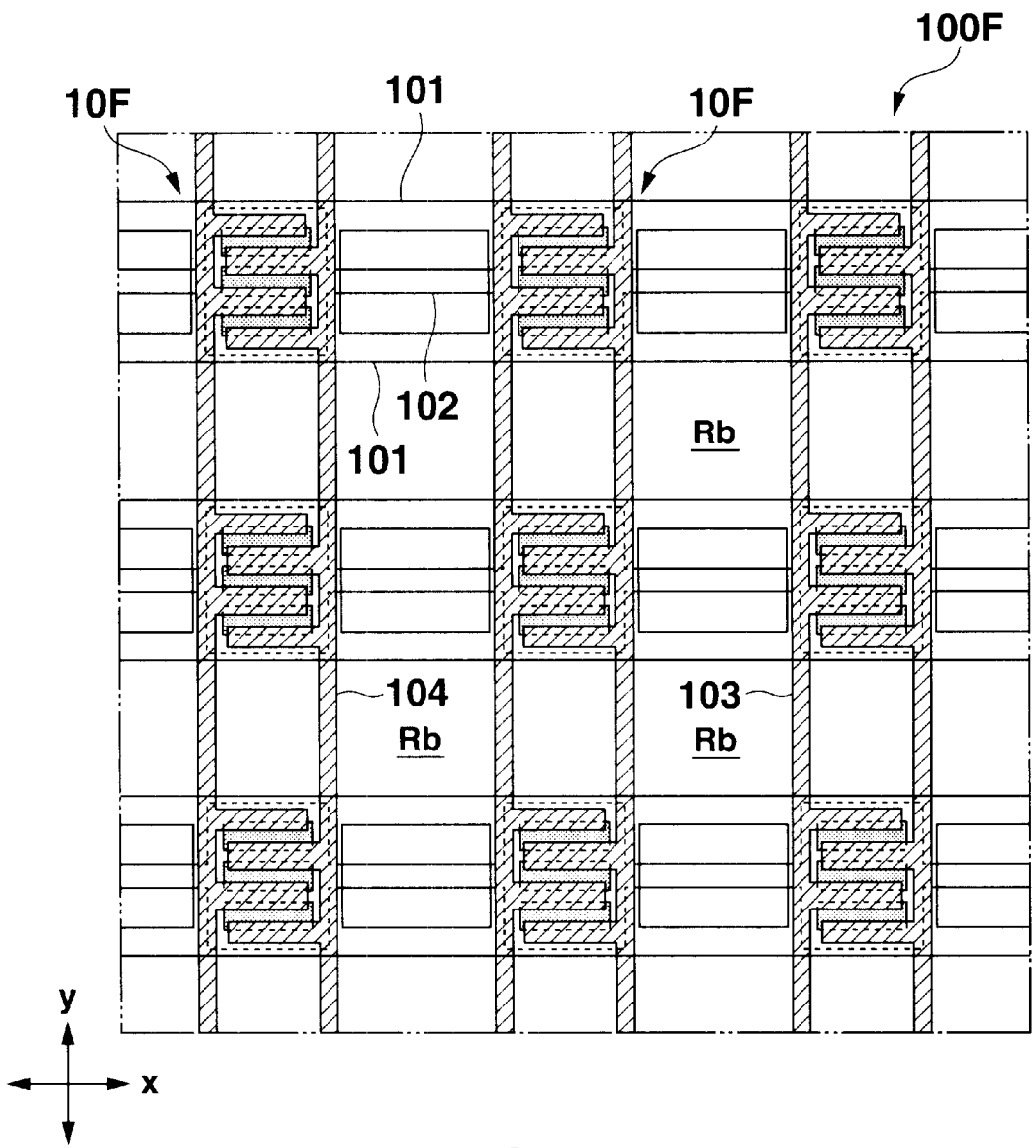
FIG. 41 is a planar structure view of the photo sensor array in which the double-gate type photo sensors shown in FIG. 40 are arranged in a matrix-like configuration.

FIG. 39 is a schematic structure view showing the other double-gate type photo sensor which is applied to the structure example wherein three semiconductor layers are provided which constitute a photo sensor portion per one device. FIG. 41 is a plane structure view showing a photo sensor array in which the double-gate type photo sensor is arranged in a matrix-like configuration. Here, the same structure as the above embodiment is denoted by the same reference numerals, and an explanation thereof is simplified.

Figure 40:
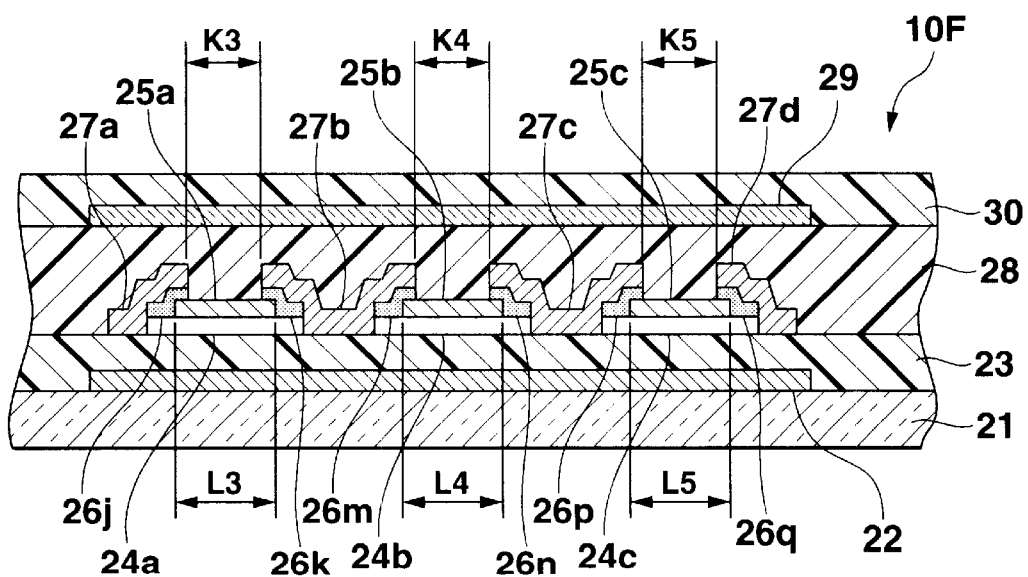
FIG. 40 is a sectional view showing a portion of the photo sensor of FIG. 39.

As shown in FIGS. 39 and 40, the double-gate type photo sensor which is applied to this structure example comprises: semiconductor layers 24a, 24b and 24c arranged in parallel; a single source electrode 27b formed over the semiconductor layers 24a and 24c; a single drain electrode 27c formed over the semiconductor layers 24a and 24c; a drain electrode 27a formed opposite to the source electrode 27b sandwiching the semiconductor layer 24a; a source electrode 27d formed opposite to the drain electrode 27c sandwiching the semiconductor layer 24c; an impurity doped layer 26j intervening between the semiconductor layer 24a and the drain electrode 27a; an impurity doped layer 26k intervening between the semiconductor layer 24a and the source electrode 27b; an impurity doped layer 26m intervening between the semiconductor layer 24b and the source electrode 27b; an impurity doped layer 26n intervening between the semiconductor layer 24b and the drain electrode 27c; an impurity doped layer 26p intervening between the semiconductor layer 24c and the drain electrode 27c; an impurity doped layer 26q intervening between the semiconductor layer 24c and the source electrode 27d; block insulating films 25a, 25b and 25c formed above the upper layer of the semiconductor layers 24a, 24b and 24c; a single top gate electrode 29 commonly formed with respect to the semiconductor layers 24a, 24b and 24c via the bottom gate electrode 28 above the semiconductor layers 24a, 24b and 24c; a single bottom gate electrode 22 commonly formed with respect to the semiconductor layer 24a, 24b and 24c via the bottom gate insulating film 23 below the semiconductor layers 24a, 24b, and 24c; wherein the structure is formed on the insulating substrate 21 such as the glass substrate or the like. In this embodiment, since the material quality of these insulating films and the conductive layers, or the manufacturing method thereof are the same as the above embodiment (FIG. 15), an explanation of the fourth embodiment is omitted.

In this manner, this double-gate type photo sensor 10F has a structure in which there are connected and arranged in parallel the first, second, and third double-gate type photo sensors. The first double-gate type photo sensor comprises the semiconductor layer 24a, the drain electrode 27a, the source electrode 27b, the top gate insulating film 28, the bottom gate insulating film 23, the top gate electrode 29 and the bottom gate electrode 22, the semiconductor layer 24a having a channel length of L3 and a channel width of W serving as a common channel region. The second double-gate type photo sensor comprises the semiconductor layer 24b, the source electrode 27b, the drain electrode 27c, the top gate insulating film 28, the bottom gate insulating film 23, the top gate electrode 29 the bottom gate electrode 22, the semiconductor layer 24b having a channel of L4 and a channel width of W serving as a common channel region. The third double gate type photo sensor comprises the semiconductor layer 24c, the drain electrode 27c, the source electrode 27d, the top gate insulating film 28, the bottom gate insulating film 23, the top gate electrode 29 and the bottom gate electrode 22, the semiconductor layer 24c having a channel length of L5 and a channel width of serving as a common channel region.

In particular, the top gate electrode 29 and the bottom gate electrode 22 constituting each of the first to the third double-gate type photo sensors are constituted of a common electrode, and have a structure in which the drain electrodes 27a and 27c are projected from the common drain line 103 and the source electrodes 27b and 27d are projected from the common source line 104. Consequently, the three double-gate type photo sensors which are arranged and connected can be operated as one double-gate type photo sensor by applying the above driving control method.

In the double-gate type photo sensor 10F, the drain current Ids which flows in accordance with the light amount generally has a relationship represented by the following mathematical expression.

$$Ids \propto W/L3 + W/L4 + W/L5 \qquad (3)$$

Here, the source-drain current Ids can be increased theoretically three times as compared with the double-gate type photo sensor 10A shown in FIG. 19A on the basis of the above formula (3) by setting the relationship of the channel length L3=L4=L5=L. Consequently, the transistor properties can be conspicuously improved.

In the double-gate type photo sensor 10F having such a structure, since the semiconductor layers 24a, 24b and 24c constituting the channel region are continuously arranged in parallel in an extending direction of the channel length L3, L4 and L5 by allowing each of the width directions (the longitudinal direction) to be located opposite to each other, the length in the channel width direction of the incidence effective region in each of the semiconductor layers 24a, 24b and 24c is denoted by W, the length in the channel length direction of each of the incidence effective region is denoted by K3, K4 and K5. For example, when K3=K4=K5 is set, the photo sensor can be treated as a double-gate type photo sensor in which the length in the channel length direction is set to three times (3×K).

Consequently, the spread of the light sensing region in the channel length direction (a vertical direction of FIG. 41; direction of y) of each of the semiconductor layers 24a, 24b and 24c can be three times as large as the double-gate type photo sensor at most. Thus, the spread of the light sensing region can be set to a square configuration.

Consequently, there can be realized the photo sensor array provided with a light receiving portion having a high transistor properties and a reading device for reading a two-dimension image which further uniform the spread of the light sensing region and suppress a distortion at the time of reading a two-dimension image by arranging the double-gate type photo sensor 10F in a matrix-like configuration to constitute the photo sensor array 100F as shown in FIG. 41.

In each of the embodiments, there is shown a case in which the double-gate type photo sensors 10A to 10F have a structure wherein one to three semiconductor layers are continuously arranged in parallel. However, the present invention is not limited thereto. Consequently, in accordance with the number of the semiconductor layers continuously arranged, the light receiving sensitivity and the spread of the light sensing region can be arbitrarily set.

In this case, as shown in FIG. 21B or FIG. 41, when the double-gate type photo sensors 10B and 10F are arranged in a matrix-like configuration to constitute the photo sensor arrays 100B and 100F, and applied to the reading device for reading the two-dimension image, it is required to arbitrarily set the number of semiconductor layers (double-gate type photo sensors) which are continuously arranged on the formation region of the light receiving portion after setting the regions Ra and Rb between devices so as to sufficiently secure the amount of irradiated light to the subject because light is irradiated to the subject from the side of the insulating substrate (glass substrate) 21 through the regions Ra and Rb between devices inside the matrix-like lattice.

Figure 42:
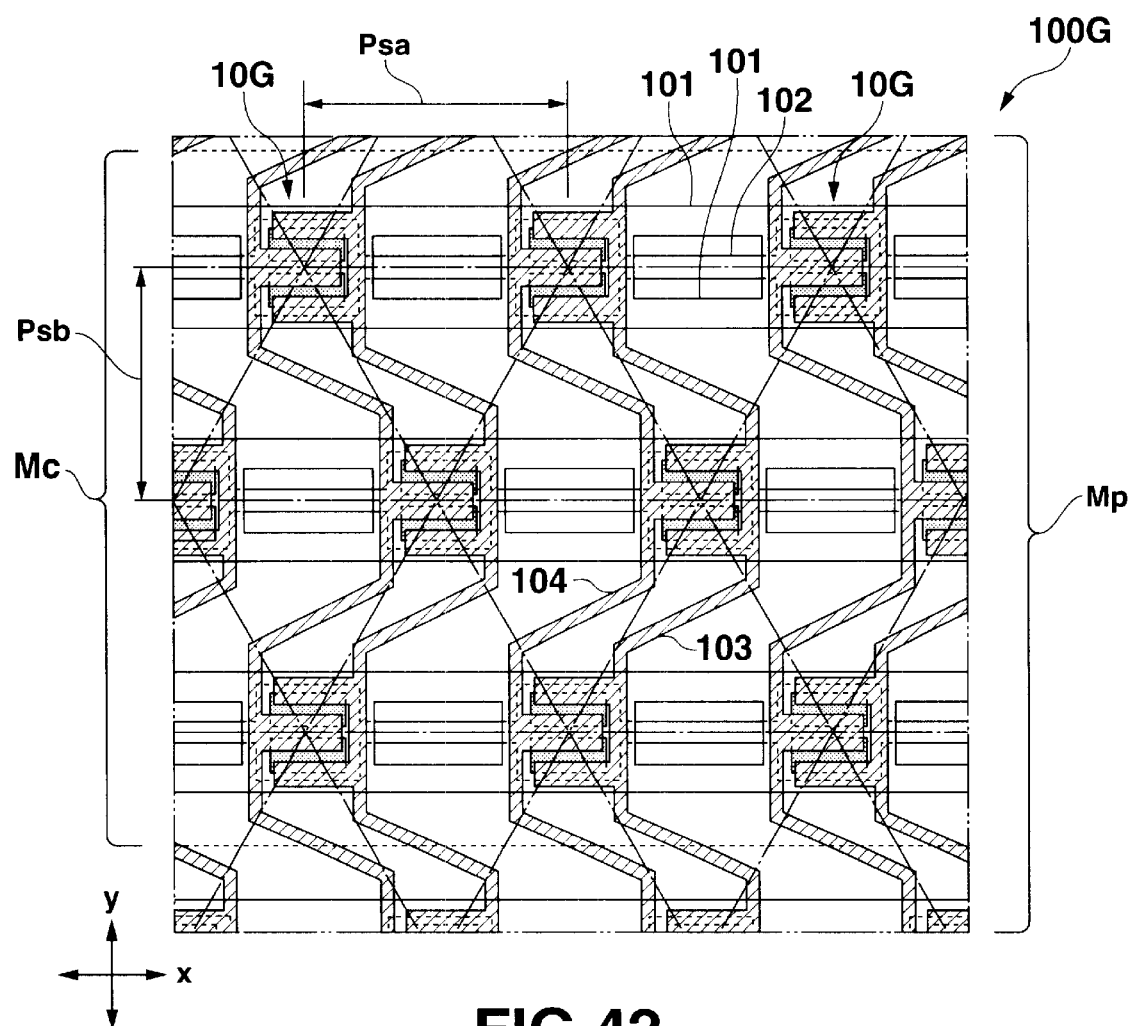
FIG. 42 is a view schematically showing the photo sensor array according to still another embodiment of the present invention.

FIG. 42 is a schematic structure view showing the photo sensor array according to still another embodiment of the present invention.

As shown in FIG. 42, the photo sensor array 100G according to the fourth embodiment has a double-gate type photo sensor 10G having the same structure as the double-gate type photo sensor 10B shown in FIG. 21A, and the double-gate type photo sensors 10G have a so-called delta arrangement structure in which each of the double-gate type photo sensor 10G is arranged on a position of each tip point of an imaginary equilateral triangle having one side of Psa (=Psa: pitch mutually between the double-gate type photo sensors 10A shown in FIG. 19) continuously set on the two-dimension plane.

Thus, as compared with the arrangement of the double-gate type photo sensors 10A in the photo sensor array 100A shown in FIG. 19B, the double-gate type photo sensors 10A shown in FIG. 19B are arranged so as to be separated by an equal distance Psp only in two directions vertical to the direction of x and y. Thus, a diagonal direction (an appropriate angle other than 0°, 90°, 180°, and 270°, for example, in the direction of 45° and 60°) with respect to the directions of x and y corresponding to the matrix, the mutual pitches of the double-gate type photo sensors 10A are increased in the directions of x and y and becomes disuniform (for example, in the case of 45° √2 times of the Psp). Therefore, there is a problem that a uniform and highly precise reading operation cannot be obtained with respect to a subject placed in a diagonal direction.

In contrast, in the photo sensor array 100G according to an embodiment of the present invention, since the double-gate type photo sensors 10G which constitute light receiving portions are arranged at the positions of tip portions of an equilateral triangle continuously set on a two-dimension plane, the double-gate type photo sensors 10G are arranged equally in the direction of x, and the double-gate type photo sensors 10G are arranged equally in a diagonal direction (60°, 120°, 240° and 300°) so the pitches mutually between the light receiving portions become uniform to Psa.

Consequently, all the double-gate type photo sensors arranged on two-dimension plane are arranged at equal pitches Psa with respect to the double-gate type photo sensors adjacent to each other approximately in a whole circumferential direction. Thus, two-dimension images to be read can be read at a high precision while suppressing a distortion at the time of reading images even when the two-dimension images are placed diagonally with respect to the directions of x and y.

Furthermore, since each of the double-gate type photo sensors is arranged in a delta-like configuration, the pitch Psb in the direction of y is represented in the following formula in the case where the pitch in the direction of x is set to Psa (=Psp) which is the same as the photo sensor of FIG. 19B.

$$Psb = Psa \times \sin 60° \qquad (4)$$

In this manner, since the pitch Psb in the direction of y becomes shorter than the pitch Psa (=Psb) in the direction of x, the same number of double-gate type photo sensors 10G can be arranged on the planar region Mc reduced in the direction of y with respect to the same planar region Mp as the photo sensor array 100A shown in FIG. 19B thereby making it possible to decrease the reading device for reading on two-dimensional image in size. That is, the double-gate type photo sensors 10G can be arranged in the number of 1/sin 60° times (≈1.15 times) on the planar region Mp same as the photo sensor array 100A shown in FIG. 19B thereby making it possible to increase the density.

Although the structure of the embodiment shown in FIG. 21A is applied as the double-gate photo sensor constituting each of the light receiving portion in the delta arrangement, it goes without saying that the structures of the embodiment shown in FIG. 19A and FIG. 39 and the double-gate type photo sensor having the other structure can be applied.

In the photo sensor array described, reflection light of light R irradiated on the subject 50a such as a finger or the like from the light source 140 provided on the glass substrate side of the photo sensor array 100M is incident on each of the double-gate type photo sensor 10G by transmitting a transparent insulating film of the region between devices. Thus the bright and dark information of the subject 50a can be read with a high precision and in a short time while decreasing the distortion at the time of reading as described above.

Furthermore, since the transistor properties in the photo sensor array 100G can be largely improved, the luminance of the light source can be relatively decreased, and consumed power of the reading device can be largely decreased.

Figure 43:
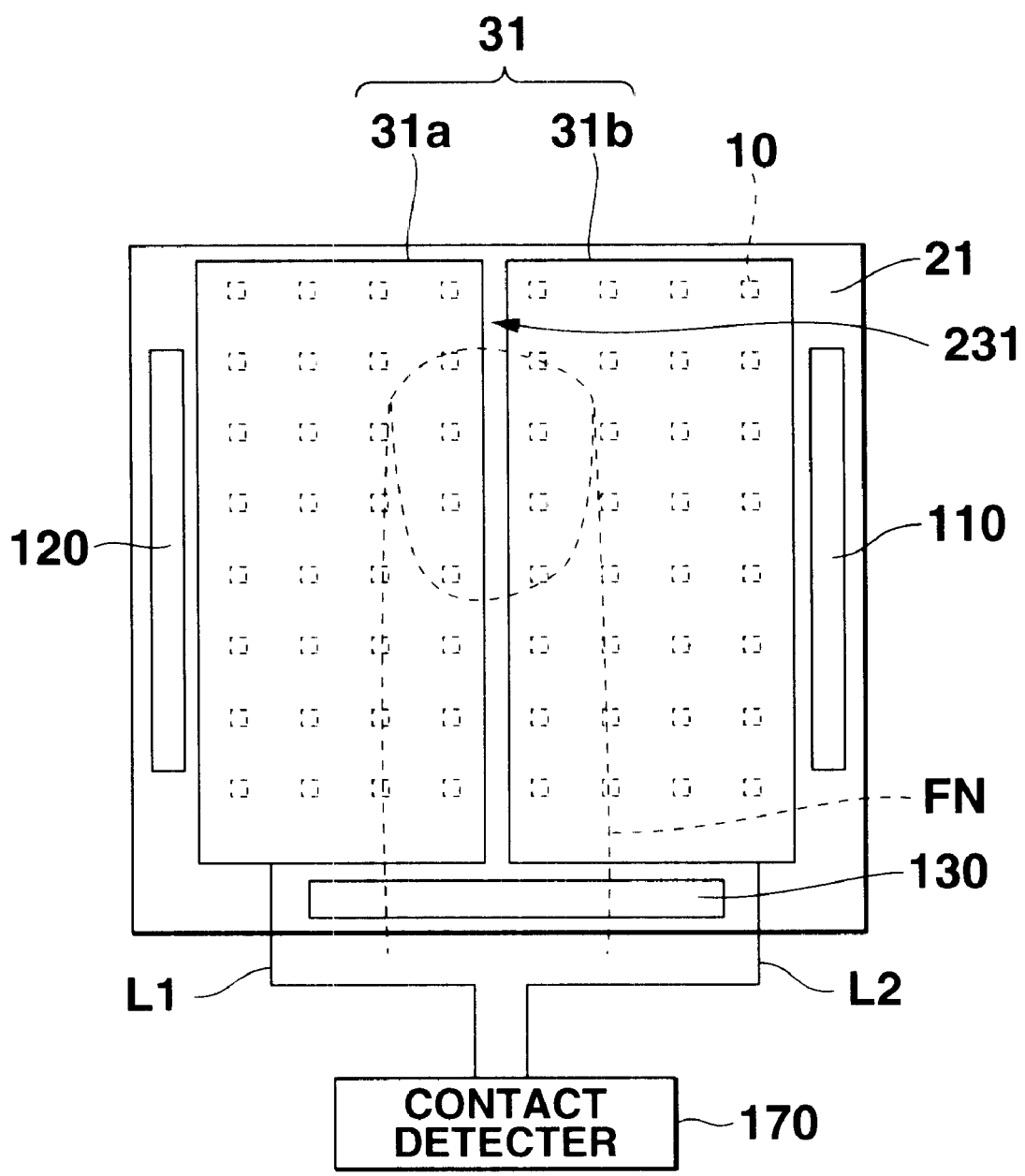
FIGS. 43 through 48 are views showing different variations of the electrostatic electricity discharging and contact sensing electrodes.

The electrostatic electricity discharging and contact sensing electrode 31 has one sheet of transparent film on the array region As, but may have two electrodes as shown in FIG. 43. Here, the photo sensor system comprises a light source 140, the photo sensor array 100, the electrostatic electricity discharging and contact sensing electrode 31, the bottom gate driver 120, the top gate driver 110, the drain driver 130 and the controller 160 shown in FIG. 24. Instead of the contact detector 150, the photo sensor system comprises a contact detector 170.

The photo sensor system comprises a plurality of photo sensor devices 10 arranged in a matrix-like configuration on a region Aa for photographing the finger print on the substrate 21, and the photo sensor system is provided above the light source 140.

The electrostatic electricity discharging and contact sensing electrode 31 is an optically transparent electrode made of an ITO (Indium Tin Oxide) or the like and is formed on a photo sensor device for removing electrostatic electricity electrified on the finger (the human body). Specifically, the electrostatic electricity discharging and contact sensing electrode 31 is constituted of two sheets of rectangular electrodes (electrodes 31a and 31b) which are separated with a slit 231 which passes through the vicinity of the center of the sensor area. The slit 231 is arranged so as to pass between the photo sensor devices 10. The width thereof is set so that no leak current resulting from the contamination or the like flows between the electrodes 31a and 31b. As a consequence, all the photo sensor devices 10 are covered with the electrodes 31a and 31b so that a uniform image free from moiré patterns can be obtained. Furthermore, in a direction vertical to the longitudinal direction of the slit 231 within the surface of two electrodes 31a and 31b, only one location is provided wherein two electrodes 31a and 31b are separated from each other. Thus the electrostatic electricity discharging and contact sensing electrode 31 has a very simple geometrical configuration as compared with the a comb-like configuration. Consequently, the resistance of the electrostatic discharging and contact sensing electrode 31 can be set to be lower. Thus, the electrostatic electricity can be removed efficiently and the breakage of the photo sensor device with the electrostatic electricity can be prevented.

The contact detector 170 is connected to the electrostatic electricity discharging and contact sensing electrode 31 to discharge the electrostatic electricity, and detects that the finger comes into contact with the electrostatic electricity discharging and contact sensing electrode 31, that is, that the finger is arranged on the predetermined photography position. Specifically, the contact detector 170 is connected to the electrode 31a with the wiring L1, and is connected to the electrode 31b with the wiring L2. The contact detector 170 grounds the electrode 31b with the grounding of the wiring L2, so that the above electrostatic electricity is discharged to the ground via the electrode 31b and the wiring L2. Furthermore, the contact detector 170 supplies to the electrode 31a via the wiring L1 a detection signal for detecting that the finger comes into contact with the electrostatic electricity discharging and contact sensing electrode 31. When the finger is arranged as shown in FIG. 43, the electrodes 31a and 31b are electrically connected via the finger, so that the resistance value between the electrodes 31a and 31b, the capacity value and the like are changed. The contact detector 170 detects from the wirings L1 and L2 a change in the impedance resulting from the resistance value or the capacity value specific to the human body increased between the electrodes 31a and 31b to detect that the finger has come into contact with the electrostatic electricity discharging and contact sensing electrode 31. After the contact detector 170 detects that the finger is arranged on a predetermined photography position, a photography start signal for designating the start of photography of the finger print is output to the light source 14 and the photo sensor device 12.

In the case where the finger print is photographed by using the photo sensor system which is constituted in the above manner, the contact detector 170 supplies the alternate current signal for detection to the wiring L1.

Then, the finger is placed on the electrostatic electricity and contact sensing electrode 31 to cross over the slit 231, as shown in FIG. 43.

When, the finger is placed on the electrode 31 for the electrostatic electricity and contact sensing electrode 31, the electrodes 31a and 31b are electrically connected via the finger. At that time, when the electrostatic electricity is accumulated on the finger, the electrostatic electricity is discharged to the ground via the electrode 31b and the wiring L2. Then, the detection signal supplied by the contact detector 170 is deviated with the human body via the finger to flow to the electrode 31b and further flow to the wiring L2.

The contact detector 170 detects a change in impedance resulting from the resistance value or the capacity value by the human body including the finger between the electrodes 31a and 31b, for example, from a change in the level of the detection signal which flows from the wiring L1 to the wiring L2 to detect that the finger has come into contact with the electrostatic electricity and contact sensing electrode 31. Then, the contact detector 170 outputs the photography start signal to the controller 160.

As has been described above, the electrostatic electricity discharging and contact sensing electrode 31 is constituted of the electrodes 31a and 31b which have a simple geometric configuration and extend over the entire region of the sensor, the electrode. Thus, it is possible to set the resistance of the electrostatic electricity discharging and contact sensing electrode 31 to a small value. As a consequence, since the photo sensor device 12 can be sufficiently protected from the electrostatic electricity on the finger (human body), the photo sensor system has a sufficiently high reliability. Furthermore, by using the electrostatic electricity discharging and contact sensing electrode 31 constituting of two electrodes 31a and 31b separated with a slit 231, it is possible to detect that the finger is placed on a predetermined photography position.

Figure 44:
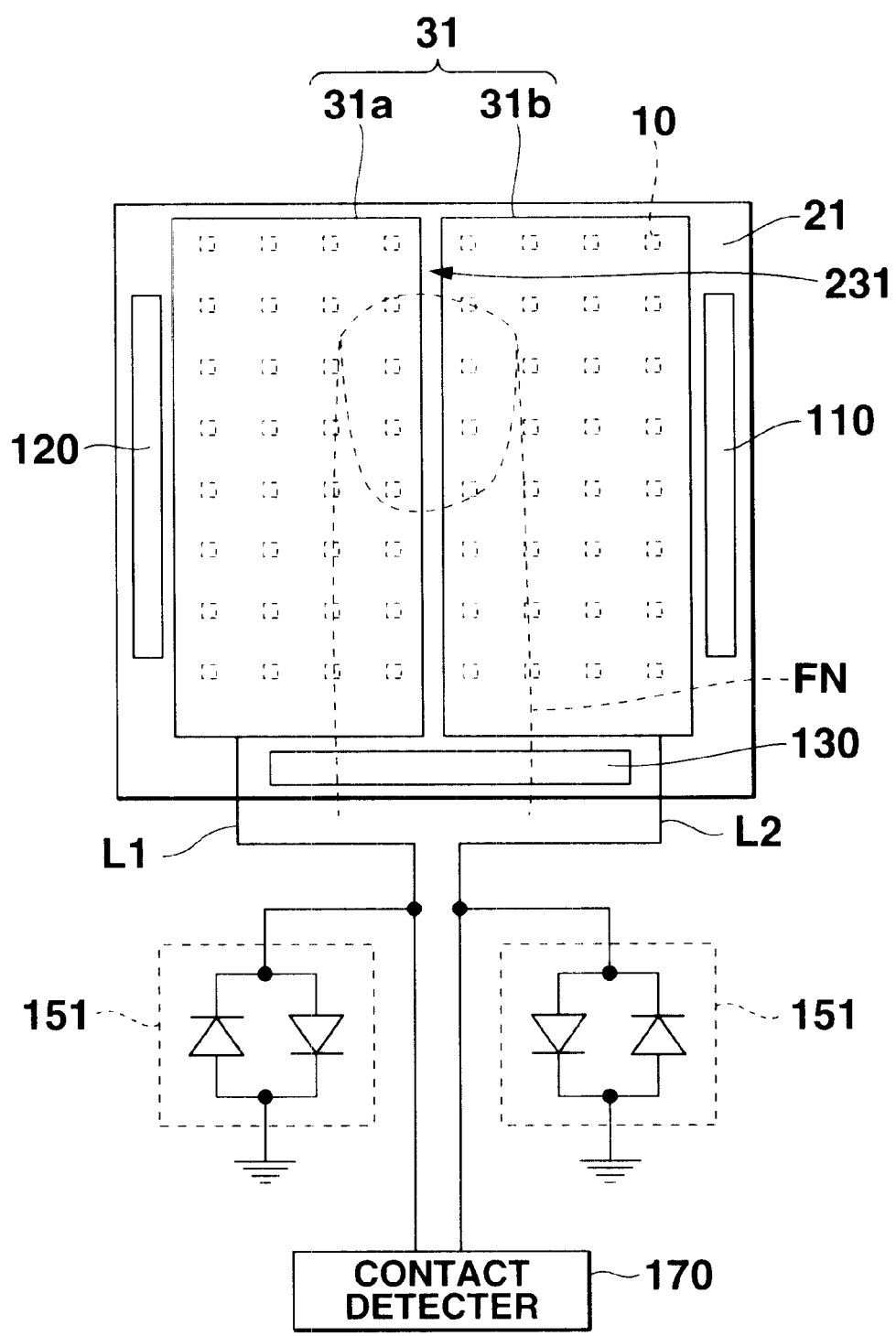

Instead, as shown in FIG. 44, the diode circuit 151 may be provided on the wiring L1 and/or the wiring L2. The diode circuit 151 is constituted of one pair of diodes connected in a reverse parallel, and one end thereof is connected to the wiring L1 or the wiring L22 while the other end thereof is grounded.

The diode circuit 151 which is constituted in the above manner has a non-linear rectifying characteristic such that the current abruptly flows when the applied voltage exceeds a threshold value. Specifically, in the case where the diode circuit 151 allows virtually no current to flow in the case where the magnitude of the voltage Va applied to both ends thereof is smaller than the threshold value voltage Vc (about 0.6V). That is, in the case where the Va is smaller than the threshold voltage Vc, the resistance value of the diode circuit 151 is large. On the other hand, the diode circuit 151 allows the current to flow in the case where the voltage Va is larger than the threshold voltage Vc. That is, in the case where voltage Va is larger than the threshold voltage Vc, the resistance value of the diode circuit 151 is small.

For example, in the case where the finger charged with the electrostatic electricity comes into contact with the electrostatic electricity discharging and contact sensing electrode 31, a high voltage (about 10 (kV)) is applied to both ends of the diode circuit 151. At this time, because of the characteristics of the diode circuit 151, the electrostatic electricity does not flow to the contact detector 170 but is discharged to the ground via the diode circuit 151. As a consequence, the electrostatic electricity flows to the contact detector 170 thereby preventing the contact detector 170 from being broken with the electrostatic electricity. On the other hand, when no electrostatic electricity is accumulated in the finger, or when the electrostatic electricity is discharged, the voltage applied to both ends of the diode circuit 151 is small and virtually no current flows through the diode circuit 151. As a consequence, the contact detector 170 can read a change in impedance in the same manner as the first embodiment, and can detect that the finger has come into contact with the electrostatic electricity discharging and contact electrode 31.

Figure 45:
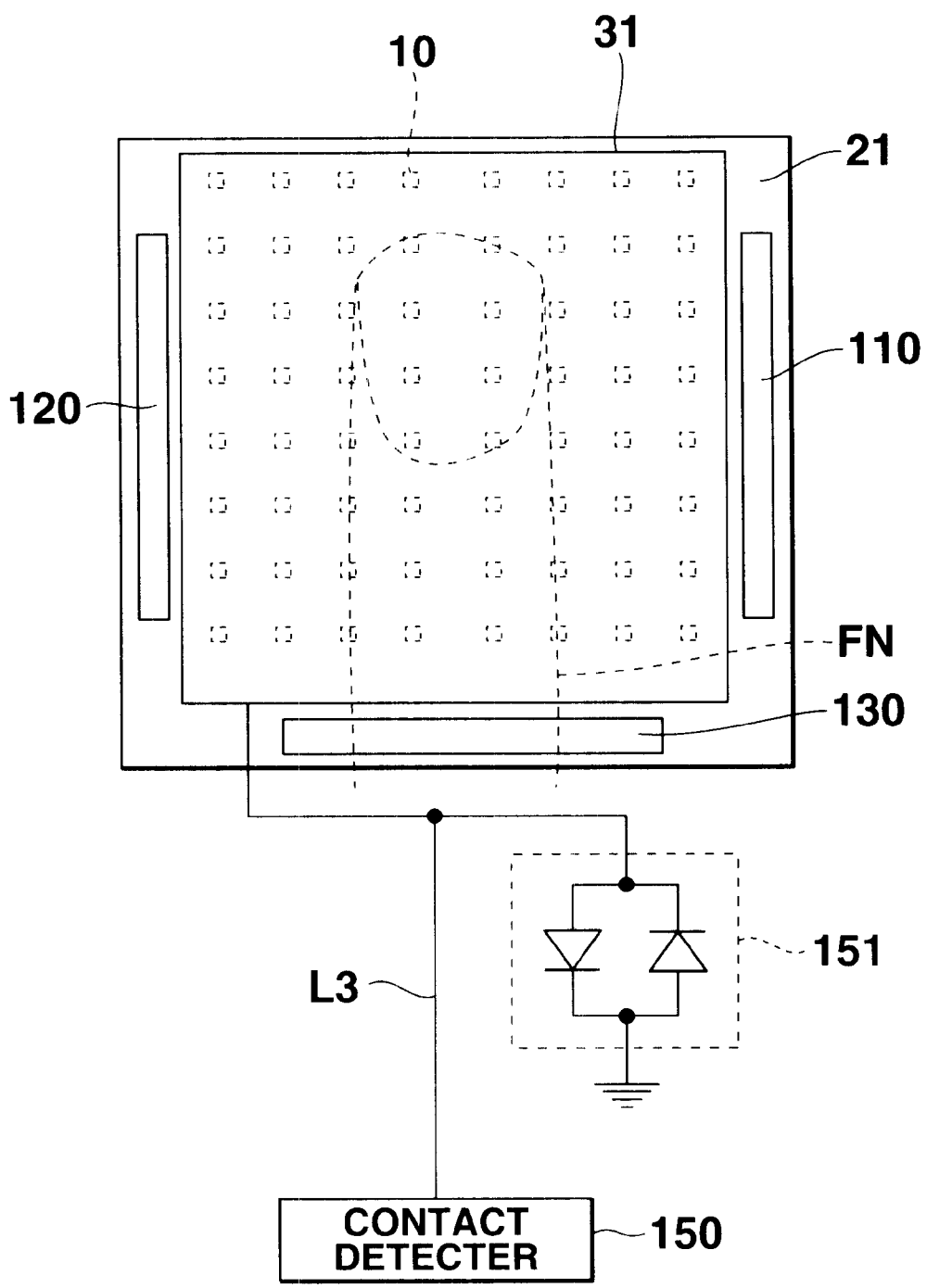
Figure 46:
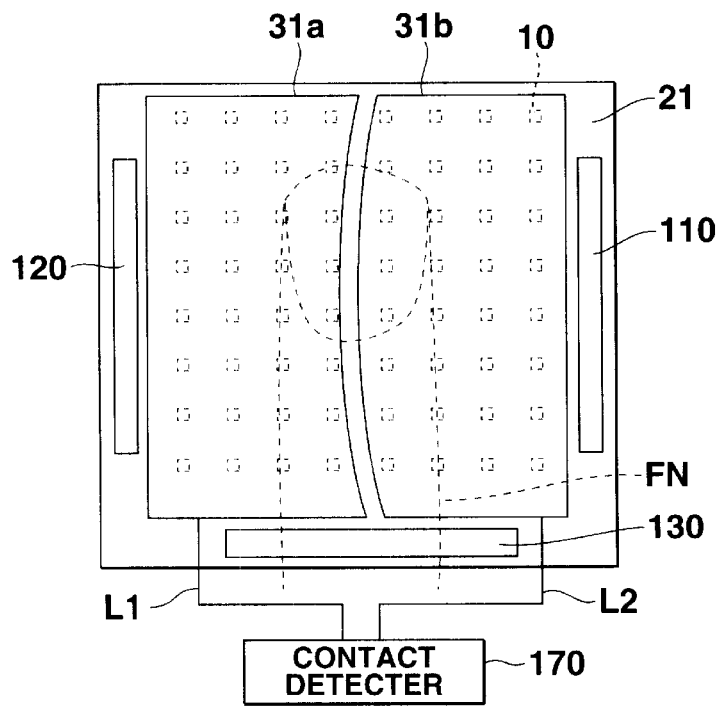
Figure 47:
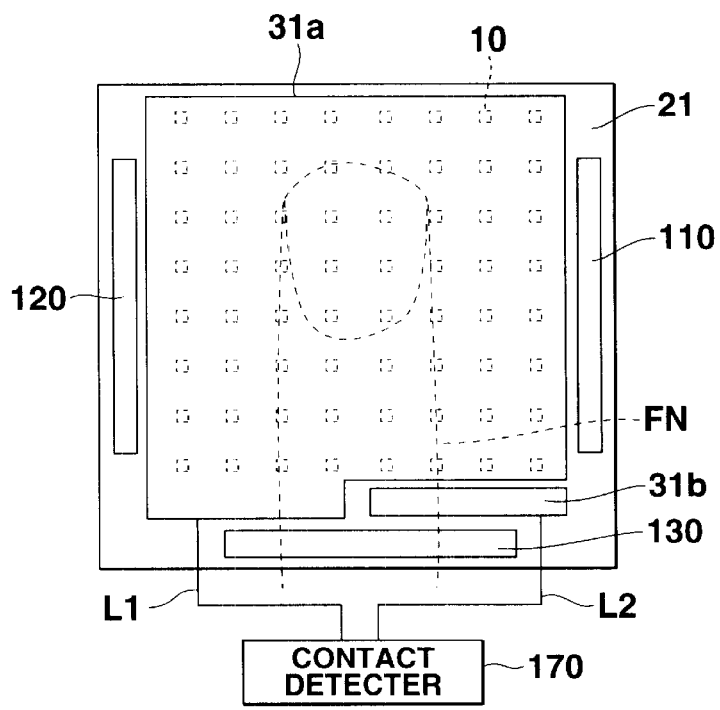

Instead, as shown in FIG. 45, the structure may be such that the contact detector 150 of FIG. 24 may be connected to one electrostatic electricity discharging and contact sensing electrode 31. Furthermore, as shown in FIG. 46, the slit 231 may be curved. Alternatively, as shown in FIG. 47, the electrode 31a is formed so as to cover the entire surface of the sensor area Aa so that the finger comes into contact with the electrode 31a without fail when the electrode 31a is placed on the photo sensor device 12.

Figure 48:
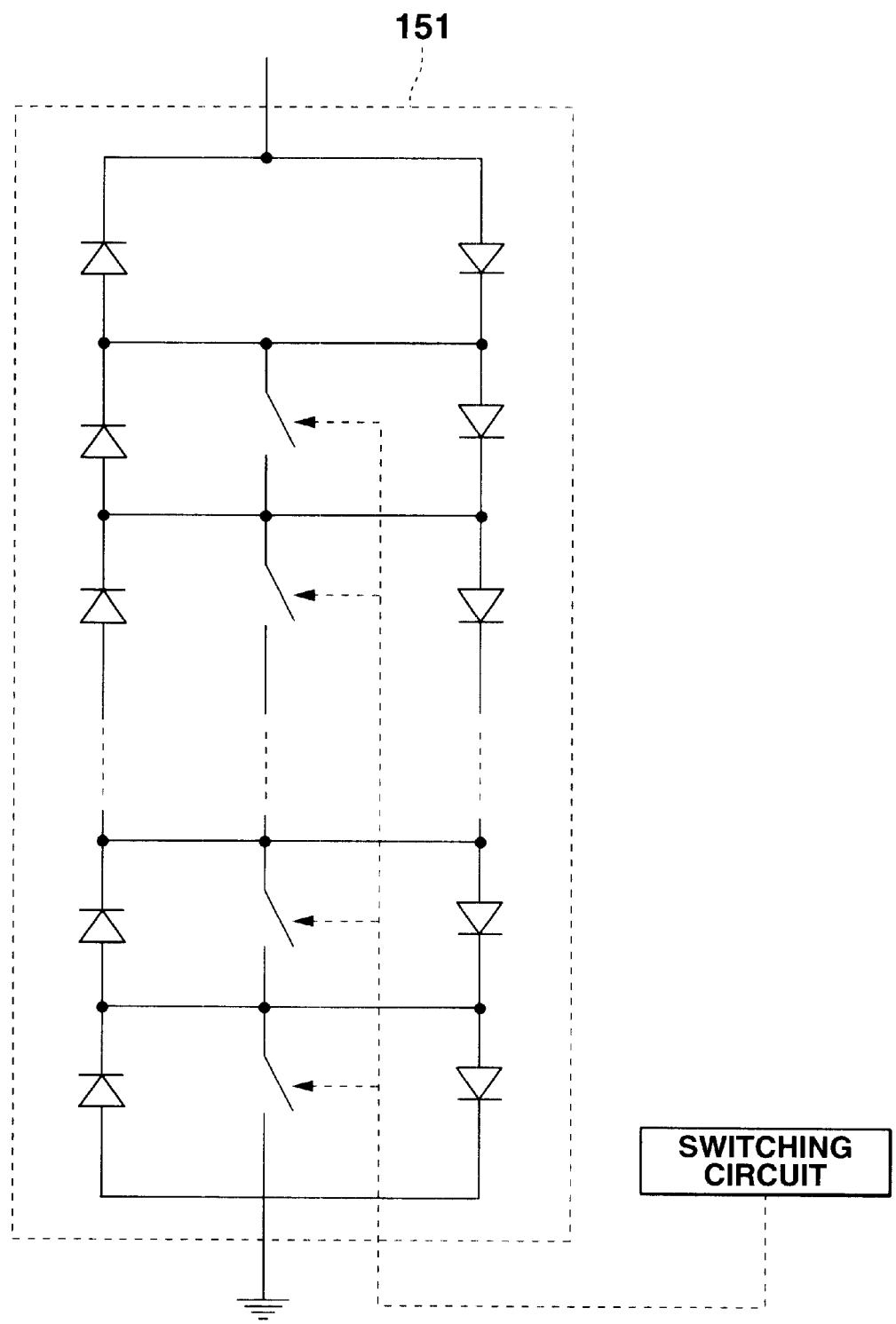

Instead, as shown in FIG. 48, the diode circuit 151 may be constituted by connecting two diode rows comprising a plurality of diodes connected in series in a reverse parallel. Furthermore, a switching circuit or the like for changing the number of diodes connected in series may be provided so that the number of diodes present between the electrostatic electricity discharging and contact sensing electrode 31 (wirings L1, L2 and L3) and the grounding point may be changed. However, the number of diodes present between the electrostatic electricity discharging and contact sensing electrode 31 and grounding point changes to be the same on two diode rows. When the threshold value voltage Vc incorporated in one diode is set to about 0.6 (V), the threshold voltage becomes about 0.6×n (V) when n diodes are connected in series. When using this, by changing the number of diodes connected in series, the magnitude of the threshold voltage can be changed which forms a reference as to whether current is supplied to the contact detector 170.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A photo sensor array comprising:
 a plurality of photo conversion elements separated from each other in a predetermined direction to be arranged, each photo conversion element including:
  a semiconductor layer having an incidence effective region on which excited light is incident,
  source-drain electrodes respectively provided at both ends of the semiconductor layer,
  a first gate electrode provided below the semiconductor layer via a first gate insulating film, and
  a second gate electrode provided above the semiconductor layer via a second gate insulating film;
 a source terminal commonly connected to the source electrodes of the photo conversion elements;
 a drain terminal commonly connected to the drain electrodes of the photo conversion elements;
 a first gate terminal commonly connected to the first gate electrodes of the photo conversion elements; and
 a second gate terminal commonly connected to the second gate electrodes of the photo conversion elements;
 wherein the second gate electrode provided on the photo conversation elements being constructed by a first transparent electrode layer, and
 at least one of the source terminal, the drain terminal, and the first gate terminal include the first transparent electrode layer.

2. The photo sensor array according to claim 1, wherein the uppermost layer of at least one of the source terminal, the drain terminal, and the first gate terminal may be constituted of the first transparent electrode layer.

3. The photo sensor array according to claim 1, wherein the photo sensor array comprises an electrostatic electricity discharging and contact sensing electrode provided above the photoelectric conversion elements via an insulating film, and at least one of the source terminal, the drain terminal, the first gate terminal, and the second gate terminal is constituted with a second transparent electrode layer constituting the electrostatic electricity discharging and sensing electrode.

4. The photo sensor array according to claim 1, wherein the semiconductor layer is extended under the source and the drain electrodes, the source and the drain terminals, a wiring connecting the source electrode and source terminal, and a wiring connecting the drain electrode and the drain terminal.

5. The photo sensor according to claim 1 further comprising a drain driver connected to the drain terminal;

a first gate driver connected to the first gate terminal; and a second gate driver connected to the second gate terminal.

6. The photo array sensor according to claim 1, wherein the semiconductor layer has a plurality of incidence effective regions, and these regions are arranged in parallel with the channel direction of the semiconductor layer.

7. The photo sensor array according to claim 1, wherein the source and the drain electrodes are opaque to the excited light.

8. The photo sensor array according to claim 1, wherein the photoelectric conversion elements are arranged in a delta-like configuration.

9. The photo sensor array according to claim 1, wherein the semiconductor layer of each of the photoelectric conversion elements is separated into a plurality of layer positions so that source electrodes and drain electrodes are provided respectively on the layer portion, and the source electrodes are connected to each other and the drain electrodes are connected to each other.

10. The photo sensor array according to claim 9, wherein the semiconductor layers of the photoelectric conversion elements are arranged in parallel in the channel length direction of the semiconductor layer.

* * * * *